US012069942B2

(12) United States Patent
Choi et al.

(10) Patent No.: US 12,069,942 B2
(45) Date of Patent: Aug. 20, 2024

(54) ORGANOMETALLIC COMPOUND AND ORGANIC LIGHT-EMITTING DEVICE INCLUDING THE SAME

(71) Applicant: SAMSUNG ELECTRONICS CO., LTD., Suwon-si (KR)

(72) Inventors: Jongwon Choi, Yongin-si (KR); Yoonhyun Kwak, Seoul (KR); Kum Hee Lee, Suwon-si (KR); Banglin Lee, Suwon-si (KR); Jungin Lee, Hwaseong-si (KR); Hyun Koo, Seoul (KR); Sangdong Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 102 days.

(21) Appl. No.: 17/539,373

(22) Filed: Dec. 1, 2021

(65) Prior Publication Data

US 2022/0093880 A1 Mar. 24, 2022

Related U.S. Application Data

(63) Continuation of application No. 15/238,866, filed on Aug. 17, 2016, now Pat. No. 11,211,571.

(30) Foreign Application Priority Data

Aug. 18, 2015 (KR) ........................ 10-2015-0116207
Aug. 10, 2016 (KR) ........................ 10-2016-0101888

(51) Int. Cl.
*C09K 11/06* (2006.01)
*C07F 15/00* (2006.01)
(Continued)

(52) U.S. Cl.
CPC ......... *H10K 85/40* (2023.02); *C07F 15/0086* (2013.01); *C07F 15/0093* (2013.01);
(Continued)

(58) Field of Classification Search
CPC .... C07F 1/005; C07F 1/08; C07F 1/10; C07F 1/12; C07F 7/02; C07F 7/28; C07F 7/00;
(Continued)

(56) References Cited

U.S. PATENT DOCUMENTS 6,465,115 B2 10/2002 Shi et al.
6,596,415 B2 7/2003 Shi et al.
(Continued)

FOREIGN PATENT DOCUMENTS

CN 1847248 A 10/2006
CN 1875026 A 12/2006
(Continued)

OTHER PUBLICATIONS

English Translation of Office Action issued by the Chinese Patent Office on Nov. 28, 2019 in the examination of the Chinese Patent Application No. 201610675068.9.
(Continued)

*Primary Examiner* — Dylan C Kershner
*Assistant Examiner* — Elizabeth M. Dahlburg
(74) *Attorney, Agent, or Firm* — CANTOR COLBURN LLP

(57) ABSTRACT

An organometallic compound represented by Formula 1:

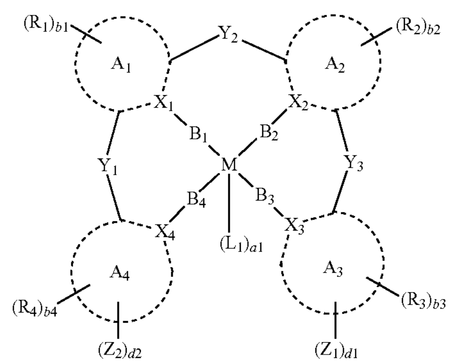

wherein, in Formula 1, groups and variables are the same as described in the specification.

18 Claims, 1 Drawing Sheet

(51) Int. Cl.

| | |
|---|---|
| ***H10K 50/11*** | (2023.01) |
| ***H10K 85/30*** | (2023.01) |
| ***H10K 85/40*** | (2023.01) |
| ***H10K 101/10*** | (2023.01) |

(52) U.S. Cl.

CPC ............ *C09K 11/06* (2013.01); *H10K 85/346* (2023.02); *H10K 85/361* (2023.02); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1088* (2013.01); *C09K 2211/185* (2013.01); *C09K 2211/188* (2013.01); *H10K 50/11* (2023.02); *H10K 2101/10* (2023.02)

(58) Field of Classification Search

CPC ........ C07F 7/30; C07F 7/0803; C07F 15/002; C07F 15/0026; C07F 15/0033; C07F 15/004; C07F 15/0046; C07F 15/0053; C07F 15/006; C07F 15/0066; C07F 15/0073; C07F 15/008; C07F 15/0086; C07F 15/0093; C07F 7/003; C09K 11/06; C09K 2211/1007; C09K 2211/1011; C09K 2211/1014; C09K 2211/1029; C09K 2211/1044; C09K 2211/1088; C09K 2211/1092; C09K 2211/1096; C09K 2211/183; C09K 2211/185; C09K 2211/186; C09K 2211/188; H01L 51/0084; H01L 51/0085; H01L 51/0086; H01L 51/0087; H01L 51/0088; H01L 51/009; H01L 51/0091; H01L 51/0094; H01L 51/50; H01L 51/5016; H10K 85/341; H10K 85/342; H10K 85/344; H10K 85/346; H10K 85/348; H10K 85/361; H10K 85/371; H10K 85/40; H10K 50/00; H10K 50/11; H10K 2101/10

See application file for complete search history.

(56) References Cited

U.S. PATENT DOCUMENTS

| | | | | |
|---|---|---|---|---|
| 7,002,013 | B1 | 2/2006 | Chi et al. | |
| 7,329,898 | B2 | 2/2008 | Igarashi | |
| 7,429,426 | B2 | 9/2008 | Brown et al. | |
| 7,443,797 | B2 | 10/2008 | Cheung et al. | |
| 7,569,692 | B2 | 8/2009 | Nii et al. | |
| 9,627,629 | B2 | 4/2017 | Hwang et al. | |
| 10,340,467 | B2 | 7/2019 | Choi et al. | |
| 10,439,152 | B2 | 10/2019 | Lee et al. | |
| 10,950,807 | B2 | 3/2021 | Lee et al. | |
| 2001/0019782 | A1 | 9/2001 | Igarashi et al. | |
| 2006/0228582 | A1 | 10/2006 | Ragini et al. | |
| 2007/0103060 | A1* | 5/2007 | Itoh .................... | C07F 15/0086 313/504 |
| 2011/0136755 | A1 | 6/2011 | Rieger et al. | |
| 2011/0278555 | A1 | 11/2011 | Inoue et al. | |
| 2012/0138911 | A1 | 6/2012 | Inoue et al. | |
| 2013/0048963 | A1 | 2/2013 | Beers et al. | |
| 2013/0334521 | A1 | 12/2013 | Lee et al. | |
| 2013/0341600 | A1 | 12/2013 | Lin et al. | |
| 2014/0008617 | A1 | 1/2014 | Beers et al. | |
| 2014/0197386 | A1 | 7/2014 | Kim et al. | |
| 2015/0090974 | A1 | 4/2015 | Kim et al. | |
| 2015/0318497 | A1 | 11/2015 | Hwang et al. | |
| 2015/0325807 | A1 | 11/2015 | Choi et al. | |
| 2016/0013431 | A1 | 1/2016 | Choi et al. | |
| 2016/0190484 | A1 | 6/2016 | Lee et al. | |
| 2016/0268522 | A1 | 9/2016 | Hwang et al. | |
| 2017/0305881 | A1 | 10/2017 | Li et al. | |
| 2022/0093880 | A1 | 3/2022 | Choi et al. | |

FOREIGN PATENT DOCUMENTS

| | | | |
|---|---|---|---|
| EP | 1683804 | A2 | 7/2006 |
| EP | 2551274 | A1 | 1/2013 |
| JP | 20003782 | A | 1/2000 |
| JP | 2006290891 | A | 10/2006 |
| JP | 2006290988 | A | 10/2006 |
| JP | 2011071452 | A | 4/2011 |
| JP | 2014024841 | A | 2/2014 |
| JP | 2014509587 | A | 4/2014 |
| JP | 7311238 | B2 | 7/2023 |
| KR | 1020060115371 | A | 11/2006 |
| KR | 20130043459 | A | 4/2013 |
| KR | 1020130043460 | A | 4/2013 |
| KR | 20130110934 | A | 10/2013 |
| KR | 1020140096203 | A | 8/2014 |
| KR | 1020140101699 | A | 8/2014 |
| KR | 1020140142000 | A | 12/2014 |
| TW | 201319072 | A1 | 5/2013 |
| TW | 201404864 | A | 2/2014 |
| WO | 2005042444 | A2 | 5/2005 |
| WO | 2014031977 | A1 | 2/2014 |
| WO | 2014109814 | A2 | 7/2014 |

OTHER PUBLICATIONS

English Translation of Office Action issued by the Japanese Patent Office on Jun. 9, 2020 in the examination of the Japanese Patent Application No. 2016-159646.

Examination Report issued by the European Patent Office Dated Oct. 19, 2017.

Extended European Patent Office dated Dec. 21, 2016.

M.A. Baldo, et al., "Highly efficient phosphorescent emission from organic electroluminescent devices", Nature, vol. 395, 1998.

M.A. Baldo, et al., "Very high-efficiency green organic light-emitting devices based on electrophosphorescence", Appl. Phys. Lett. 75, 4, 1999.

Ming-hwa Yang, et al., "New oligo-a-pyridylamino ligands and their metal complexes", Chem. Commun., 1997, 2 pp.

Office Action issued by the Chinese Patent Office on Nov. 28, 2019 in the examination of the Chinese Patent Application No. 201610675068.9.

Office Action issued by the Japanese Patent Office on Jun. 9, 2020 in the examination of the Japanese Patent Application No. 2016-159646.

Office Action issued by the Taiwan Intellectual Property Office on Feb. 7, 2020 in the examination of the Japanese Patent Application No. 105125871.

Qin Wang, et al., "Effects of charged self-assembled quantum dots on two-dimensional quantum transport", Applied Physics Letters, vol. 76, No. 13, 2000.

Raymond C. Kwong, et al., "High operational stability of electrophosphorescent devices", Appl. Phys. Lett. 81, 162, 2002.

Sergey Lamanasky, et al., "Highly Phosphorescent Bis-Cyclometalated Iridium Complexes: Synthesis, Photophysical Characterization, and Use in Organic Light Emitting Diodes", J. Am. Chem. Soc. 2001, 123, 4304-4312.

Sergey Lamansky, et al., "Synthesis and Characterization of Phosphorescent Cyclometalated Iridium Complexes", Inorg. Chem. 2001, 40, 1704-1711.

English Abstract of KR 10-2014-0142000.

English Translation of Office Action issued Mar. 22, 2023, in corresponding KR Patent Application No. 10-2016-0101888, 8 pp.

Office Action issued Mar. 22, 2023, in corresponding KR Patent Application No. 10-2016-0101888, 8 pp.

English Translation of Office Action dated May 7, 2024, issued in corresponding JP Patent Application No. 2023-070583, 3 pp.

(56) References Cited

OTHER PUBLICATIONS

Office Action dated May 7, 2024, issued in corresponding JP Patent Application No. 2023-070583, 2 pp.

* cited by examiner

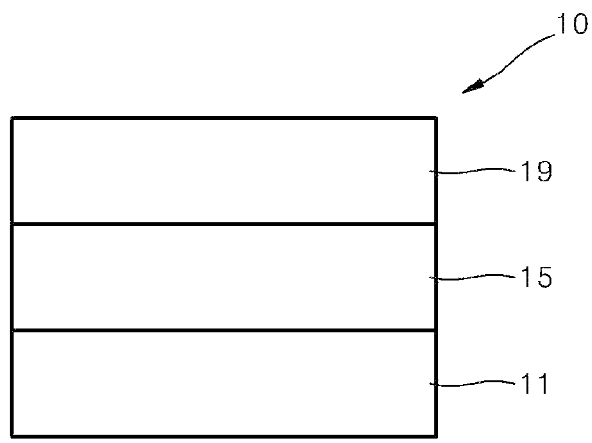
10
19
15
11

ORGANOMETALLIC COMPOUND AND ORGANIC LIGHT-EMITTING DEVICE INCLUDING THE SAME

CROSS-REFERENCE TO RELATED APPLICATION

This is a continuation application of U.S. application Ser. No. 15/238,866, filed on Aug. 17, 2016, which claims priority to Korean Patent Application Nos. 10-2015-0116207, filed on Aug. 18, 2015, and 10-2016-0101888, filed on Aug. 10, 2016, in the Korean Intellectual Property Office, and all the benefits accruing therefrom under 35 U.S.C. § 119, the contents of which are incorporated herein in their entirety by reference.

BACKGROUND

1. Field

Embodiments relate to an organometallic compound and an organic light-emitting device including the same.

2. Description of the Related Art

Organic light-emitting devices (OLEDs) are self-emission devices that have wide viewing angles, high contrast ratios, and short response times. In addition, the OLEDs display excellent brightness, driving voltage, and response speed characteristics, and produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

Various types of organic light emitting devices are known. However, there still remains a need in OLEDs having low driving voltage, high efficiency, high brightness, and long lifespan.

SUMMARY

Provided are an organometallic compound and an organic light-emitting device including the same.

Additional aspects will be set forth in part in the description which follows and, in part, will be apparent from the description, or may be learned by practice of the presented embodiments.

According to an aspect of an embodiment, an organometallic compound is represented by Formula 1:

Formula 1

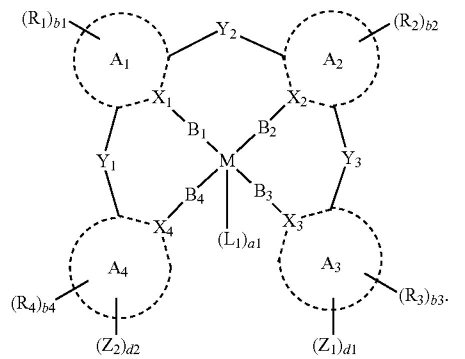

In Formula 1,

M may be selected from a Period 1 transition metal, a Period 2 transition metal, and a Period 3 transition metal;

$A_1$ to $A_4$ may each independently be selected from a $C_5$-$C_{20}$ carbocyclic group and a $C_1$-$C_{20}$ heterocyclic group;

$X_1$ to $X_4$ may each independently be selected from a carbon atom (C) and a nitrogen atom (N), provided that at least one selected from $X_3$ and $X_4$ may be N;

$B_1$ to $B_4$ may each independently be selected from a single bond, O, and S;

$Y_1$ to $Y_3$ may each independently be selected from a single bond and a divalent linking group, and at least one of $Y_1$ to $Y_3$ is a divalent linking group;

$Z_1$ and $Z_2$ may each independently be represented by one of Formulae 2-1 to 2-4:

2-1

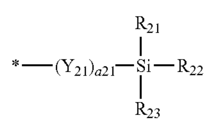

2-2

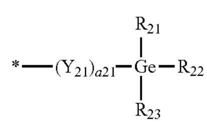

2-3

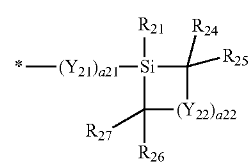

2-4

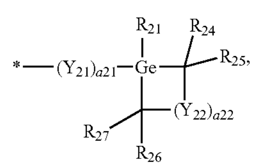

wherein, in Formulae 2-1 to 2-4, $Y_{21}$ and $Y_{22}$ may each independently be selected from a substituted or unsubstituted $C_1$-$C_{10}$ alkylene group and a substituted or unsubstituted $C_2$-$C_{10}$ alkenylene group;

a21 and a22 may each independently be selected from 0, 1, 2, 3, 4, and 5;

$R_{21}$ to $R_{27}$ may each independently be selected from hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group;

d1 and d2 may each independently be selected from 0, 1, 2, 3, and 4;

when d1 is 2 or more, groups $Z_1$ may be identical to or different from each other, when d2 is 2 or more, groups $Z_2$ may be identical to or different from each other;

when $X_3$ is N, d1 may be selected from 1, 2, 3, and 4; or when $X_4$ is N, d2 may be selected from 1, 2, 3, and 4;

$R_1$ to $R_4$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_8$-$C_{60}$ aryl group, a substituted or unsubstituted $C_6$-$C_{60}$ aryloxy group, a substituted or unsubstituted $C_8$-$C_{80}$ arylthio group, a substituted or unsubstituted $C_7$-$C_{80}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —C(═O)($Q_7$), and —N($Q_7$)($Q_8$); $R_1$ and $R_4$ or $R_2$ and $R_3$ may optionally be linked to each other to form a saturated or unsaturated ring;

$Q_7$ and $Q_8$ may each independently be selected from a $C_1$-$C_{60}$ alkyl group and a $C_6$-$C_{60}$ aryl group;

b1 to b4 may each independently selected from 1, 2, 3, and 4;

$L_1$ may be selected from a monodentate ligand and a bidentate ligand;

a1 may be selected from 0, 1, and 2; and

* indicates a binding site to a neighboring atom.

Another aspect provides an organic light-emitting device including:

a first electrode;

a second electrode; and an organic layer disposed between the first electrode and the second electrode, wherein the organic layer includes an emission layer and at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the present inventive concept will become apparent by reference to the embodiment that will be described later in detail, together with the accompanying drawings. This inventive concept may, however, be embodied in many different forms and should not be limited to the exemplary embodiments.

Hereinafter, embodiments are described in detail by referring to the attached drawings, and in the drawings, like reference numerals denote like elements, and a redundant explanation thereof will not be provided herein.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

As used herein, the singular forms "a," "an" and "the" are intended to include the plural forms as well, unless the context clearly indicates otherwise.

The term "or" means "and/or." It will be further understood that the terms "comprises" and/or "comprising" or "includes" and/or "including" used herein specify the presence of stated features, regions, integers, steps, operations, elements, and/or components, but do not preclude the presence or addition of one or more other features, regions, integers, steps, operations, elements, and/or components.

It will be understood that when a layer, region, or component is referred to as being "on" or "onto" another layer, region, or component, it may be directly or indirectly formed on the other layer, region, or component. That is, for example, intervening layers, regions, or components may be present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Sizes of components in the drawings may be exaggerated for convenience of explanation. In other words, since sizes and thicknesses of components in the drawings are arbitrarily illustrated for convenience of explanation, the following embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The term "organic layer" as used herein refers to a single layer and/or a plurality of layers between the first electrode and the second electrode of the organic light-emitting device. A material included in the "organic layer" is not limited to an organic material.

An organometallic compound according to an embodiment is represented by Formula 1:

Formula 1

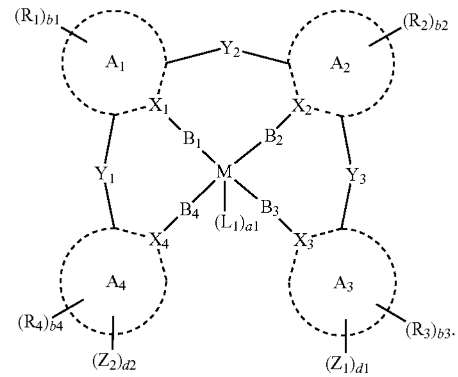

In Formula 1, M may be selected from a Period 1 transition metal, a Period 2 transition metal, and a Period 3 transition metal.

For example, M in Formula 1 may be selected from iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), and thulium (Tm), but is not limited thereto.

In an embodiment, M in Formula 1 may be selected from Ir, Pt, Os, Ti, Zr, Hf, Eu, Tb, and Tm, but is not limited thereto.

In an embodiment, M in Formula 1 may be selected from Ir, Pt, and Os, but is not limited thereto.

In an embodiment, M in Formula 1 may be Pt, but is not limited thereto.

$A_1$ to $A_4$ in Formula 1 may each independently be selected from a $C_5$-$C_{20}$ carbocyclic group and a $C_1$-$C_{20}$ heterocyclic group.

For example, $A_1$ to $A_4$ in Formula 1 may each independently be selected from a $C_5$-$C_{20}$ carbocyclic group and a $C_1$-$C_{20}$ heterocyclic group; and at least one selected from $A_3$ and $A_4$ may be a $C_1$-$C_{20}$ heterocyclic group, but they are not limited thereto.

In an embodiment, $A_1$ to $A_4$ in Formula 1 may each independently be selected from a benzene group, a naphthalene group, a pyrrole group, an imidazole group, a pyrazole group, a thiazole group, an isothiazole group, an oxazole group, an isoxazole group, a triazole group, an indazole group, a tetrahydroindazole group, a pyridine group, a thiazine group, an oxazine group, a pyrimidine group, a pyrazine group, a pyridazine group, a triazine group, a quinoline group, an isoquinoline group, a quinoxaline group, a quinazoline group, naphthyridine group, an indole group, a benzimidazole group, a benzothiazole group, a benzoisothiazole group, a benzoxazole group, a benzoisoxazole group, a benzothiazine group, a benzoxazine group, a dibenzofuran group, and a dibenzothiophene group; and at least one selected from $A_3$ and $A_4$ may be selected from a pyrrole group, an imidazole group, a pyrazole group, a thiazole group, an isothiazole group, an oxazole group, an isoxazole group, a triazole group, an indazole group, a tetrahydroindazole group, a pyridine group, a thiazine group, an oxazine group, a pyrimidine group, a pyrazine group, a pyridazine group, a triazine group, a quinoline group, an isoquinoline group, a quinoxaline group, a quinazoline group, naphthyridine group, an indole group, a benzimidazole group, a benzothiazole group, a benzoisothiazole group, a benzoxazole group, a benzoiso-oxazole group, a benzothiazine group, and a benzoxazine group, but they are not limited thereto.

In an embodiment, $A_1$ to $A_4$ in Formula 1 may each independently be selected from a benzene group, a naphthalene group, a pyrazole group, an indazole group, a tetrahydroindazole group, a pyridine group, a pyrimidine group, a pyrazine group, a pyridazine group, a quinoline group, an isoquinoline group, an indole group, a benzimidazole group, a dibenzofuran group, and a dibenzothiophene group; and at least one selected from $A_3$ and $A_4$ may be selected from a pyrazole group, an indazole group, a tetrahydroindazole group, a pyridine group, a pyrimidine group, a pyrazine group, a pyridazine group, a quinoline group, an isoquinoline group, an indole group, and a benzimidazole group, but they are not limited thereto.

In an embodiment, $A_1$ to $A_4$ in Formula 1 may each independently be selected from a benzene group, a naphthalene group, a pyrazole group, an indazole group, a tetrahydroindazole group, a pyridine group, a pyrimidine group, a pyrazine group, a pyridazine group, a quinoline group, an isoquinoline group, an indole group, a benzimidazole group, a dibenzofuran group, and a dibenzothiophene group; and at least one selected from $A_3$ and $A_4$ may be selected from a pyrazole group, an indazole group, a tetrahydroindazole group, a pyridine group, a pyrimidine group, a pyrazine group, a pyridazine group, a quinoline group, an isoquinoline group, an indole group, and a benzimidazole group, but they are not limited thereto.

In an embodiment, $A_1$ to $A_4$ in Formula 1 may each independently be selected from a benzene group, a naphthalene group, a pyridine group, a pyrimidine group, a pyrazine group, a quinoline group, an isoquinoline group, a dibenzofuran group, and a dibenzothiophene group; and at least one selected from $A_3$ and $A_4$ may be selected from a pyridine group, a pyrimidine group, a pyrazine group, a quinoline group, and an isoquinoline group, but they are not limited thereto.

In an embodiment, $A_1$ to $A_4$ in Formula 1 may each independently be selected from a benzene group, a naphthalene group, a pyridine group, a pyrimidine group, a quinoline group, an isoquinoline group, and a dibenzofuran group; and at least one selected from $A_3$ and $A_4$ may be selected from a pyridine group, a pyrimidine group, a quinoline group, and an isoquinoline group, but they are not limited thereto.

$X_1$ to $X_4$ in Formula 1 may each independently be selected from a carbon atom (C) and a nitrogen atom (N), provided that at least one selected from $X_3$ and $X_4$ may be N.

For example, $X_1$ and $X_2$ in Formula 1 may be C;

$X_3$ and $X_4$ may each independently be selected from C and N, and at least one selected from $X_3$ and $X_4$ may be N, but they are not limited thereto.

In an embodiment, $X_1$ and $X_2$ in Formula 1 may be C; and $X_3$ and $X_4$ may be N, but they are not limited thereto.

$B_1$ to $B_4$ in Formula 1 may each independently be selected from a single bond, O, and S.

For example, $B_1$ to $B_4$ in Formula 1 may be a single bond, but they are not limited thereto.

$Y_1$ to $Y_3$ in Formula 1 may each independently be selected from a single bond and a divalent linking group, and at least one selected from $Y_1$ to $Y_3$ may be a divalent linking group.

For example, $Y_1$ and $Y_2$ may each be a single bond, and $Y_3$ may be a divalent linking group; or $Y_2$ and $Y_3$ may each be a single bond, and $Y_1$ may be a divalent linking group; or $Y_3$ and $Y_1$ may each be a single bond, and $Y_2$ may be a divalent linking group, but they are not limited thereto.

In an embodiment, regarding Formula 1, $Y_1$ and $Y_2$ may each be a divalent linking group, and $Y_3$ may be a divalent single bond; or $Y_2$ and $Y_3$ may each be a divalent linking group, and $Y_1$ may be a divalent single bond; or $Y_3$ and $Y_1$ may each be a divalent linking group, and $Y_2$ may be a divalent single bond, but they are not limited thereto.

In an embodiment, $Y_1$ to $Y_3$ may be a divalent linking group, but they are not limited thereto.

For example, regarding Formula 1, $Y_1$ to $Y_3$ may each independently be selected from a single bond and a divalent linking group, and at least one selected from $Y_1$ to $Y_3$ may be a divalent linking group;

the divalent linking group may be selected from *—O—*', *—S—*', *—{B($R_{81}$)}—*', *—{N($R_{81}$)}—*', *—{C($R_{81}$)($R_{82}$)}$_{n81}$—*', *—{Si($R_{81}$)($R_{82}$)}$_{n81}$—*', a substituted or unsubstituted $C_2$-$C_{20}$ alkenylene group, a substituted or unsubstituted $C_2$-$C_{20}$ alkynylene group, a substituted or unsubstituted $C_6$-$C_{20}$ arylene group, a substituted or unsubstituted $C_1$-$C_{20}$ heteroarylene group, a substituted or unsubstituted divalent non-aromatic condensed polycyclic group, and a substituted or unsubstituted divalent non-aromatic condensed heteropolycyclic group;

$R_{81}$ and $R_{82}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and $—Si(Q_1)(Q_2)(Q_3)$; and $R_{81}$ and $R_{82}$ may optionally be linked to form a saturated or unsaturated ring;

$Q_1$ to $Q_3$ may each independently be selected from hydrogen, deuterium, a $C_1$-$C_{20}$ alkyl group, and a phenyl group;

n81 may be selected from 1, 2, 3, 4, and 5; and

* and *' each independently indicate a binding site to a neighboring atom, but they are not limited thereto.

In an embodiment, $Y_1$ to $Y_3$ in Formula 1 may each independently be selected from a single bond and a divalent linking group, and at least one selected from $Y_1$ to $Y_3$ may be a divalent linking group;

the divalent linking group may be selected from *—O—*', *—S—*', $*—\{B(R_{81})\}—*'$, $*—\{N(R_{81})\}—*'$, $*—\{C(R_{81})(R_{82})\}_{n81}—*'$, $*—\{Si(R_{81})(R_{82})\}_{n81}—*'$, a substituted or unsubstituted ethenylene group, a substituted or unsubstituted propenylene group, a substituted or unsubstituted butenylene group, a substituted or unsubstituted pentenylene group, a substituted or unsubstituted phenylene group, a substituted or unsubstituted naphthylene group, a substituted or unsubstituted fluorenylene group, a substituted or unsubstituted pyridinylene group, a substituted or unsubstituted pyrazinylene group, a substituted or unsubstituted pyrimidinylene group, a substituted or unsubstituted quinolinylene group, a substituted or unsubstituted isoquinolinylene group, a substituted or unsubstituted naphthyridinylene group, a substituted or unsubstituted quinoxalinylene group, a substituted or unsubstituted quinazolinylene group, a substituted or unsubstituted dibenzofuranylene group, and a substituted or unsubstituted dibenzothiophenylene group;

$R_{81}$ and $R_{82}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, —$CD_3$, —$CD_2H$, —$CDH_2$, —$CF_3$, —$CF_2H$, —$CFH_2$, —$Si(CH_3)_3$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and $R_{81}$ and $R_{82}$ may optionally be linked to form a saturated or unsaturated ring;

n81 may be selected from 1, 2, 3, 4, and 5; and

* and *' each independently indicate a binding site to a neighboring atom, but they are not limited thereto.

In an embodiment, $Y_1$ to $Y_3$ in Formula 1 may each independently be selected from a single bond and a divalent linking group, and at least one selected from $Y_1$ to $Y_3$ may be a divalent linking group; and the divalent linking group may be represented by one selected from *—O—*', *—S—*', and one of Formulae 8-1 to 8-18, but they are not limited thereto:

8-1

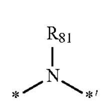

8-2

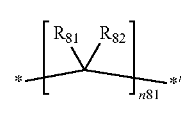

8-3

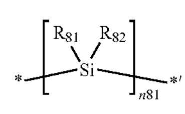

8-4

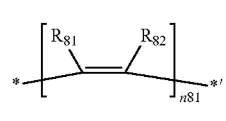

-continued 8-5

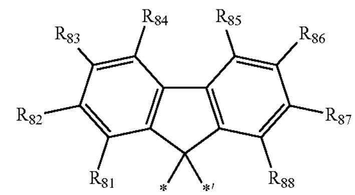

8-6

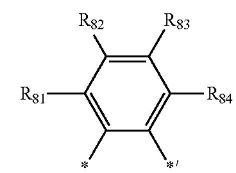

8-7

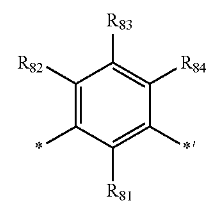

8-8

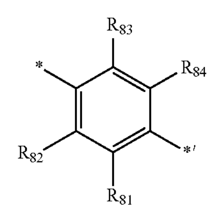

8-9

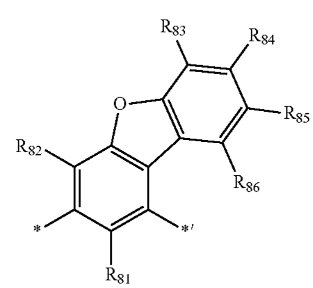

8-10

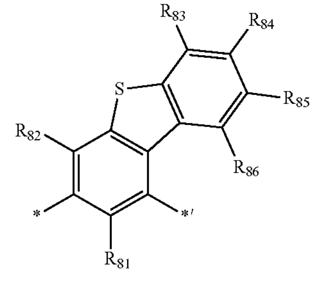

-continued 8-11

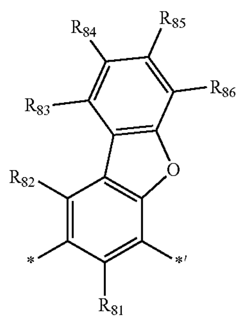

8-12

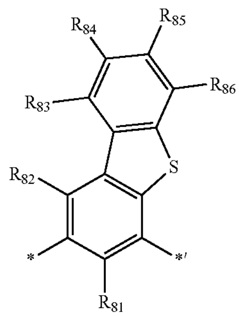

8-13

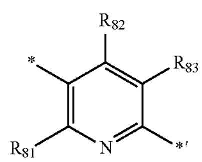

8-14

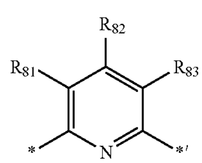

8-15

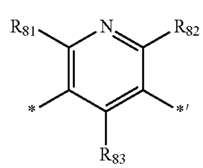

8-16

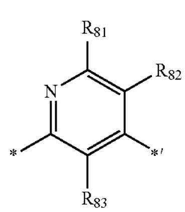

8-17

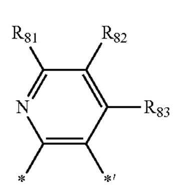

-continued 8-18

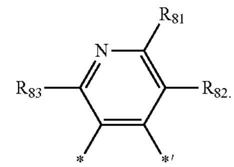

In Formulae 8-1 to 8-18, $R_{81}$ to $R_{88}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, —$CD_3$, —$CD_2H$, —$CDH_2$, —$CF_3$, —$CF_2H$, —$CFH_2$, —$Si(CH_3)_3$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group;

n81 may be selected from 1, 2, 3, 4, and 5; and

* and *' each independently indicate a binding site to a neighboring atom.

In an embodiment, $R_{81}$ to $R_{88}$ in Formulae 8-1 to 8-18 may each independently be selected from hydrogen, deuterium, —F, —Cl, —Br, —I, a cyano group, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, an iso-propoxy group, an n-butoxy group, and a tert-butoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a naphthyl group;

a phenyl group, a naphthyl group, a pyridinyl group, and a dibenzofuranyl group; and a phenyl group, a naphthyl group, a pyridinyl group and a dibenzofuranyl group, each substituted with at least one selected from deuterium, —F, —Cl, —Br, —I, —$CD_3$, —$CD_2H$, —$CDH_2$, —$CF_3$, —$CF_2H$, —$CFH_2$, —$Si(CH_3)_3$, a cyano group, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, an iso-propoxy group, n-butoxy group, tert-butoxy group, a phenyl group, a naphthyl group, and a pyridinyl group; and n81 may be selected from 1 and 2, but they are not limited thereto.

In an embodiment, $Y_1$ to $Y_3$ in Formula 1 may each independently be selected from a single bond and a divalent linking group, at least one selected from $Y_1$ to $Y_3$ is a divalent linking group; and the divalent linking group may be represented by one selected from *—O—*', *—S—*', and one of Formulae 9-1 to 9-70, but they are not limited thereto:

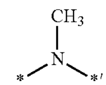

9-1

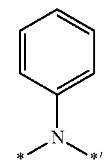

9-2

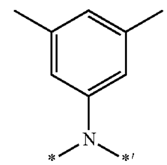

9-3

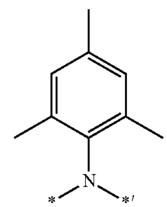

9-4

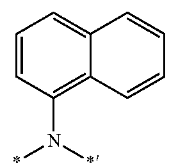

9-5

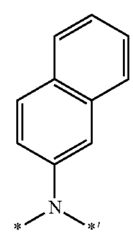

9-6

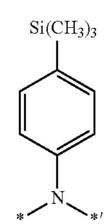

9-7

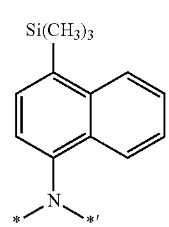

9-8

-continued
9-9
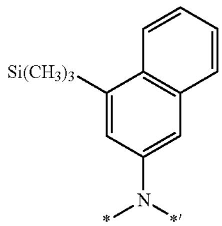
9-10
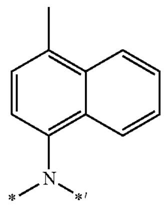
9-11
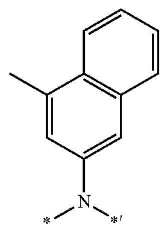
9-12
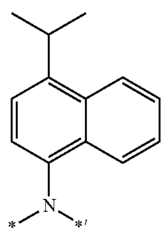
9-13
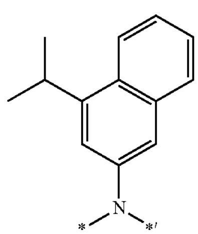
9-14
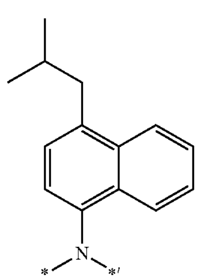
-continued
9-15
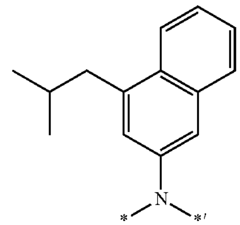
9-16
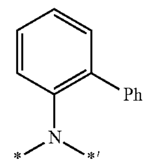
9-17
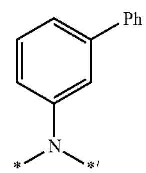
9-18
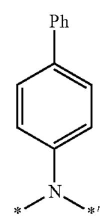
9-19
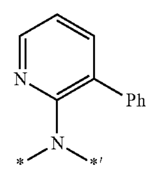
9-20
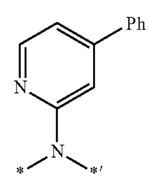
9-21
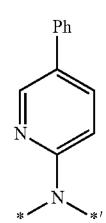
9-22
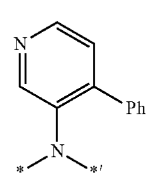

-continued
9-23
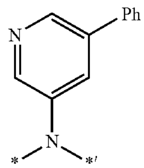
9-24
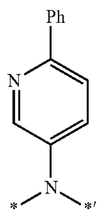
9-25
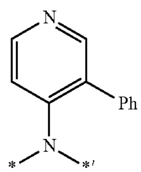
9-26
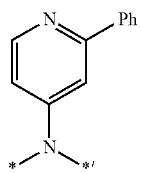
9-27
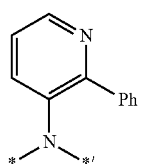
9-28
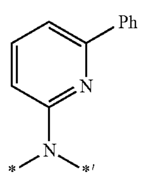
9-29
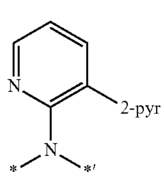
9-30
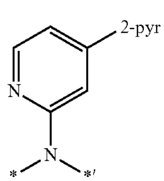
-continued
9-31
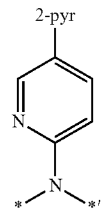
9-32
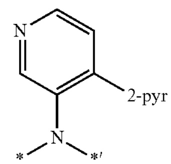
9-33
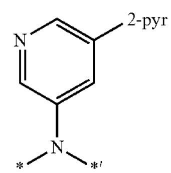
9-34
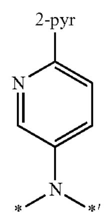
9-35
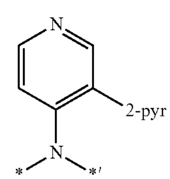
9-36
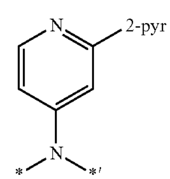
9-37
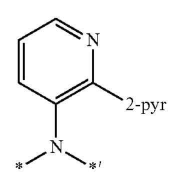
9-38
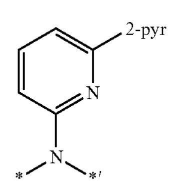

-continued
9-39
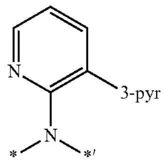
9-40
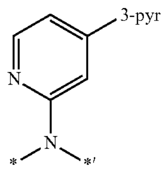
9-41
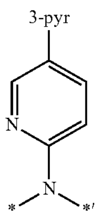
9-42
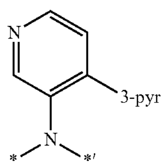
9-43
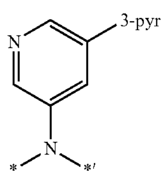
9-44
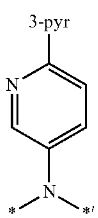
9-45
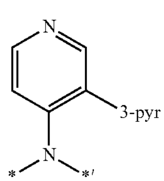
9-46
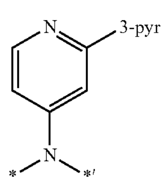
-continued
9-47
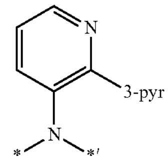
9-48
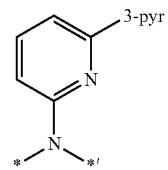
9-49
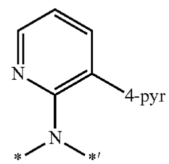
9-50
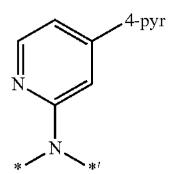
9-51
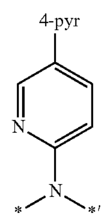
9-52
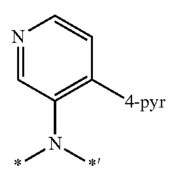
9-53
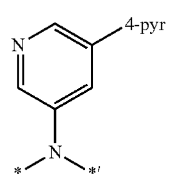
9-54
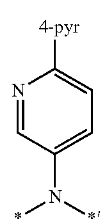

-continued 9-55

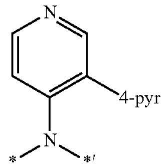

9-56

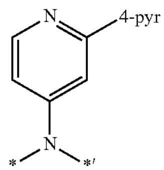

9-57

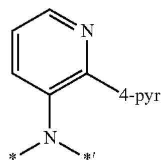

9-58

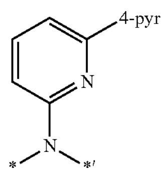

9-59

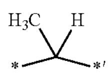

9-60

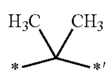

9-61

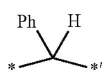

9-62

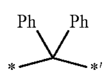

9-63

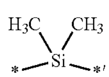

9-64

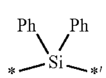

9-65

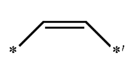

9-66

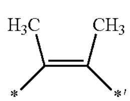

9-67

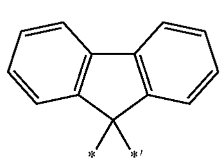

-continued 9-68

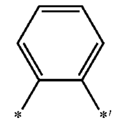

9-69

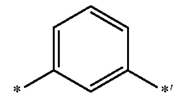

9-70

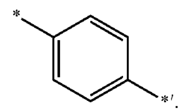

In Formulae 9-1 to 9-70,

Ph refers to a phenyl group;

2-pyr refers to a 2-pyridinyl group, 3-pyr refers to a 3-pyridinyl group, 4-pyr refers to a 4-pyridinyl group; and

* and *' each independently indicates a binding site to a neighboring atom.

$Z_1$ and $Z_2$ in Formula 1 may each independently be represented by one of Formulae 2-1 to 2-4:

2-1

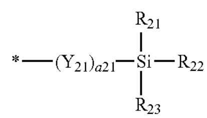

2-2

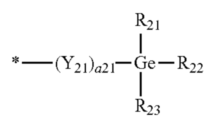

2-3

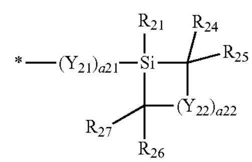

2-4

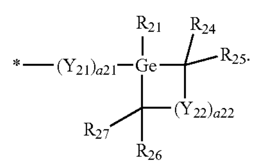

In Formulae 2-1 to 2-4, $Y_{21}$ and $Y_{22}$ may each independently be selected from a substituted or unsubstituted alkylene group and a substituted or unsubstituted $C_2$-$C_{10}$ alkenylene group;

a21 and a22 may each independently be selected from 0, 1, 2, 3, 4, and 5;

$R_{21}$ to $R_{27}$ may each independently be selected from hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group;

* indicates a binding site to a neighboring atom.

For example, in Formulae 2-1 to 2-4, $Y_{21}$ and $Y_{22}$ may each independently be selected from a methylene group, an ethylene group, and a propylene group; and a methylene group, an ethylene group, and a propylene group, each substituted with at least one selected from deuterium, —F, —Cl, —Br, —I, —$CD_3$, —$CD_2H$, —$CDH_2$, —$CF_3$, —$CF_2H$, —$CFH_2$, and a $C_1$-$C_{20}$ alkyl group; and a21 and a22 may each independently be selected from 0, 1, 2, and 3, but they are not limited thereto.

In an embodiment, in Formulae 2-1 to 2-4, $Y_{21}$ and $Y_{22}$ may each independently be selected from a methylene group, an ethylene group, and a propylene group; and a21 and a22 may each independently be selected from 0, 1, and 2, but they are not limited thereto.

For example, in Formulae 2-1 to 2-4, $R_{21}=R_{22}=R_{23}$;

$R_{21}=R_{22}$, and $R_{22}\neq R_{23}$; or $R_{21}\neq R_{22}$, $R_{22}\neq R_{23}$, and $R_{23}\neq R_{21}$, but they are not limited thereto.

In an embodiment, in Formulae 2-1 to 2-4, $R_{21}$ to $R_{27}$ may each independently be selected from:

hydrogen, deuterium, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl (adamantyl) group, a norbornanyl (norbornyl) group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, but they are not limited thereto.

In an embodiment, $R_{21}$ to $R_{27}$ in Formulae 2-1 to 2-4 may each independently be selected from:

hydrogen, deuterium, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group, each substituted with at least one selected from deuterium and a phenyl group;

a phenyl group and a naphthyl group; and a phenyl group and a naphthyl group, each substituted with at least one selected from deuterium, —$CD_3$, —$CD_2H$, —$CDH_2$, —$CF_3$, —$CF_2H$, —$CFH_2$, a $C_1$-$C_{20}$ alkyl group, and a phenyl group, but they are not limited thereto.

In an embodiment, $R_{21}$ to $R_{27}$ in Formulae 2-1 to 2-4 may each independently be selected from:

hydrogen, a methyl group, an ethyl group, an n-propyl group, an iso-propyl group, an n-butyl group, an iso-butyl group, a sec-butyl group, a tert-butyl group, a phenyl group, and a naphthyl group, but they are not limited thereto.

In an embodiment, in Formulae 2-1 and 2-2, $R_{21}$ and $R_{22}$ may each independently be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; and $R_{23}$ may be a substituted or unsubstituted $C_1$-$C_{60}$ alkyl group, but they are not limited thereto.

In an embodiment, in Formulae 2-1 and 2-2, $R_{21}$ and $R_{22}$ may each independently be selected from a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $R_{23}$ may be selected from a $C_1$-$C_{20}$ alkyl group; and a $C_1$-$C_{20}$ alkyl group, substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, but they are not limited thereto.

In an embodiment, in Formulae 2-1 and 2-2, $R_{21}$ and $R_{22}$ may each independently be selected from:

a phenyl group and a naphthyl group; and a phenyl group and a naphthyl group, each substituted with at least one selected from deuterium, —$CD_3$, —$CD_2H$, —$CDH_2$, —$CF_3$, —$CF_2H$, —$CFH_2$, a $C_1$-$C_{20}$ alkyl group, and a phenyl group; and $R_{23}$ may be selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group; and a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group, each substituted with at least one selected from deuterium and a phenyl group, but they are not limited thereto.

In an embodiment, in Formulae 2-1 and 2-2, $R_{21}$ and $R_{22}$ may each independently be selected from a phenyl group and a naphthyl group; and $R_{23}$ may be selected from a methyl group, an ethyl group, an n-propyl group, an iso-propyl group, an n-butyl group, an iso-butyl group, a sec-butyl group, and a tert-butyl group, but they are not limited thereto.

For example, $Z_1$ and $Z_2$ in Formula 1 may each independently be represented by one of Formulae 2-11 to 2-20, but they are not limited thereto:

2-11

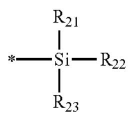

2-12

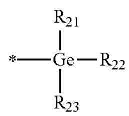

2-13

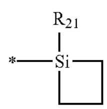

2-14

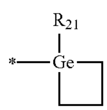

2-15

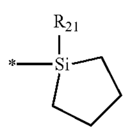

2-16

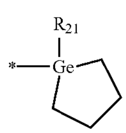

2-17

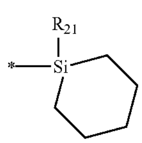

2-18

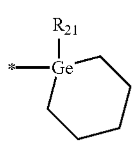

-continued 2-19

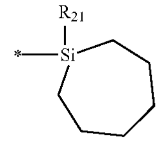

2-20

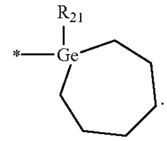

In Formulae 2-11 to 2-20, $R_{21}$ to $R_{23}$ may each independently be selected from a methyl group, an ethyl group, an n-propyl group, an iso-propyl group, an n-butyl group, an iso-butyl group, a sec-butyl group, a tert-butyl group, a phenyl group, and a naphthyl group; and

* indicates a binding site to a neighboring atom.

In an embodiment, in Formulae 2-11 to 2-20, $R_{21}=R_{22}=R_{23}$;

$R_{21}=R_{22}$, and $R_{22}\neq R_{23}$; or $R_{21}\neq R_{22}$, $R_{22}\neq R_{23}$, and $R_{23}\neq R_{21}$, but they are not limited thereto.

In an embodiment, $Z_1$ and $Z_2$ in Formula 1 may each independently be represented by one of Formulae 2-21 to 2-34, but they are not limited thereto:

2-21

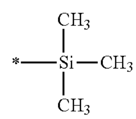

2-22

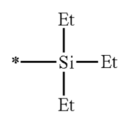

2-23

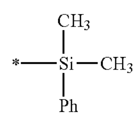

2-24

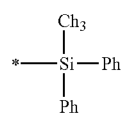

2-25

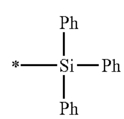

2-26

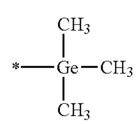

2-27

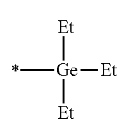

-continued 2-28

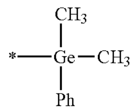

2-29

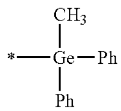

2-30

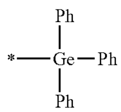

2-31

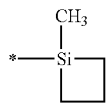

2-32

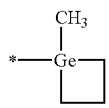

2-33

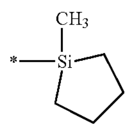

2-34

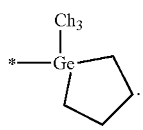

In Formulae 2-21 to 2-34,

Et refers to an ethyl group;

Ph refers to a phenyl group; and

* indicates a binding site to a neighboring atom.

In an embodiment, $Z_1$ and $Z_2$ in Formula 1 may each independently be represented by one of Formulae 2-2 to 2-4, but they are not limited thereto:

2-2

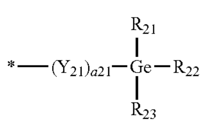

2-3

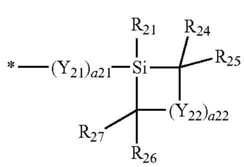

2-4

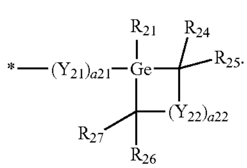

In Formulae 2-2 to 2-4, $Y_{21}$, $Y_{22}$, a21, a22, and $R_{21}$ to $R_{27}$ are the same as described in connection with Formulae 2-1 to 2-4.

In an embodiment, $Z_1$ and $Z_2$ in Formula 1 may each independently be represented by one of Formulae 2-12 to 2-20, but they are not limited thereto:

2-12

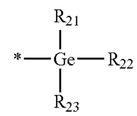

2-13

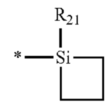

2-14

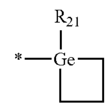

2-15

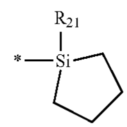

2-16

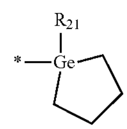

2-17

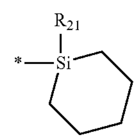

2-18

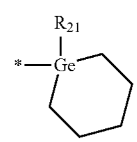

2-19

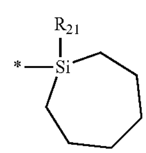

2-20

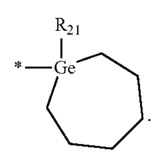

In Formulae 2-12 to 2-20, $R_{21}$ to $R_{23}$ may each independently be selected from a methyl group, an ethyl group, an n-propyl group, an iso-propyl group, an n-butyl group, an iso-butyl group, a sec-butyl group, a tert-butyl group, a phenyl group, and a naphthyl group; and

* indicates a binding site to a neighboring atom.

In an embodiment, in Formulae 2-12 to 2-20, $R_{21}=R_{22}=R_{23}$;

$R_{21}=R_{22}$, and $R_{22}\neq R_{23}$; or $R_{21}\neq R_{22}$, $R_{22}\neq R_{23}$, and $R_{23}\neq R_{21}$, but they are not limited thereto.

In an embodiment, $Z_1$ and $Z_2$ in Formula 1 may each independently be represented by one of Formulae 2-26 to 2-34, but they are not limited thereto:

2-26

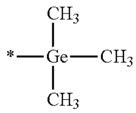

2-27

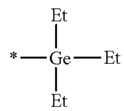

2-28

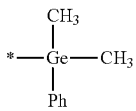

2-29

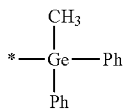

2-30

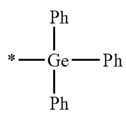

2-31

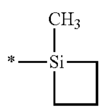

2-32

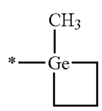

2-33

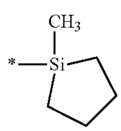

2-34

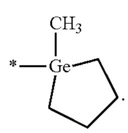

In Formulae 2-26 to 2-34,

Et refers to an ethyl group;

Ph refers to a phenyl group; and

* indicates a binding site to a neighboring atom.

d1 in Formula 1 indicates the number of groups $Z_1$, and may be selected from 0, 1, 2, 3, and 4. When d1 is 2 or more, groups $Z_1$ may be identical to or different from each other.

d2 in Formula 1 indicates the number of groups $Z_2$, and may be selected from 0, 1, 2, 3, and 4. When d2 is 2 or more, groups $Z_2$ may be identical to or different from each other.

Regarding Formula 1, when $X_3$ is N, d1 may be selected from 1, 2, 3, and 4; or when $X_4$ is N, d2 may be selected from 1, 2, 3, and 4.

For example, d1 and d2 in Formula 1 may each independently be selected from 0, 1, and 2; and at least one selected from d1 and d2 may be selected from 1 and 2, but they are not limited thereto.

In an embodiment, d1 and d2 in Formula 1 may be 1, but they are not limited thereto.

$R_1$ to $R_4$ in Formula 1 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —C(=O)($Q_7$), and —N($Q_7$)($Q_8$); $R_1$ and $R_4$ or $R_2$ and $R_3$ may optionally be linked to form a saturated or unsaturated ring, wherein $Q_7$ and $Q_8$ may each independently be selected from a $C_1$-$C_{60}$ alkyl group and a $C_6$-$C_{60}$ aryl group.

For example, $R_1$ to $R_4$ in Formula 1 may each independently be selected from hydrogen, deuterium, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, but they are not limited thereto.

In an embodiment, $R_1$ to $R_4$ in Formula 1 may each independently be selected from hydrogen, deuterium, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group, each substituted with at least one selected from deuterium and a phenyl group;

a phenyl group, a naphthyl group, and a carbazolyl group; and a phenyl group, a naphthyl group, and a carbazolyl group, each substituted with at least one selected from deuterium, —F, —Cl, —Br, —I, $—CD_3$, $—CD_2H$, $—CDH_2$, $—CF_3$, $—CF_2H$, $—CFH_2$, a $C_1$-$C_{20}$ alkyl group, a phenyl group, and a naphthyl group, but they are not limited thereto.

In an embodiment, $R_1$ to $R_4$ in Formula 1 may each independently be selected from hydrogen, deuterium, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group; and a phenyl group and a carbazolyl group; and a phenyl group, a naphthyl group, and a carbazolyl group, each substituted with at least one selected from a $C_1$-$C_{20}$ alkyl group and a phenyl group, but they are not limited thereto.

b1 in Formula 1 indicates the number of groups $R_1$, and b1 may be selected from 1, 2, 3, and 4. When b1 is 2 or more, groups $R_1$ may be identical to or different from each other.

b2 in Formula 1 indicates the number of groups $R_2$, and b2 may be selected from 1, 2, 3, and 4. When b2 is 2 or more, groups $R_2$ may be identical to or different from each other.

b3 in Formula 1 indicates the number of groups $R_3$, and b3 may be selected from 1, 2, 3, and 4. When b3 is 2 or more, groups $R_3$ may be identical to or different from each other.

b4 in Formula 1 indicates the number of group $R_4$, and b4 may be selected from 1, 2, 3, and 4. When b4 is 2 or more, groups $R_4$ may be identical to or different from each other.

$L_1$ in Formula 1 may be selected from a monodentate ligand and a bidentate ligand.

Examples of the monodentate ligand include an iodide ion, a bromide ion, a chloride ion, a sulfide, a thiocyanate ion, a nitrate ion, an azide ion, a hydroxide ion, a cyanide ion, an isocyanide ion, water, an acetonitrile, a pyridine, an ammonia, a carbon monoxide, $PPh_3$, $PPh_2CH_3$, $PPh(CH_3)_2$, and $P(CH_3)_3$, but they are not limited thereto.

Examples of the bidentate ligand include an oxalate ion, acetylacetonate, a picolinic acid, 2-(2-hydroxyphenyl)-pyridine, 2-phenylpyridine, 1,2-bis(diphenylphosphino)ethane (dppe), 1,1-bis(diphenylphosphino)methane (dppm), glycinate, ethylenediamine, 2,2'-bipyridine, and 1,10-phenanthroline, but they are not limited thereto.

For example, $L_1$ in Formula 1 may be represented by one of Formulae 3-1 to 3-6, but they are not limited thereto:

3-1

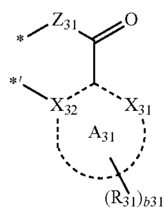

3-2

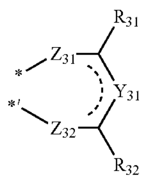

3-3

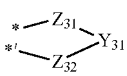

3-5

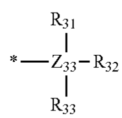

3-6

$$*-X_{31}\equiv X_{32}-R_{31}.$$

In Formulae 3-1 to 3-6, $A_{31}$ may be selected from a $C_5$-$C_{20}$ carbocyclic group and a $C_1$-$C_{20}$ heterocyclic group;

$X_{31}$ and $X_{32}$ may each independently be selected from C and N;

$Y_{31}$ may be selected from a single bond, a carbon-carbon double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group;

$Z_{31}$ and $Z_{32}$ may each independently be selected from N, O, $N(R_{34})$, $P(R_{34})(R_{35})$, and $As(R_{34})(R_{35})$;

$Z_{33}$ may be selected from P and As;

$R_{31}$ to $R_{35}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group;

b31 may be selected from 1, 2, and 3; and

* and *' may each independently indicate a binding site to a neighboring atom.

For example, $A_{31}$ in Formulae 3-1 to 3-6 may be selected from a benzene group, a naphthalene group, a pyridine group, a pyrimidine group, a triazine group, a quinoline group, and an isoquinoline group, but is not limited thereto.

For example, $Y_{31}$ in Formulae 3-1 to 3-6 may be selected from a substituted or unsubstituted methylene group and a substituted or unsubstituted phenylene group, but is not limited thereto.

For example, $Z_{33}$ in Formulae 3-1 to 3-6 may be P, but is not limited thereto.

For example, $R_{31}$ to $R_{35}$ in Formulae 3-1 to 3-6 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, but they are not limited thereto.

In an embodiment, $L_1$ in Formula 1 may be represented by one of Formulae 4-1 to 4-5, but is not limited thereto:

4-1

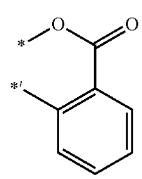

4-2

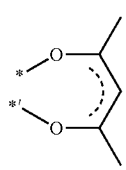

4-3

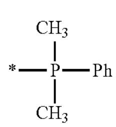

4-4

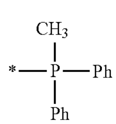

-continued 4-5

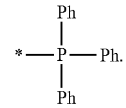

In Formulae 4-1 to 4-5,

Ph refers to a phenyl group; and

* and *' may each indicate a binding site to a neighboring atom.

a1 in Formula 1 indicates the number of groups $L_1$, and a1 may be selected from 0, 1, and 2. When a1 is 2 or more, groups $L_1$ may be identical to or different from each other.

For example, a1 in Formula 1 may be 0, but is not limited thereto.

In an embodiment, in Formula 1, M may be Pt, and a1 may be 0, but they are not limited thereto.

In an embodiment, in Formula 1, M may be Os, and a1 may be 2, but they are not limited thereto.

The organometallic compound represented by Formula 1 may be represented by one of Formulae 1-1 to 1-3, but the formula representing the organometallic compound is not limited thereto:

1-1

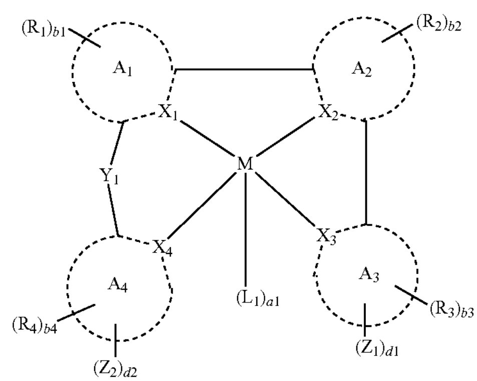

1-2

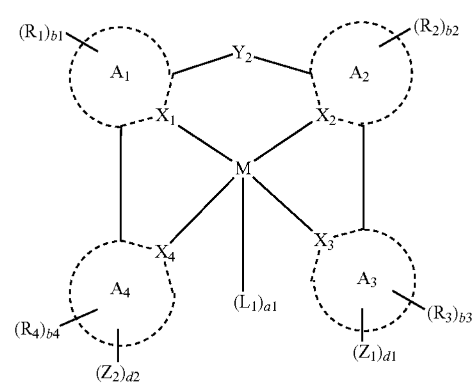

-continued 1-3

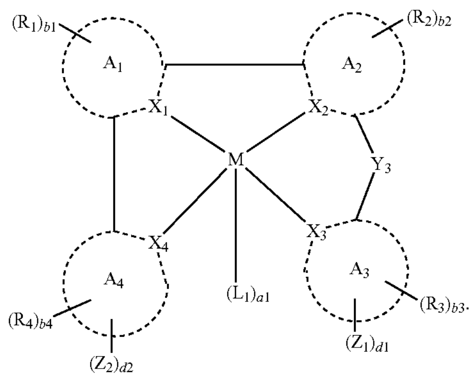

In Formulae 1-1 to 1-3,

M, $A_1$ to $A_4$, $X_1$ to $X_4$, $Z_1$, $Z_2$, d1, d2, $R_1$ to $R_4$, b1 to b4, $L_1$, and a1 are the same as described above in connection with Formula 1; and $Y_1$ to $Y_3$ may each independently indicate a divalent linking group.

For example, in Formulae 1-1 to 1-3, M is selected from Ir, Pt, and Os;

$A_1$ to $A_4$ may each independently be selected from a benzene group, a naphthalene group, a pyridine group, a pyrimidine group, a quinoline group, and an isoquinoline group;

at least one selected from $A_3$ and $A_4$ may be selected from a pyridine group, a pyrimidine group, a quinoline group, and an isoquinoline group;

$X_1$ and $X_2$ may be C;

$X_3$ and $X_4$ may each independently be selected from C and N, and at least one selected from $X_3$ and $X_4$ may be N, but they are not limited thereto.

The organometallic compound represented by Formula 1 may be represented by one of Formulae 1-11 to 1-13, but the formula representing the organometallic compound is not limited thereto:

1-11

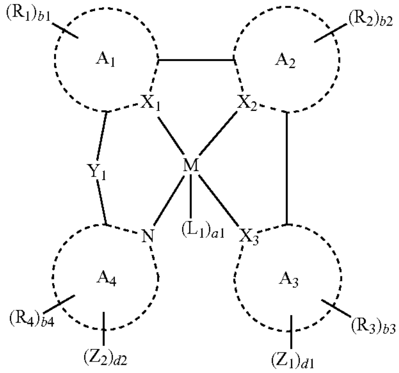

-continued 1-12

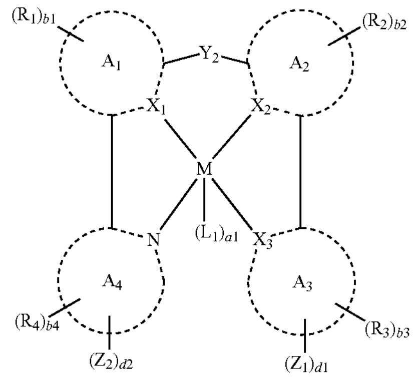

1-13

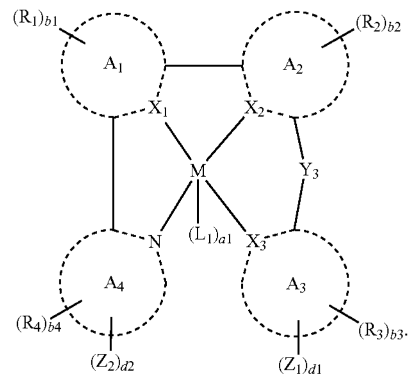

In Formulae 1-11 to 1-13,

M, $A_1$ to $A_4$, $X_1$ to $X_3$, $Z_1$, $Z_2$, $R_1$ to $R_4$, b1 to b4, $L_1$, and a1 are the same as described above in connection with Formula 1;

$Y_1$ to $Y_3$ may each independently be a divalent linking group;

d1 may be selected from 0, 1, 2, 3, and 4; and d2 may be selected from 1, 2, 3, and 4.

For example, $Z_1$ and $Z_2$ in Formulae 1-11 to 1-13 may each independently be represented by one of Formulae 2-21 to 2-34, but they are not limited thereto.

In an embodiment, in Formulae 1-11 to 1-13, M is Pt, and a1 is 0, but they are not limited thereto.

The organometallic compound represented by Formula 1 may be represented by one of Formulae 1-14 to 1-16, but the formula representing the organometallic compound is not limited thereto:

1-14

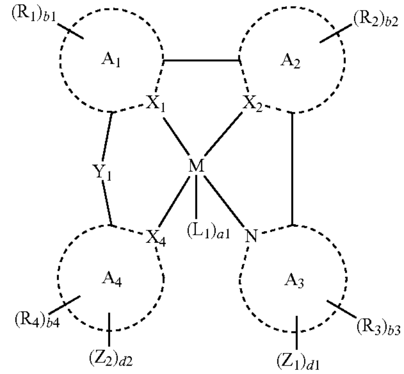

-continued 1-15

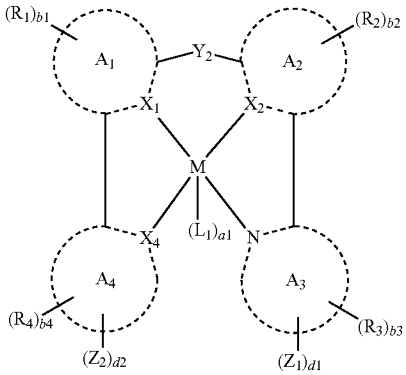

1-16

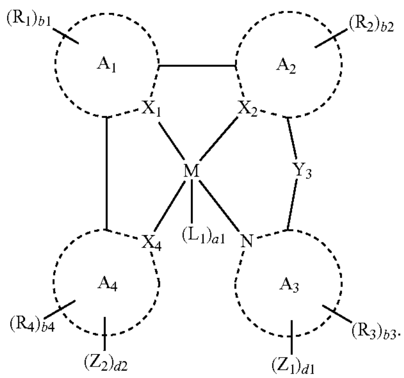

In Formulae 1-14 to 1-16,

M, $A_1$ to $A_4$, $X_1$, $X_2$, $X_4$, $Z_1$, $Z_2$, $R_1$ to $R_4$, b1 to b4, $L_1$, and a1 are the same as described above in connection with Formula 1;

$Y_1$ to $Y_3$ may each independently be a divalent linking group;

d1 may be selected from 1, 2, 3, and 4; and d2 may be selected from 0, 1, 2, 3, and 4.

For example, $Z_1$ and $Z_2$ in Formulae 1-14 to 1-16 may each independently be represented by one of Formulae 2-21 to 2-34, but they are not limited thereto.

In an embodiment, in Formulae 1-14 to 1-16, M is Pt, and a1 is 0, but they are not limited thereto.

The organometallic compound represented by Formula 1 may be represented by one of Formulae 1-17 to 1-19, but the formula representing the organometallic compound is not limited thereto:

1-17

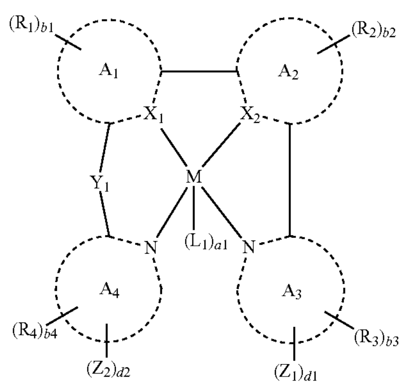

-continued 1-18

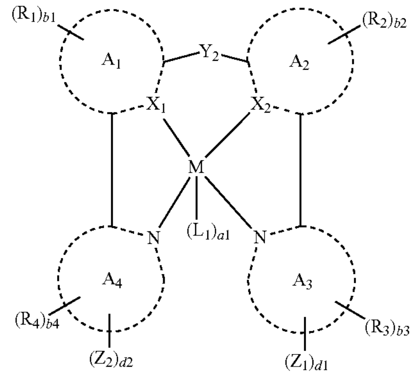

1-19

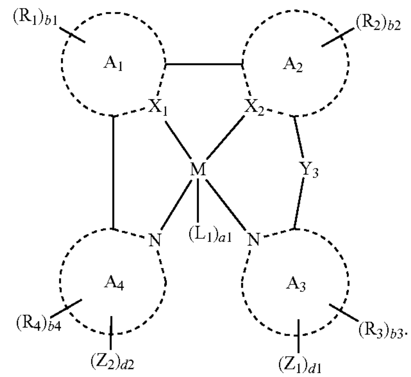

In Formulae 1-17 to 1-19,

M, $A_1$ to $A_4$, $X_1$, $X_2$, $Z_1$, $Z_2$, $R_1$ to $R_4$, b1 to b4, $L_1$, and a1 are the same as described above in connection with Formula 1;

$Y_1$ to $Y_3$ may each independently be a divalent linking group;

d1 may be selected from 1, 2, 3, and 4; and d2 may be selected from 1, 2, 3, and 4.

For example, $Z_1$ and $Z_2$ in Formulae 1-17 to 1-19 may each independently be represented by one of Formulae 2-21 to 2-34, but they are not limited thereto.

In an embodiment, in Formulae 1-17 to 1-19, M is Pt, and a1 is 0, but they are not limited thereto.

The organometallic compound represented by Formula 1 may be selected from Compounds 1 to 18 and 20 to 37, but the formula representing the organometallic compound is not limited thereto:

1
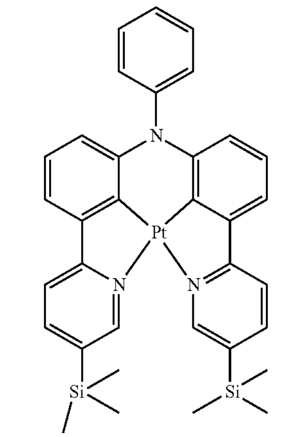
2
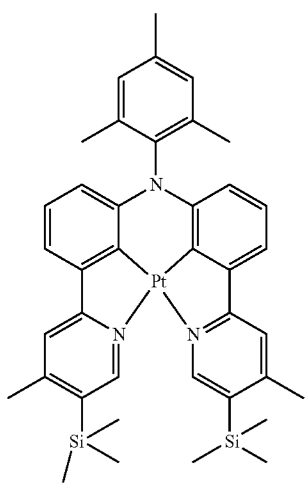
3
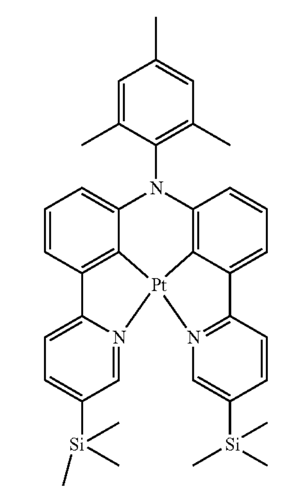
-continued
4
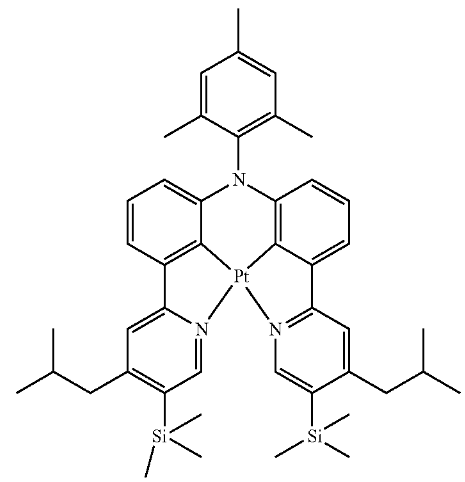
5
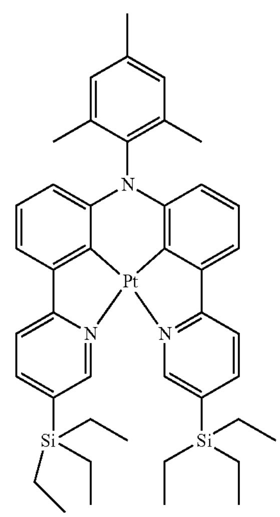
6
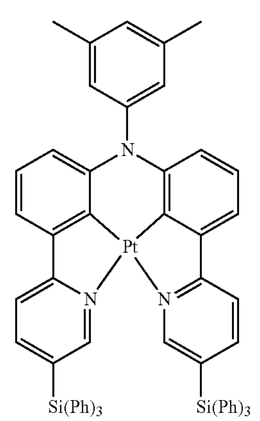

-continued
7
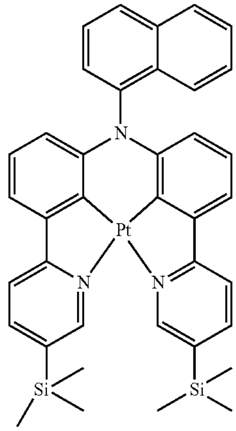
8
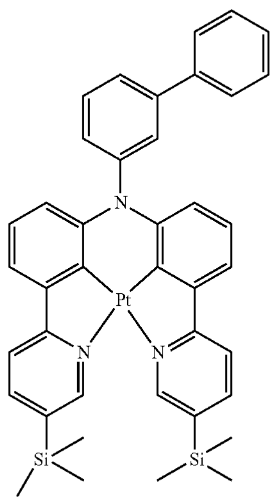
9
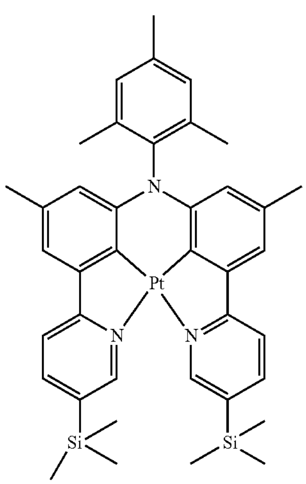
-continued
10
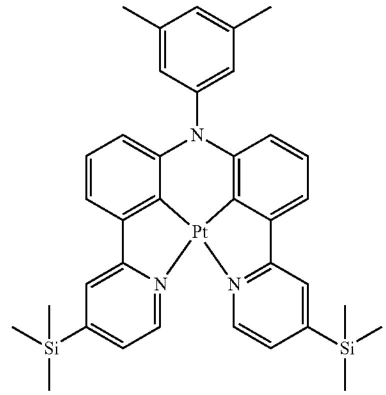
11
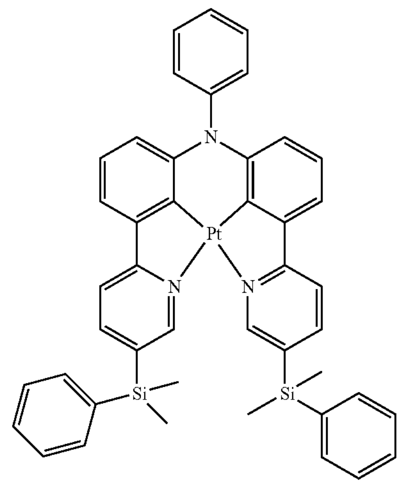
12
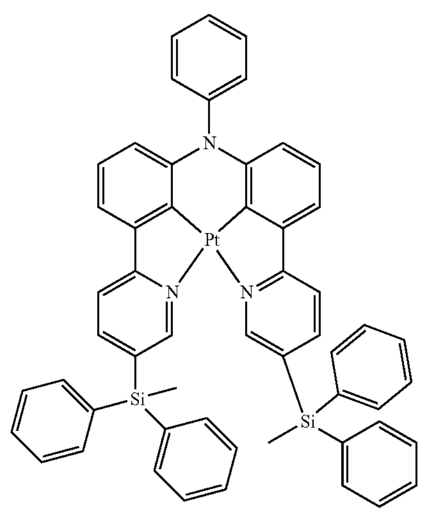

-continued
13
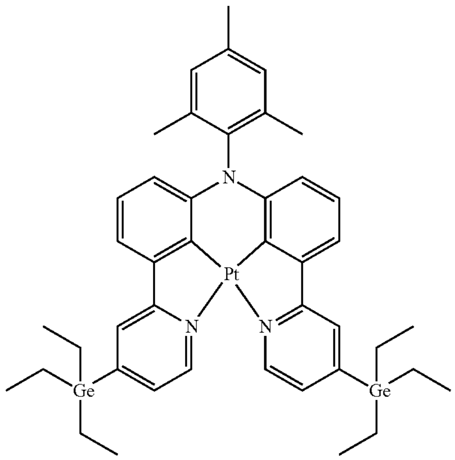
14
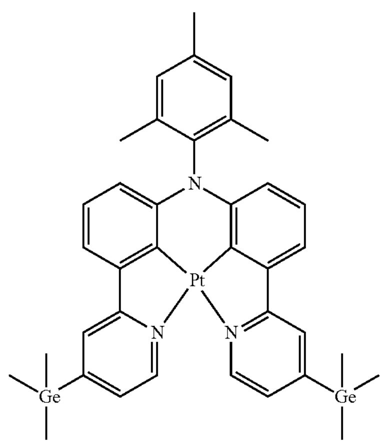
15
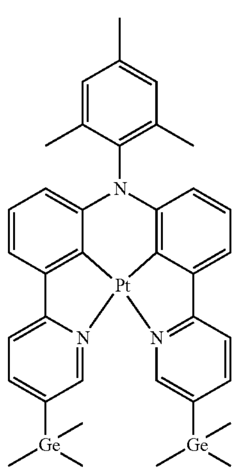
-continued
16
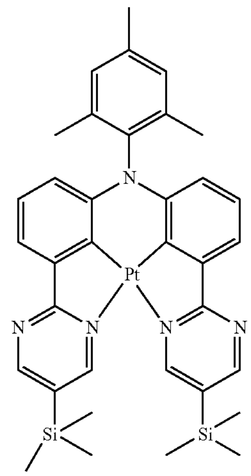
17
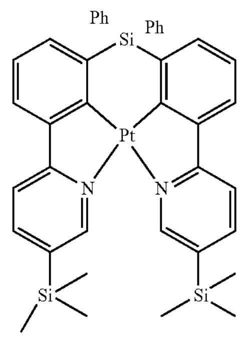
18
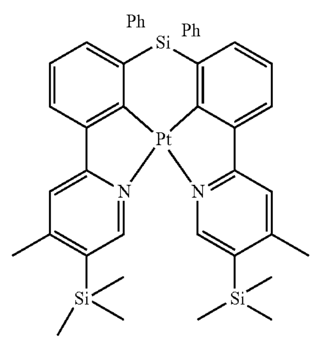
20
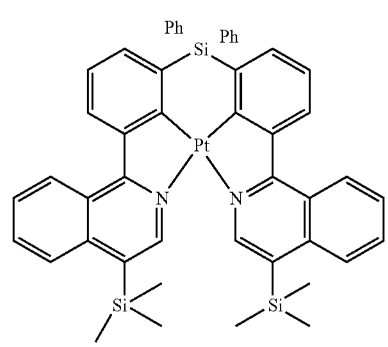

-continued
21
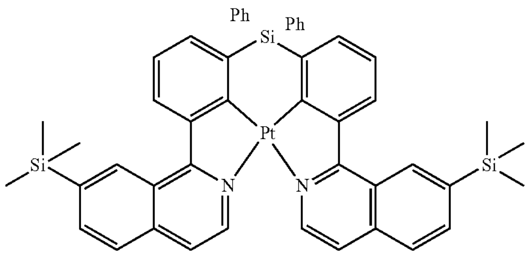
22
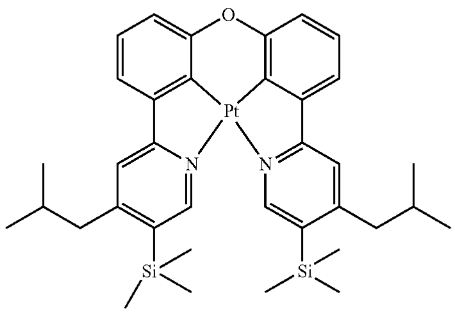
23
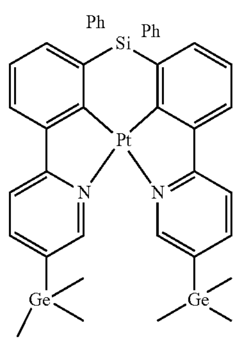
24
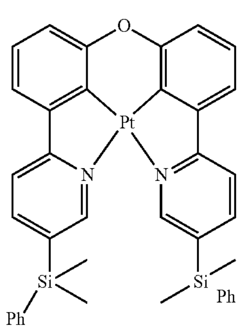
-continued
25
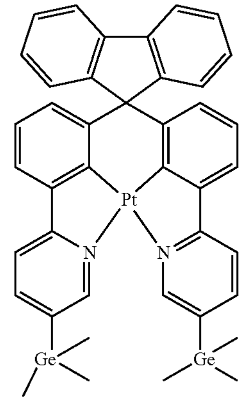
26
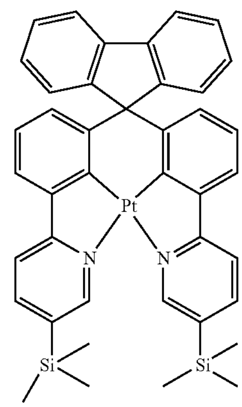
27
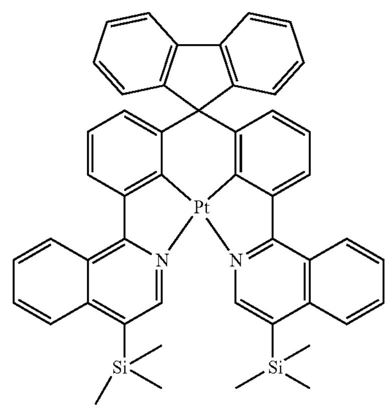
28
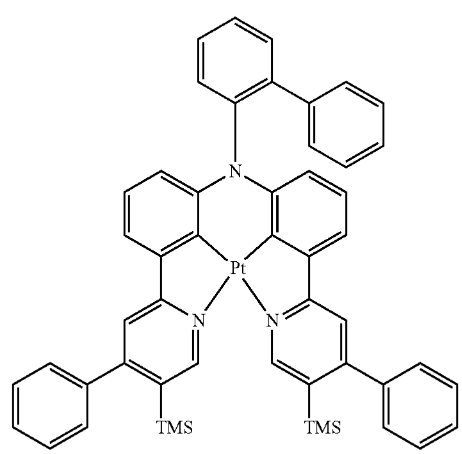

-continued
29
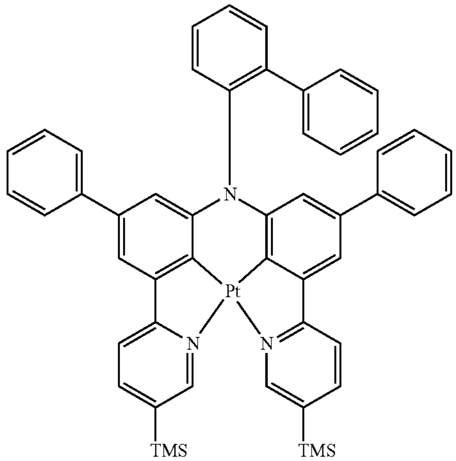
30
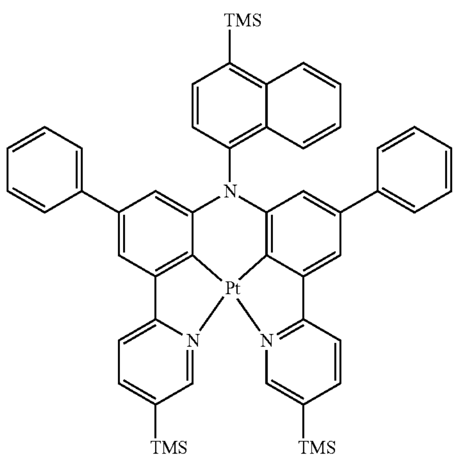
31
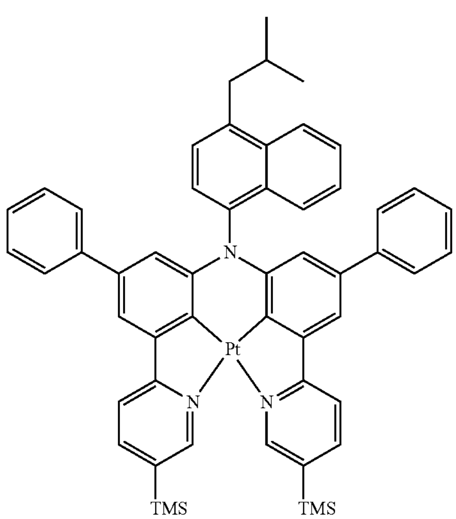
-continued
32
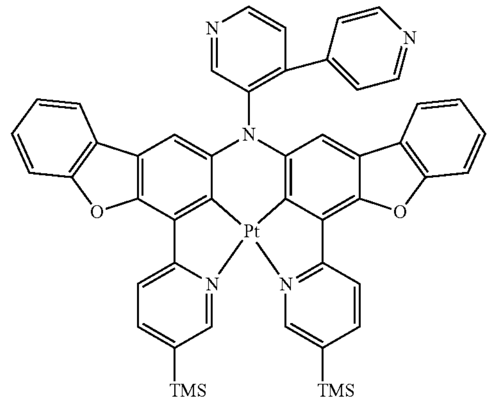
33
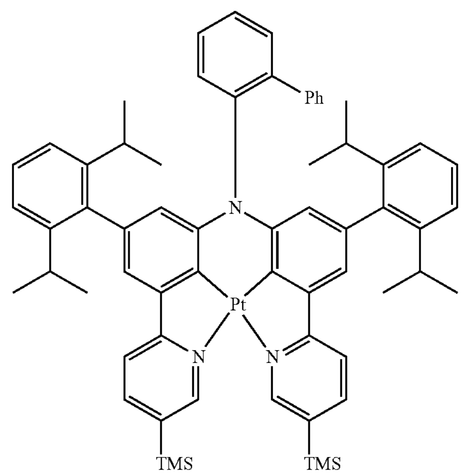
34
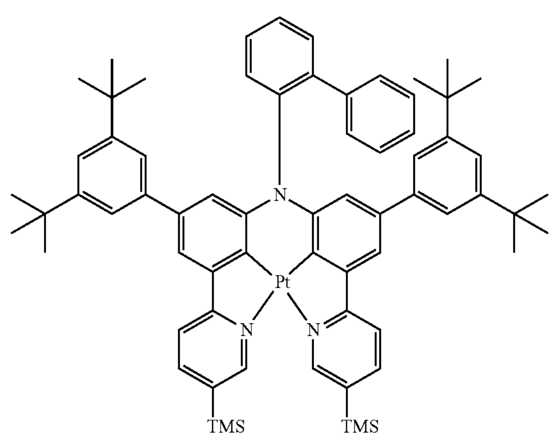

-continued

35

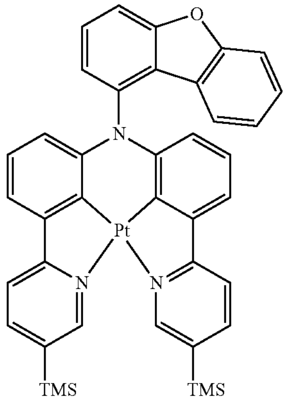

36

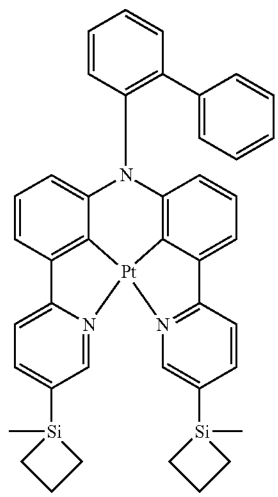

37

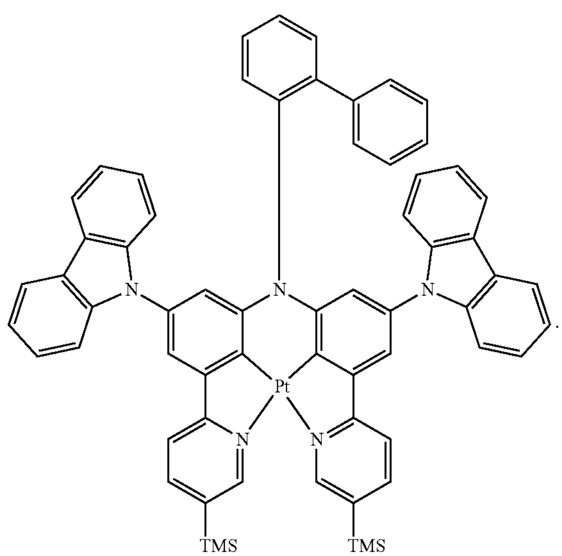

In Compounds 1 to 18 and 20 to 37,

TMS refers to a trimethylsilyl group.

In the organometallic compound represented by Formula 1, as illustrated in Formula 1', an N-containing ring may be necessarily substituted with a group represented by one of Formulae 2-1 to 2-4.

Formula 1′

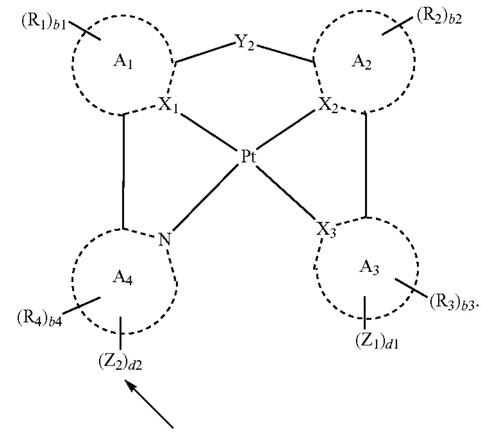

N-containing ring necessarily substituted with $Z_2$

When the N-containing ring is substituted with the group represented by one of Formulae 2-1 to 2-4, an empty d-orbital of Si or Ge can be filled with electrons. Accordingly, since the N-containing ring is substituted with the group represented by one of Formulae 2-1 to 2-4, when electrons and/or energy flow or are applied to the organometallic compound represented by Formula 1, the chemical, physical, and/or electric stability of the organometallic compound represented by Formula 1 may be improved. Thus, the lifespan of an organic light-emitting device including the organometallic compound represented by Formula 1 may be increased.

Due to the introduction of the group represented by one of Formulae 2-1 to 2-4 in the organometallic compound represented by Formula 1, steric hindrance may be increased, and the organometallic compound represented by Formula 1 may have a non-planar structure. Since the organometallic compound represented by Formula 1 has a non-planar structure, less aggregation may occur, and the efficiency of an organic light-emitting device including the organometallic compound represented by Formula 1 may be improved.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:

a first electrode;

a second electrode; and an organic layer that is disposed between the first electrode and the second electrode, wherein the organic layer includes an emission layer and at least one organometallic compound represented by Formula 1.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression that "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include only Compound 1 as the organometallic compound. In this regard, Compound 1 may be included only in the emission layer of the organic light-emitting device. In other embodiments, the organic layer may include, as the organometallic compound, Compound 1 and Compound 2. In those embodiments, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, the first electrode may be an anode, and the second electrode may be a cathode, and the organic layer may include:

i) a hole transport region disposed between the first electrode and the emission layer, wherein the hole transport region includes at least one selected from a hole injection layer, a hole transport layer, and an electron blocking layer, and ii) an electron transport region disposed between the emission layer and the second electrode, wherein the electron transport region includes at least one selected from a hole blocking layer, an electron transport layer, and an electron injection layer.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used here, and the substrate may be a glass substrate or a transparent plastic substrate, each having excellent mechanical strength, thermal stability, transparency, surface smoothness, ease of handling, and water-resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In some embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In some embodiments, the hole transport region may have a structure of hole injection layer/hole transport layer or hole injection layer/hole transport layer/electron blocking layer, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (Pani/PSS), a compound represented by Formula 201 below, and a compound represented by Formula 202 below:

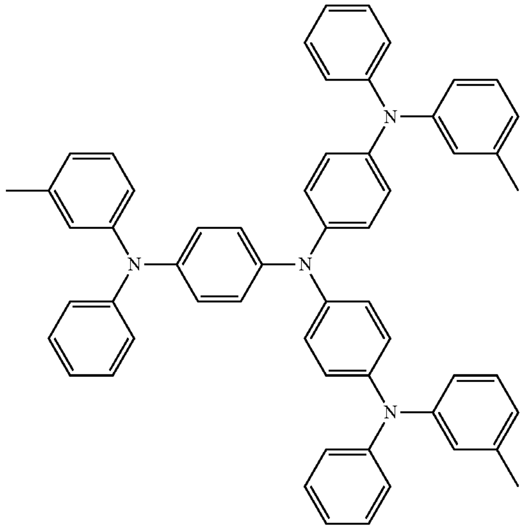
m-MTDATA
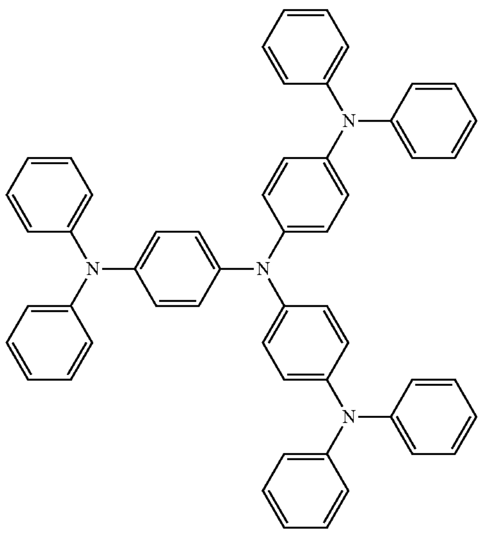
TDATA
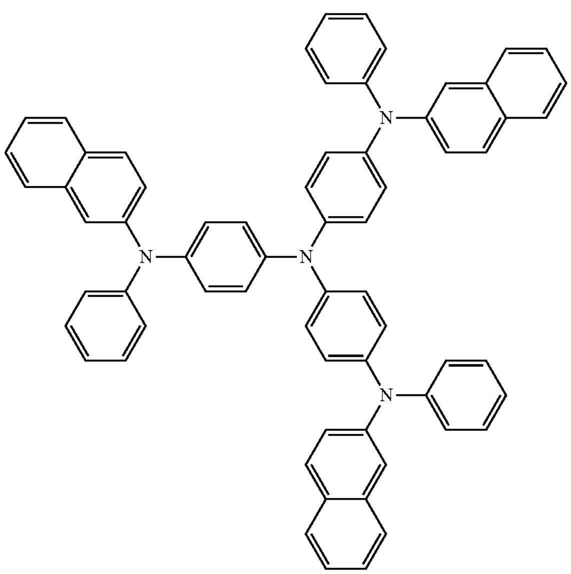
2-TNATA
-continued
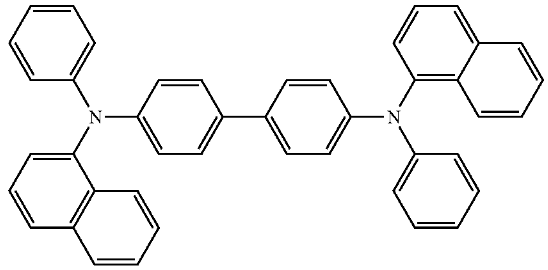
NPB
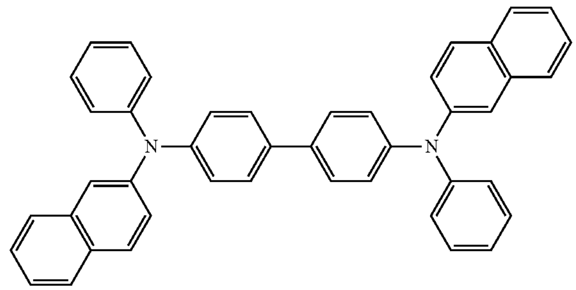
β-NPB
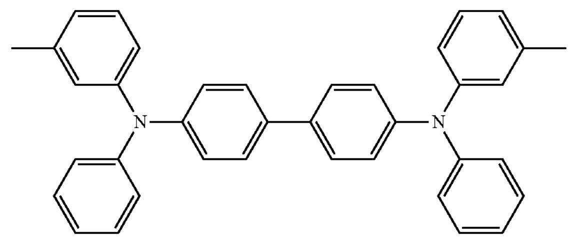
TPD
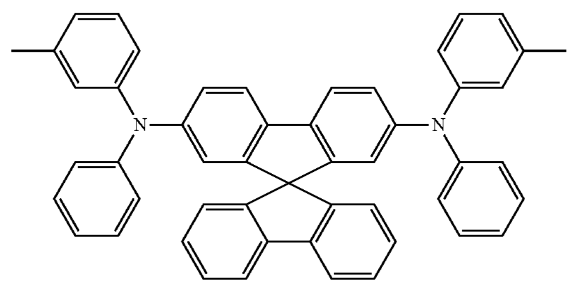
Spiro-TPD
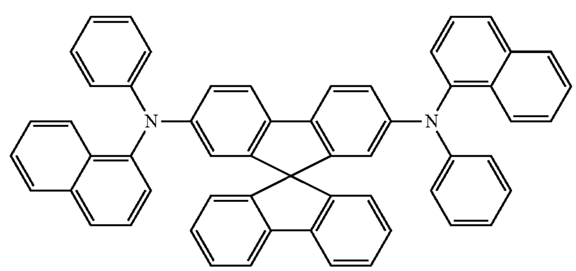
Spiro-NPB -continued

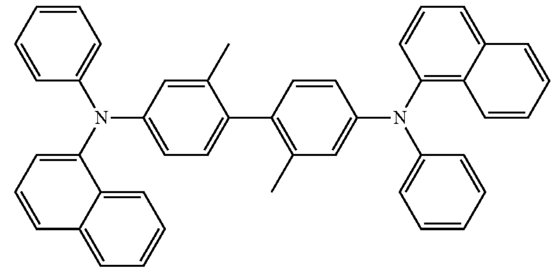

methylated NPB

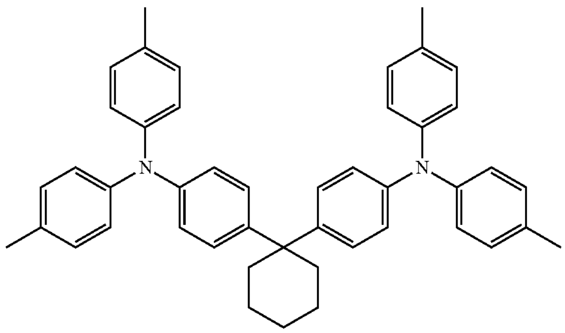

TAPC

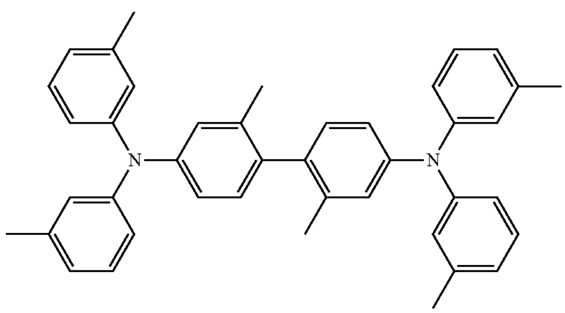

HMTPD

Formula 201

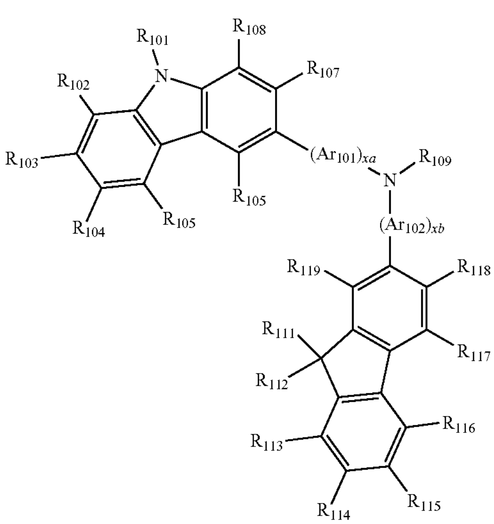

-continued

Formula 202

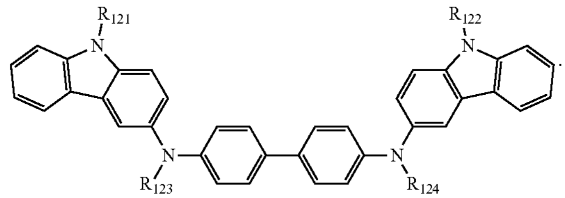

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

xa and xb in Formula 201 may each independently be an integer selected from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), and a $C_1$-$C_{10}$ alkoxy group (for example, a methoxy group, an ethoxy group, a propoxy group, butoxy group, a pentoxy group, etc.);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but they are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but the formula representing the compound is not limited thereto:

Formula 201A

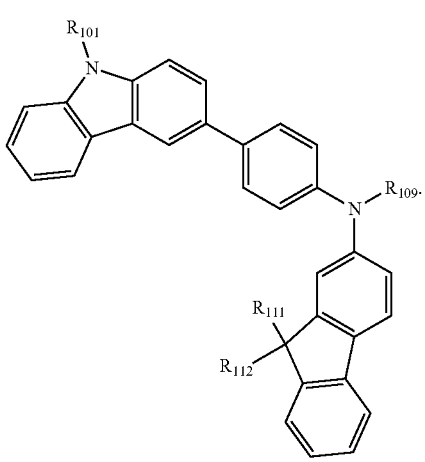

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

HT1

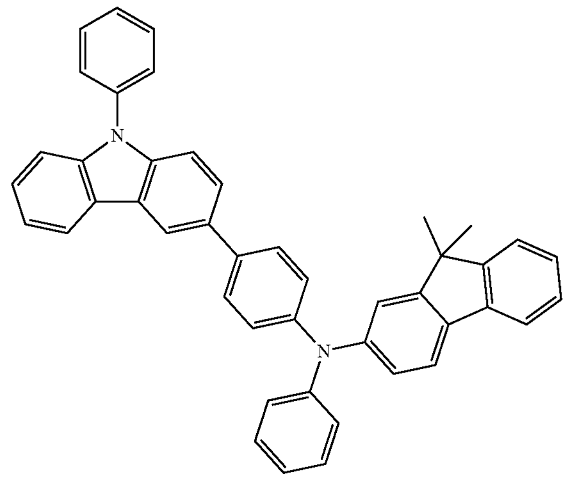

HT2

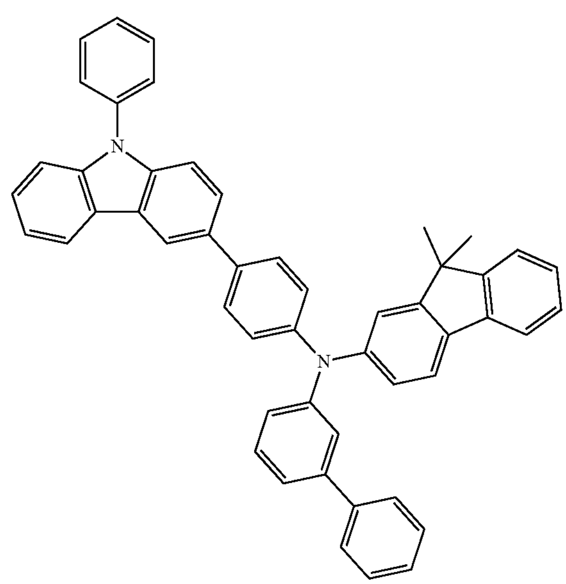

-continued
HT3
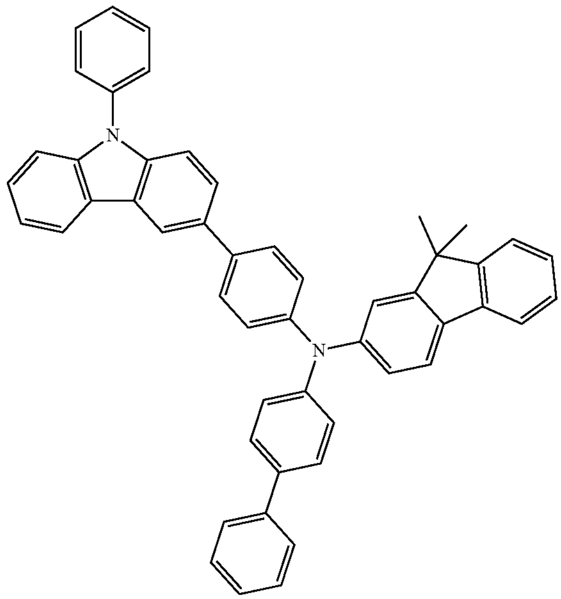
HT4
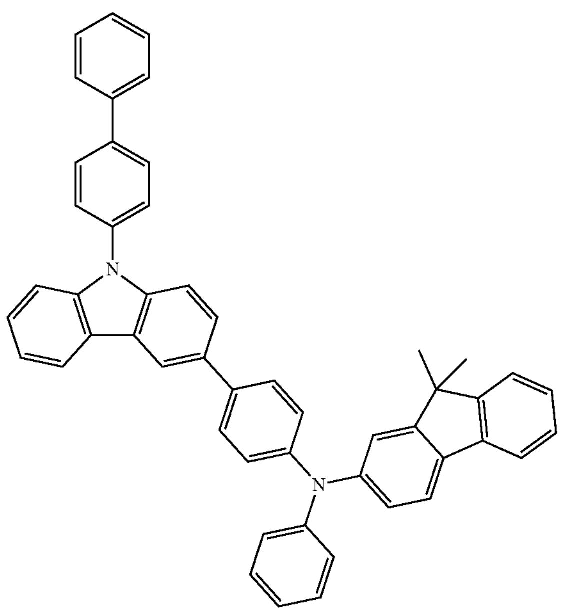
-continued
HT5
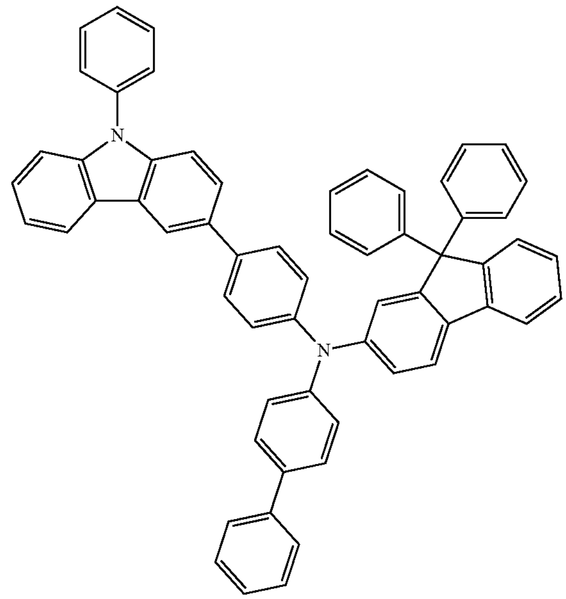
HT6
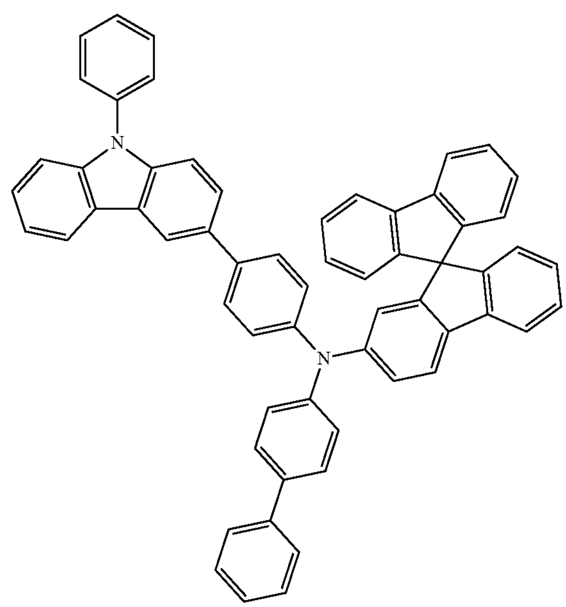

-continued
HT7
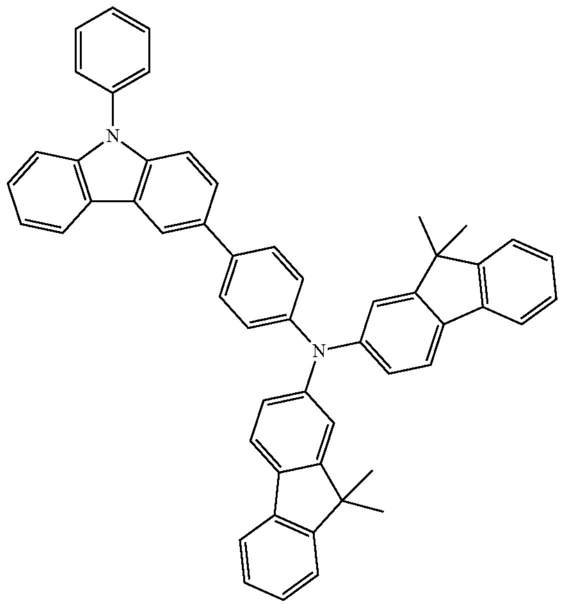
HT8
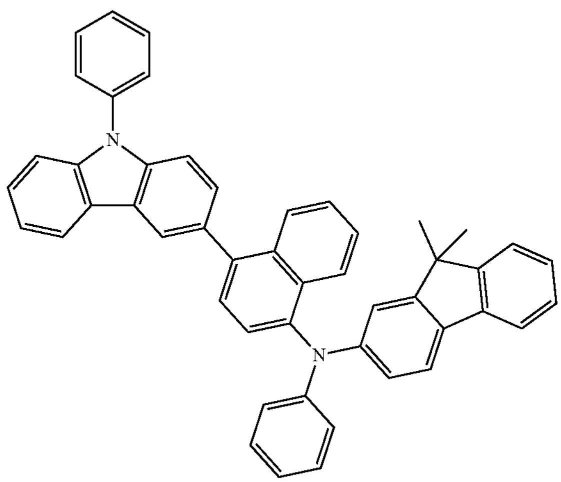
HT9
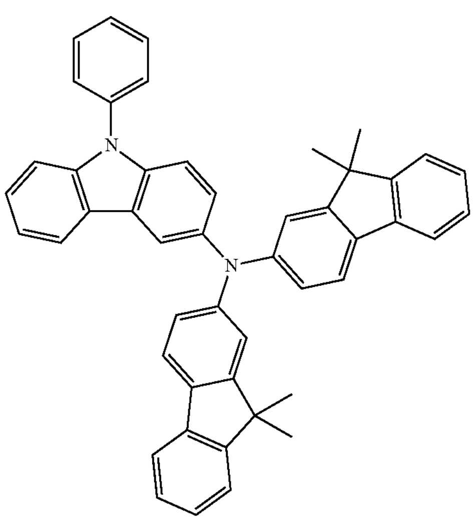
-continued
HT10
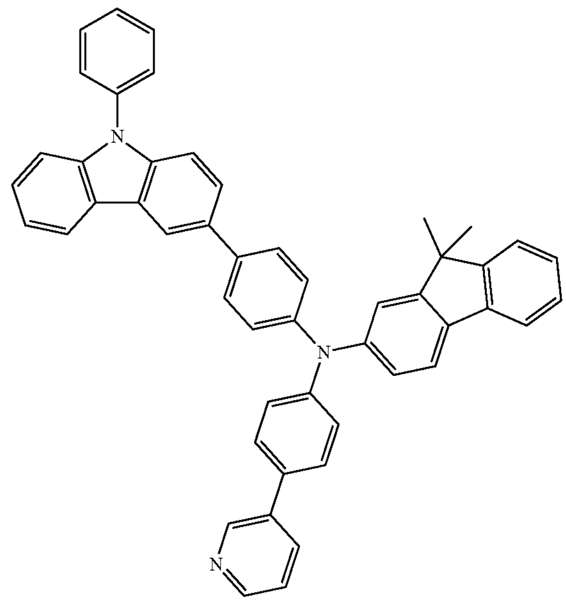
HT11
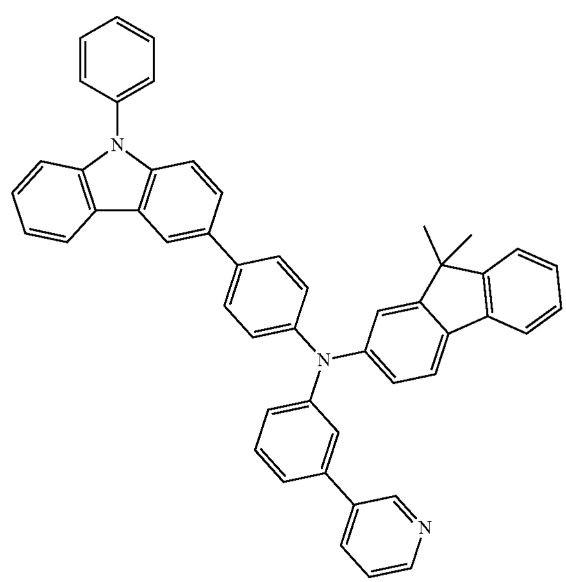

-continued
HT12
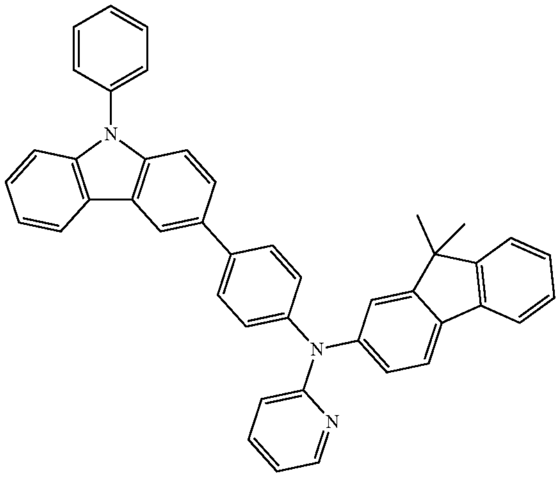
HT13
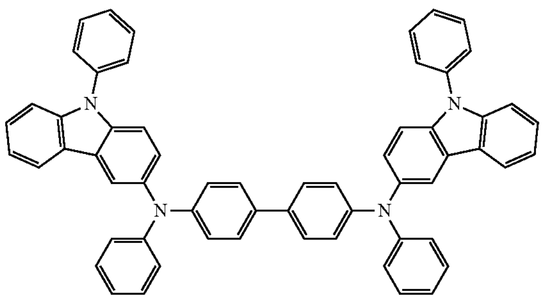
HT14
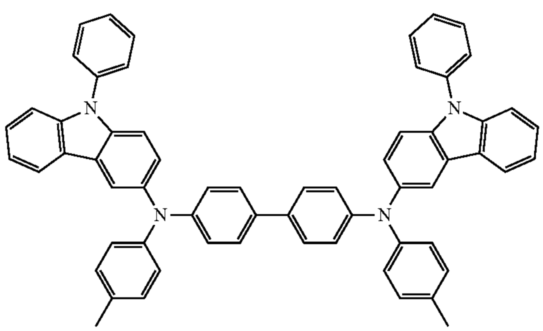
HT15
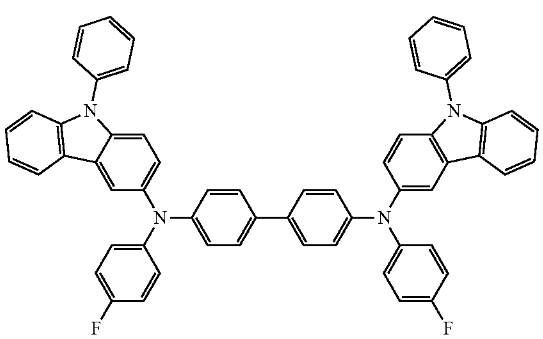
-continued
HT16
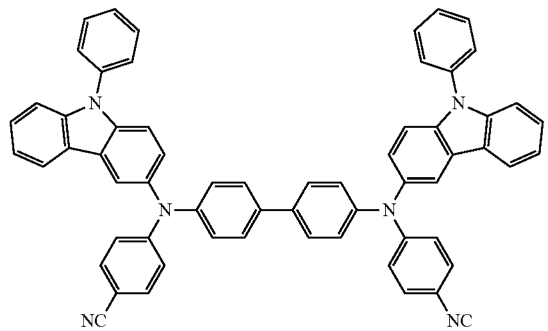
HT17
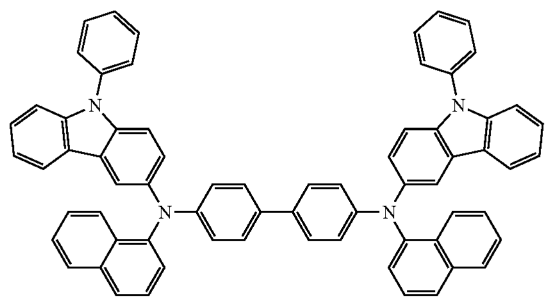
HT18
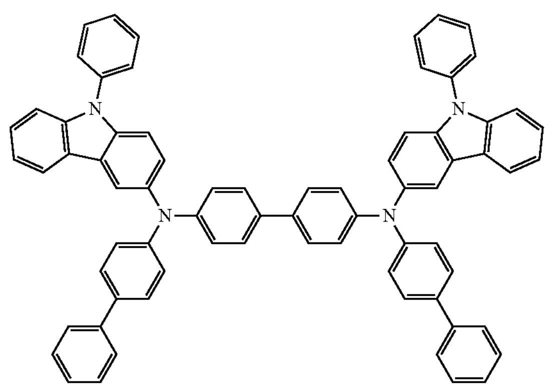
HT19
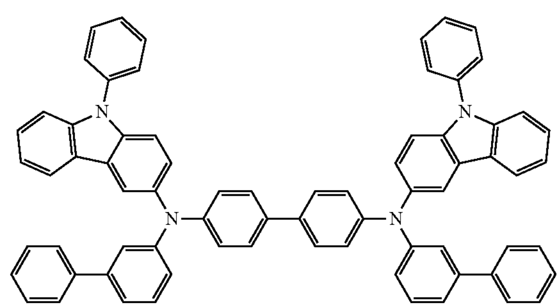

-continued

HT20

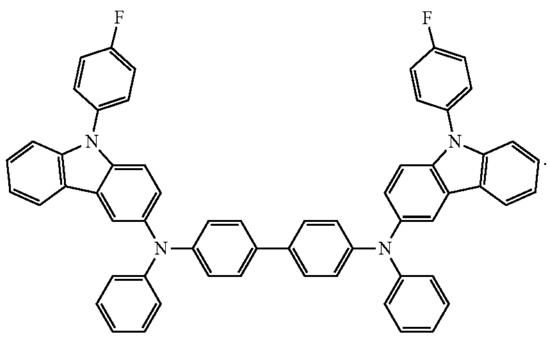

-continued

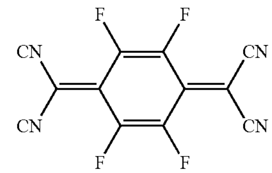

F4-TCNQ

A thickness of the hole transport region may be in a range of about 100 Å to about 10,000 Å, for example, about 100 Å to about 1,000 Å. When the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant include a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

Compound HT-D1

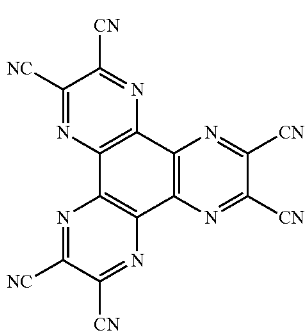

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary according to the material that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

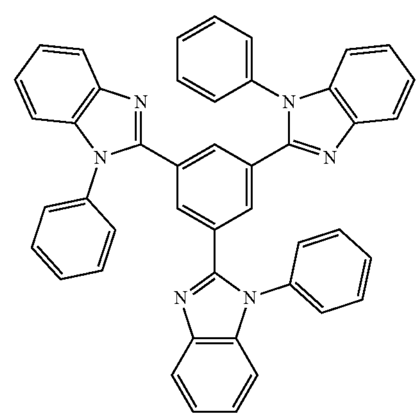

TPBi

-continued

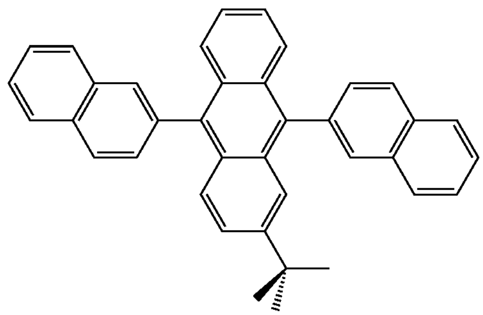

TBADN

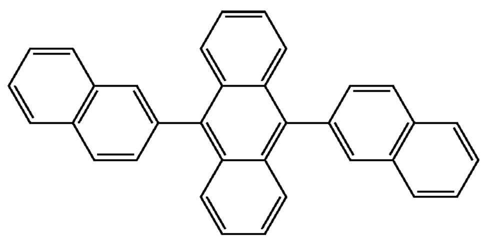

ADN

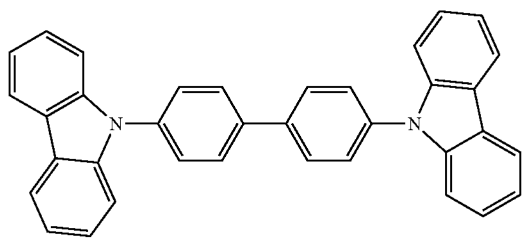

CBP

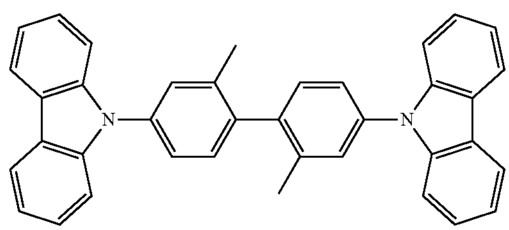

CDBP

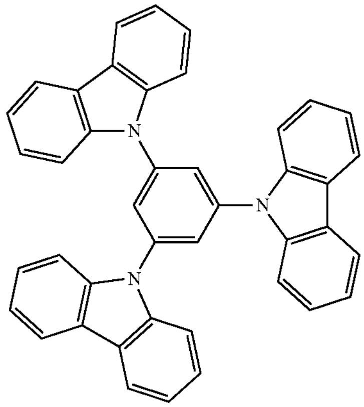

TCP

-continued

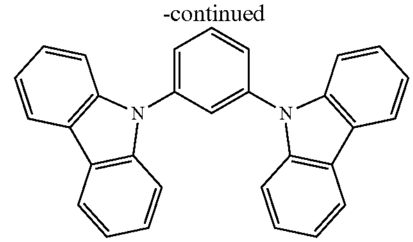

mCP

Compound H50

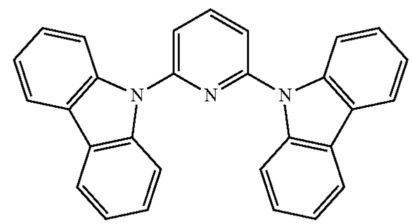

Compound H51

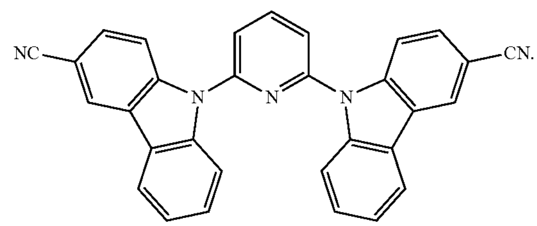

In some embodiments, the host may further include a compound represented by Formula 301 below.

Formula 301

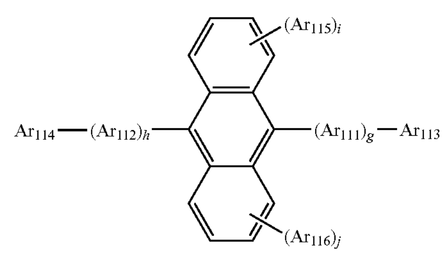

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer selected from 0 to 4, and may be, for example, 0, 1, or 2.

$Ar_{113}$ to $Ar_{116}$ in Formula 301 may each independently be selected from:

- a $C_1$-$C_{10}$ alkyl group, substituted with at least one selected from a phenyl group, a naphthyl group, and an anthracenyl group;
- a phenyl group, a naphthyl group, an anthracenyl group, a pyrenyl, a phenanthrenyl group, and a fluorenyl group;
- a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

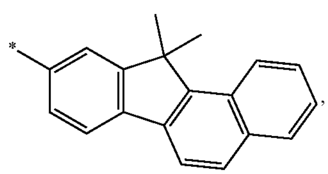 [SMILES: *c1ccc2c(c1)C(C)(C)c1c-2ccc2ccccc12]

but embodiments are not limited thereto.

In some embodiments, the host may include a compound represented by Formula 302:

Formula 302

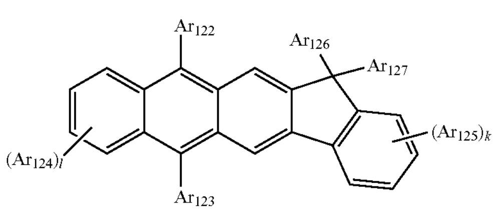

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer selected from 0 to 4. For example, k and l may each be 0, 1, or 2.

The compound represented by Formula 301 and the compound represented by Formula 302 may include Compounds H1 to H42 illustrated below, but are not limited thereto:

H1

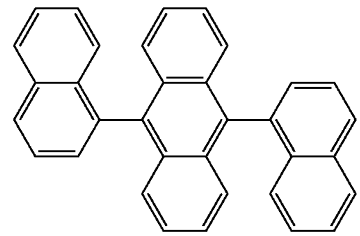

H2

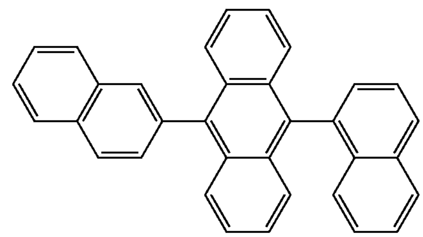

H3

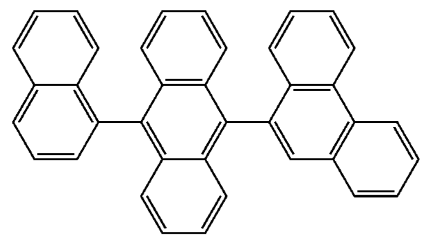

H4

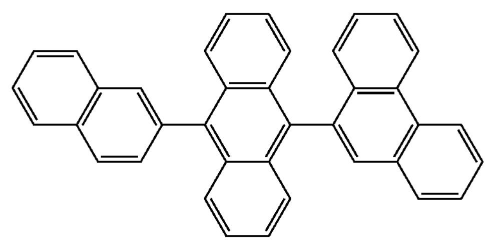

H5

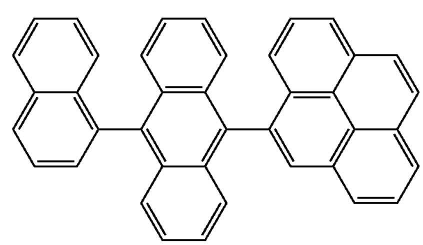

H6

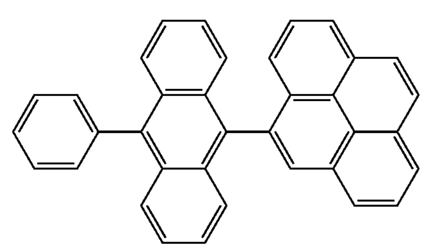

-continued
H7
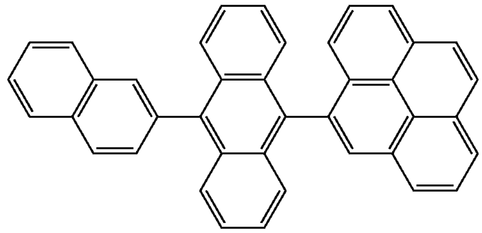
H8
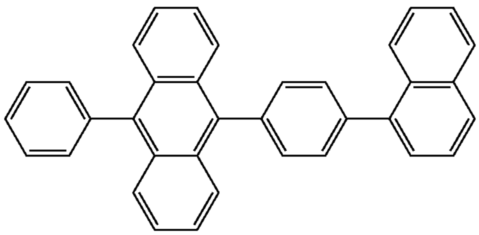
H9
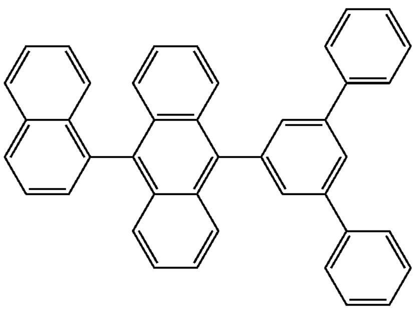
H10
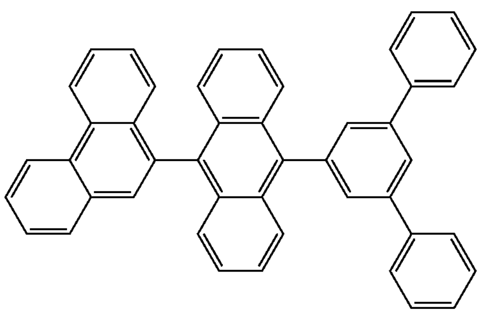
H11
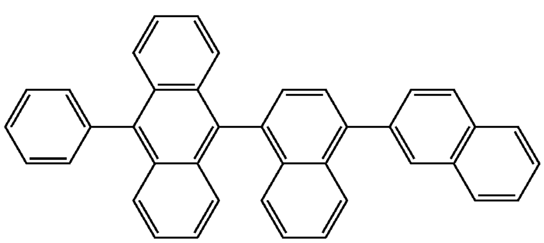
H12
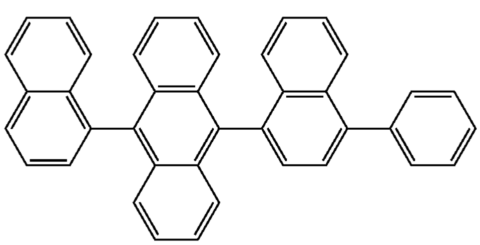
-continued
H13
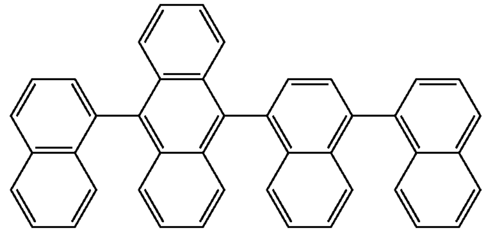
H14
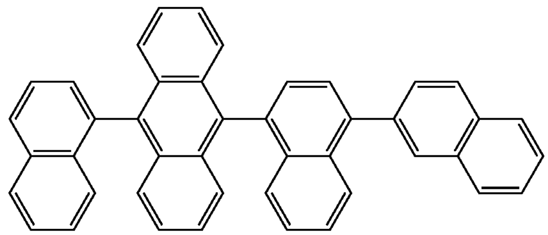
H15
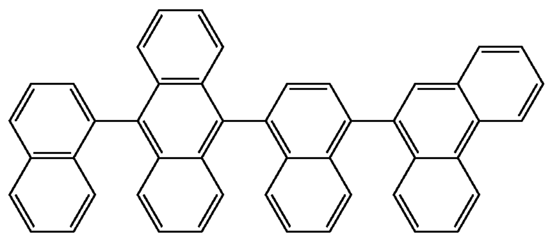
H167
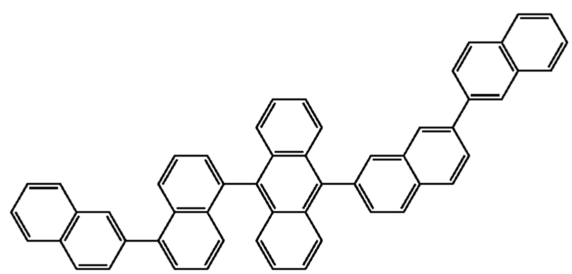
H17
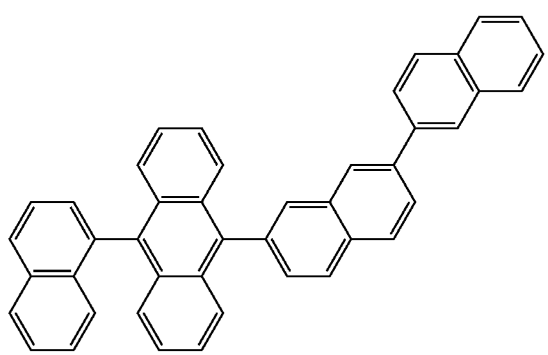

-continued
H18
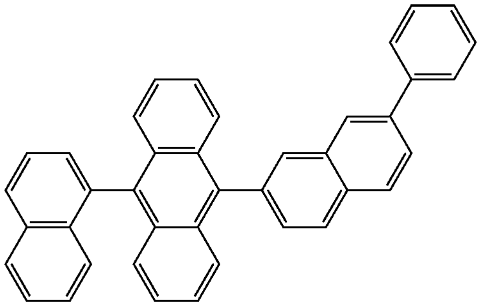
H19
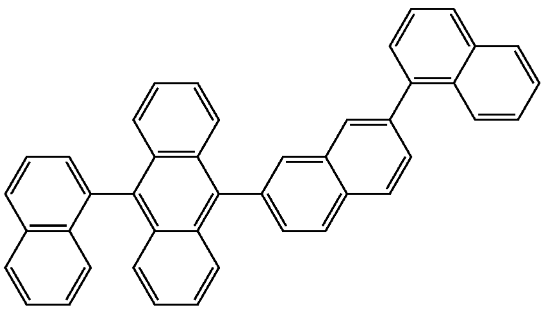
H20
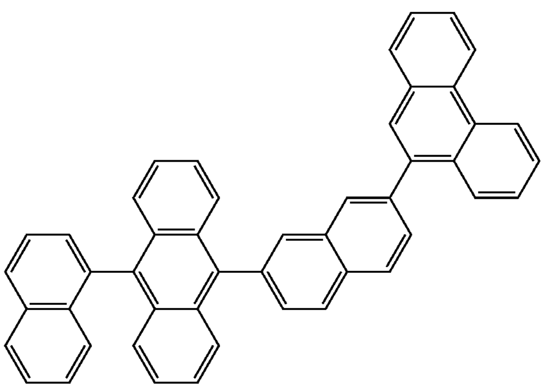
H21
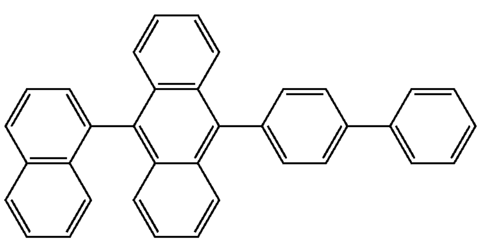
H22
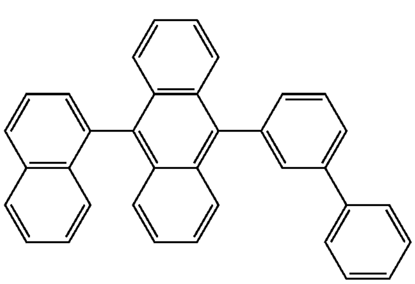
-continued
H23
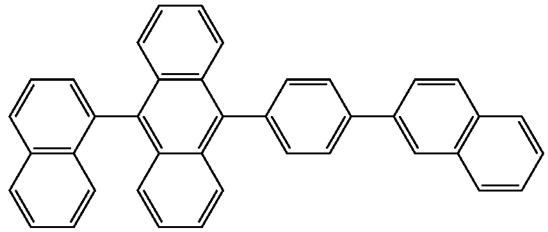
H24
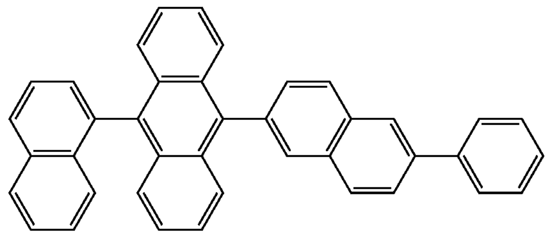
H25
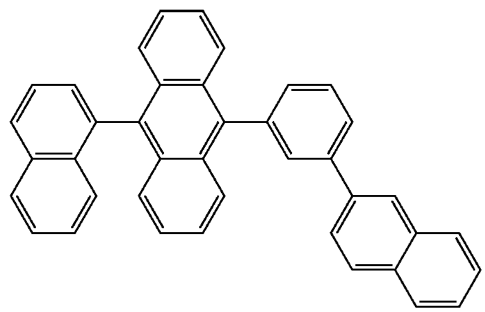
H26
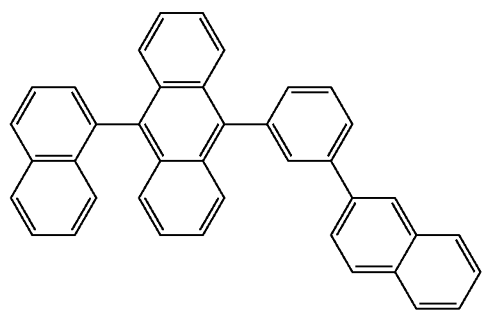
H27
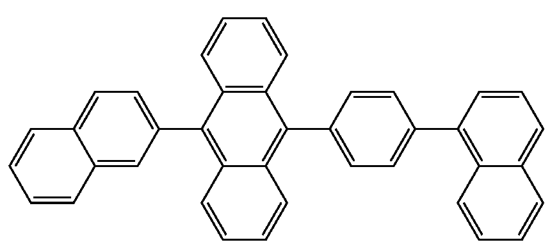

-continued
H28
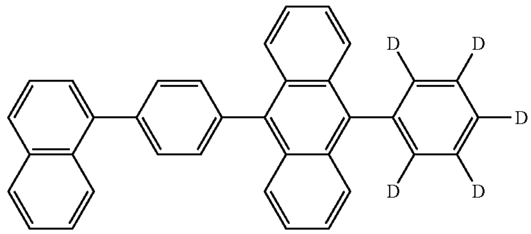
H29
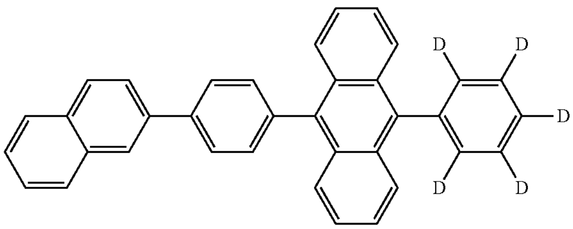
H30
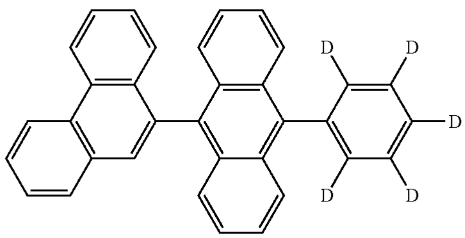
H31
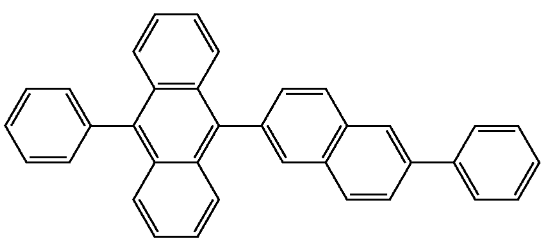
H32
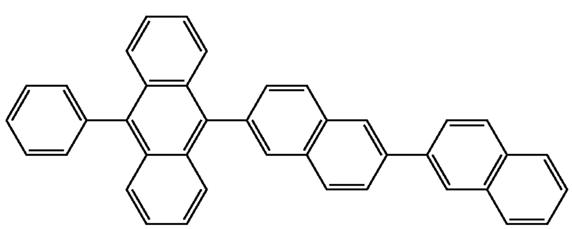
H33
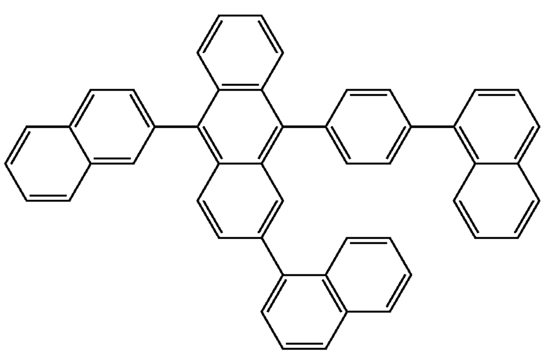
-continued
H34
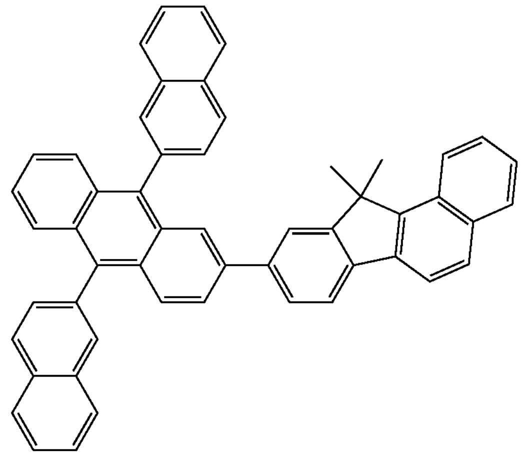
H35
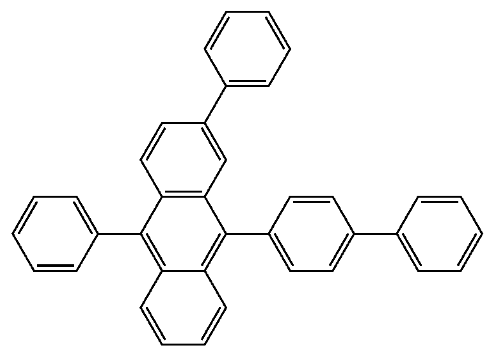
H36
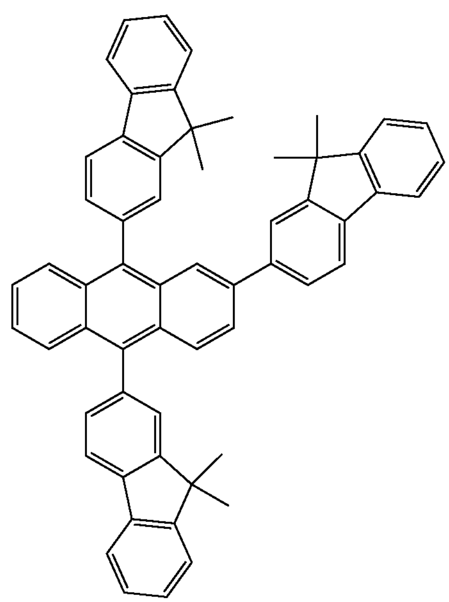

-continued

H37

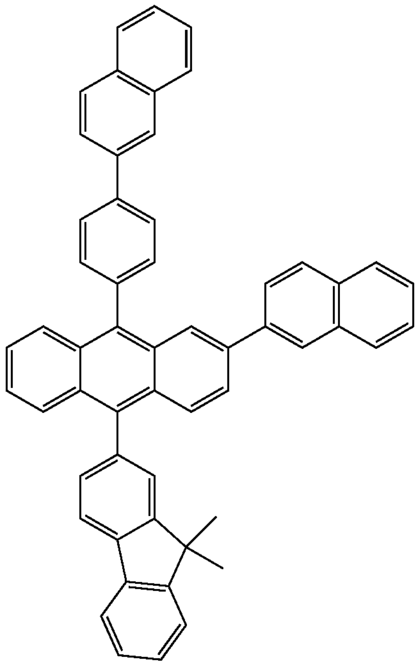

H38

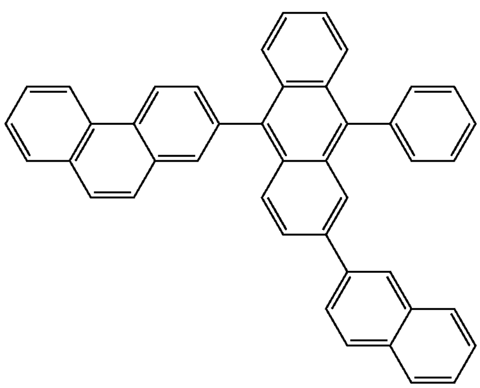

H39

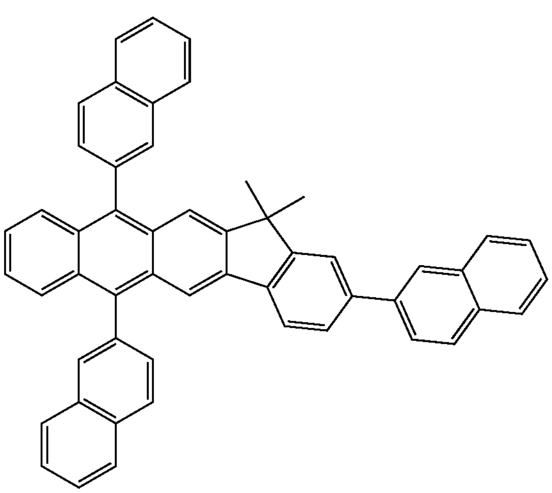

-continued

H40

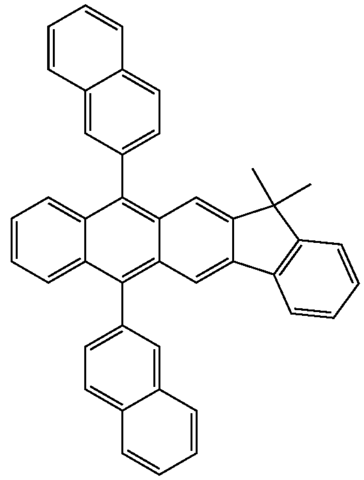

H41

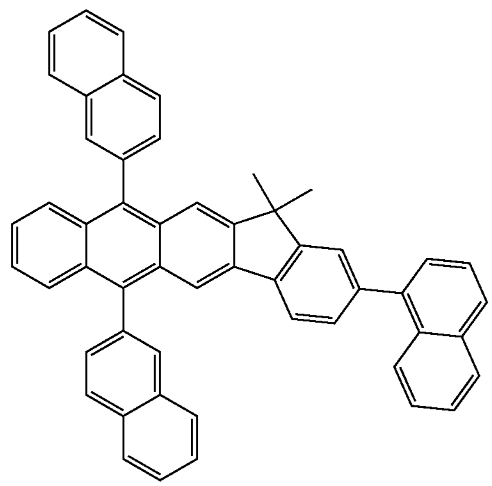

H42

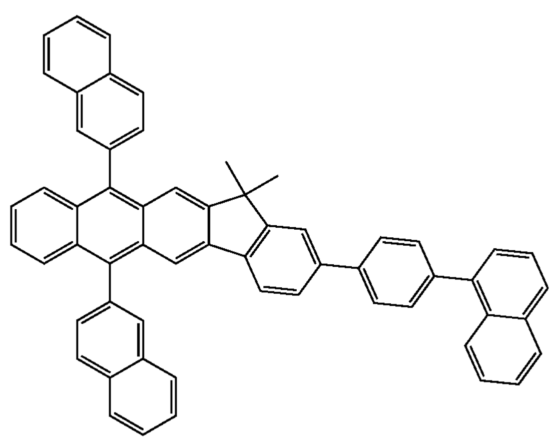

When the organic light-emitting device is a full color organic light-emitting device, the emission layer may be patterned into a red emission layer, a green emission layer, and a blue emission layer. In some embodiments, due to a stack structure including a red emission layer, a green emission layer, and/or a blue emission layer, the emission layer may emit white light.

When the emission layer includes a host and a dopant, an amount of the dopant may be in a range of about 0.01 to about 15 parts by weight based on 100 parts by weight of the host, but is not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but is not limited thereto:

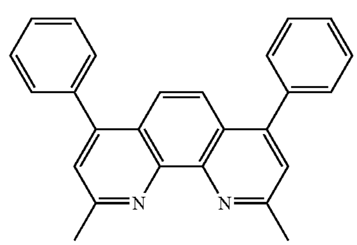

BCP

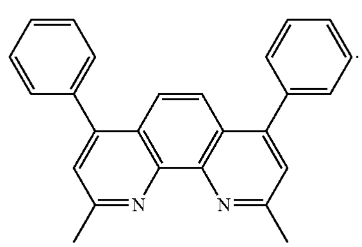

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ:

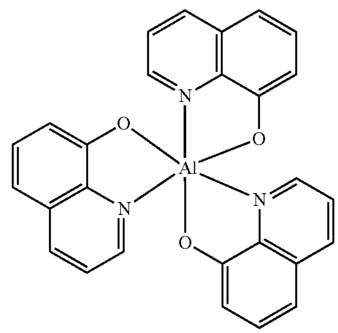

$Alq_3$

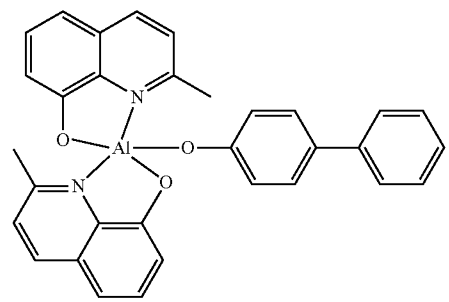

BAlq

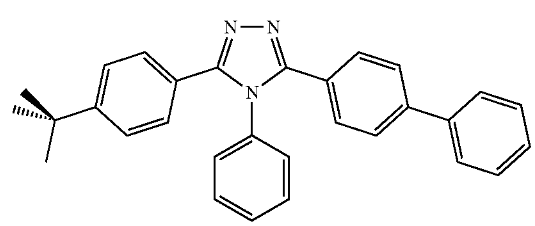

TAZ

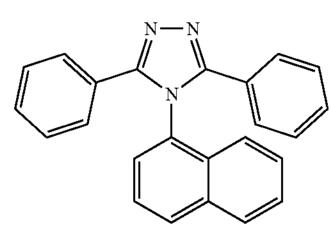

NTAZ

In some embodiments, the electron transport layer may include at least one of ET1 and ET2, but are not limited thereto:

ET1

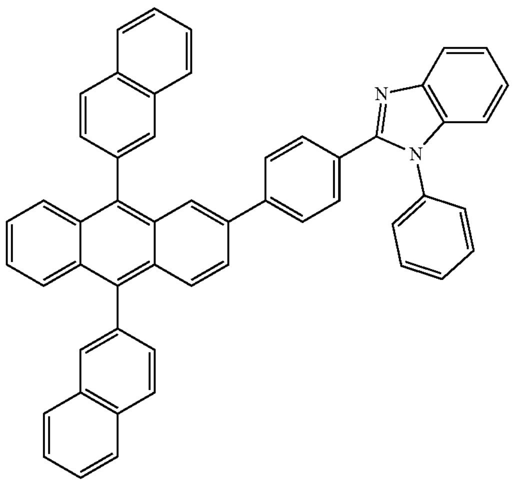

ET2

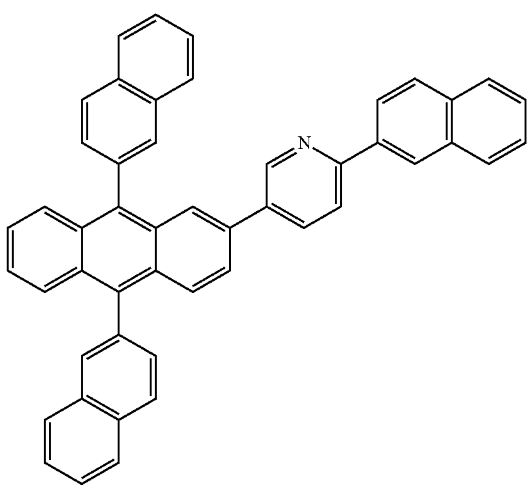

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

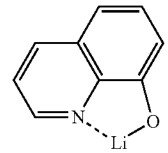

ET-D2

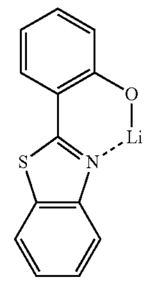

The electron transport region may include an electron injection layer (EIL) that promotes flow of electrons from the second electrode 19 thereinto.

The electron injection layer may include at least one selected from, LiF, NaCl, CsF, $Li_2O$, BaO, and LiQ.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In some embodiments, to manufacture a top emission type light-emitting device, a transmissive electrode formed using ITO or IZO may be used as the second electrode 19.

Hereinbefore, the organic light-emitting device has been described with reference to the FIGURE, but is not limited thereto.

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, P, and S as a ring-forming atom and 1 to 10 carbon atoms, and examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof, and which is not aromatic, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, and S as a ring-forming atom, 1 to 10 carbon atoms, and at least one carbon-carbon double bond in its ring. Non-limiting examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having an aromatic system that has at least one heteroatom selected from N, O, P, and S as a ring-forming atom, and 1 to 60 carbon atoms. A $C_1$-$C_{60}$ heteroarylene group as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates-$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_2$-$C_{60}$ heteroaryloxy group" as used herein indicates-$OA_{106}$ (wherein $A_{106}$ is the $C_2$-$C_{60}$ heteroaryl group), the term "$C_2$-$C_{60}$ heteroarylthio group" as used herein indicates —$SA_{107}$ (wherein $A_{107}$ is the $C_2$-$C_{60}$ heteroaryl group), and the term "$C_3$-$C_{60}$ heteroarylalkyl group" as used herein indicates -$A_{108}A_{109}$ (wherein $A_{109}$ is the $C_1$-$C_{59}$ heteroaryl group and $A_{108}$ is the $C_1$-$C_{59}$ alkylene group).

The term "monovalent non-aromatic condensed polycyclic group" as used herein refers to a monovalent group (for example, having 8 to 60 carbon atoms) that has two or more rings condensed to each other, only carbon atoms as a ring-forming atom, and which is non-aromatic in the entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) that has two or more rings condensed to each other, has a heteroatom selected from N, O, P, and S, other than carbon atoms, as a ring-forming atom, and which is non-aromatic in the entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

As used herein, at least one substituent selected from the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_7$-$C_{60}$ arylalkyl group, substituted $C_1$-$C_{60}$ heteroaryl group, substituted $C_1$-$C_{60}$ heteroaryloxy group, substituted $C_1$-$C_{60}$ heteroarylthio group, substituted $C_2$-$C_{60}$ heteroarylalkyl group, substituted monovalent non-aromatic condensed polycyclic group, and substituted monovalent non-aromatic condensed heteropolycyclic group may be selected from:

deuterium, —F, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group; and —$C(=O)(Q_{11})$, —$Si(Q_{11})(Q_{12})(Q_{13})$, and —$N(Q_{11})(Q_{12})$, wherein $Q_{11}$ to $Q_{13}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{60}$ alkyl" refers to a $C_1$-$C_{60}$ alkyl group substituted with $C_6$-$C_{60}$ aryl group, the total number of carbon atoms in the resulting aryl substituted alkyl group is $C_7$-$C_{120}$.

Hereinafter, a compound and an organic light-emitting device according to embodiments are described in detail with reference to Synthesis Example and Examples. However, the organic light-emitting device is not limited thereto. Referring to Synthesis Examples, the expression "'B' is used instead of 'A'" means that the amount of 'B' is identical to the amount of 'A' in terms of a molar equivalent.

EXAMPLES

Synthesis Example 1: Synthesis of Compound 3

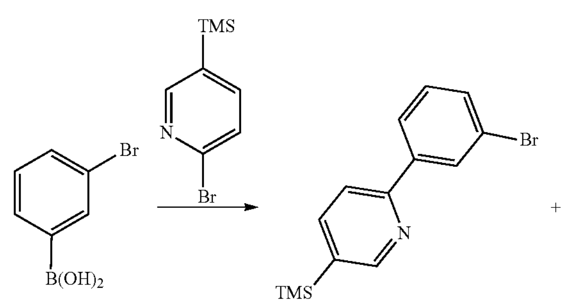

I-3-2

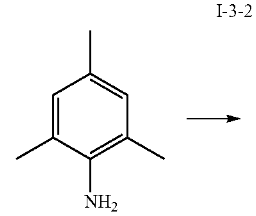

-continued

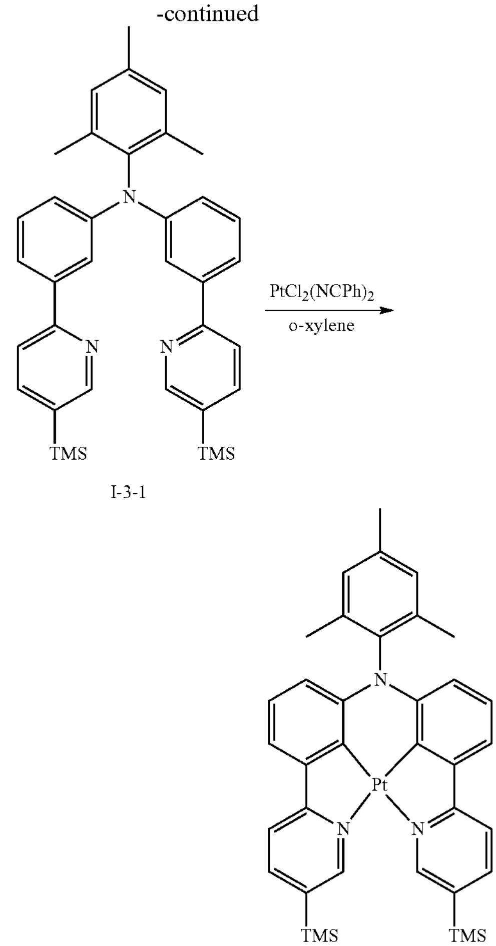

I-3-1

3

Synthesis of Intermediate I-3-2

15.0 grams (g) (74.7 millimoles, mmol) of 3-bromophenylboronic acid, 165 milliliters (ml) of toluene, and 60 ml of ethanol were added to a reactor. Then, 13.2 g (57.5 mmol) of 2-bromo-5-(trimethylsilyl) pyridine, 4.6 g (4.02 mmol) of $Pd(PPh_3)_4$, and 60 ml of 2.0 molar (M) sodium carbonate solution were added thereto, and the mixture was heated under reflux at a temperature of 110° C. for 18 hours. Once the reaction was completed, the mixture was condensed under reduced pressure, and then, dissolved in 400 ml of dichloromethane. The resultant was filtered through diatomite. An organic layer obtained therefrom was dried by using magnesium sulfate and distilled under reduced pressure, followed by purification by liquid chromatography, thereby completing the preparation of 14.2 g (46 mmol, yield of 80%) of Intermediate I-3-2.

LC-MS m/z=306 $(M+H)^+$

2) Synthesis of Intermediate I-3-1

8.5 g (27.6 mmol) of Intermediate I-3-2 and 250 ml of toluene were added to a reactor. 1.56 ml (11.1 mmol) of 2,4,6-trimethylaniline, 1.0 g (1.7 mmol) of $Pd(dba)_2$, and 1.3 g (3.3 mmol) of $P(t\text{-}Bu)_3$, and 3.2 g (33.1 mmol) of sodium butoxide were added thereto, and the mixture was heated under reflux at a temperature of 120° C. for 24 hours. Once the reaction was completed, the mixture was condensed under reduced pressure, and dissolved in 400 ml of dichloromethane. The resultant was filtered through diatomite. An organic layer obtained therefrom was distilled under reduced pressure by using magnesium sulfate, followed by purification by liquid chromatography, thereby completing the preparation of 6.4 g (11 mmol, yield of 99%) of Intermediate I-3-1.

LC-MS m/z=586 $(M+H)^+$

3) Synthesis of Compound 3

1.5 g (2.5 mmol) of Intermediate I-3-1, 100 ml of o-xylene, and 20 ml of benzonitrile were added to a reactor at a temperature of 25° C. Then, 1.2 g (2.5 mmol) of $PtCl_2(NCPh)_2$ was added thereto, and the resultant was heated under reflux for 26 hours. Once the reaction was completed, the mixture was condensed under reduced pressure, and purified by liquid chromatography, thereby completing the preparation of 0.7 g (0.8 mmol, yield of 30%) of Compound 3. The obtained compound was confirmed by LCMS and $^1H$ NMR.

LC-MS m/z=779 $(M+H)^+$ $^1H$ NMR (300 MHz, $CDCl_3$) δ=8.96 (s, 2H), 7.94-7.92 (m, 4H), 7.38 (d, 2H), 7.10 (s, 2H), 7.03 (t, 2H), 6.28-6.26 (m, 2H), 2.43 (s, 3H), 1.89 (s, 6H), 0.41 (s, 18H).

Synthesis Example 2: Synthesis of Compound 1

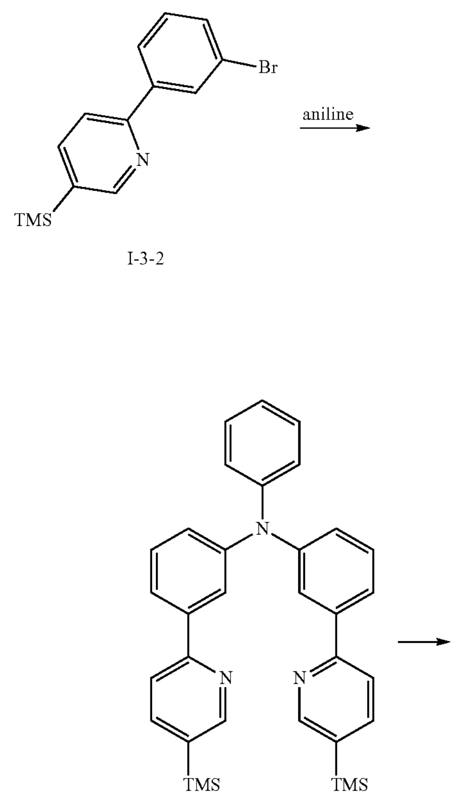

I-3-2

I-1-1

-continued

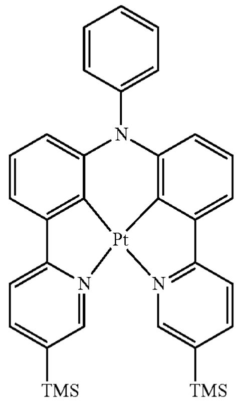

1

1) Synthesis of Intermediate I-1-1

Intermediate I-1-1 (yield of 76%) was synthesized in the same manner as Intermediate I-3-1 in Synthesis Example 1, except that aniline was used instead of 2,4,6-trimethylaniline. The obtained compound was confirmed by LC-MS.

LC-MS m/z=544 $(M+H)^+$

2) Synthesis of Compound 1

Compound 1 (yield of 32%) was synthesized in the same manner as Compound 3 in Synthesis Example 1, except that Intermediate I-1-1 was used instead of Intermediate I-3-1. The obtained compound was confirmed by LCMS and $^1H$ NMR.

LC-MS m/z=737 $(M+H)^+$ $^1H$ NMR (300 MHz, $CDCl_3$) δ=8.92 (s, 2H), 7.90-7.86 (m, 4H), 7.42 (d, 2H), 7.31-7.22 (m, 4H), 7.18-7.09 (m, 3H), 6.25-6.23 (m, 2H), 0.44 (s, 18H).

Synthesis Example 3: Synthesis of Compound 2

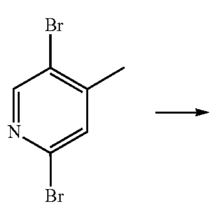

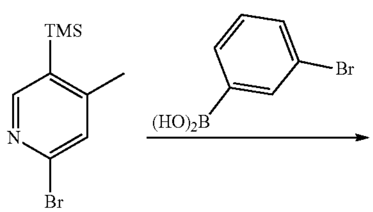

I-2-3

-continued

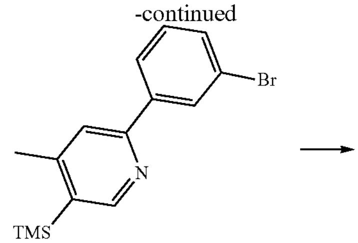

I-2-2

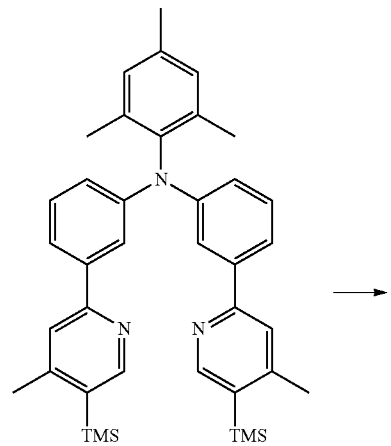

I-2-1

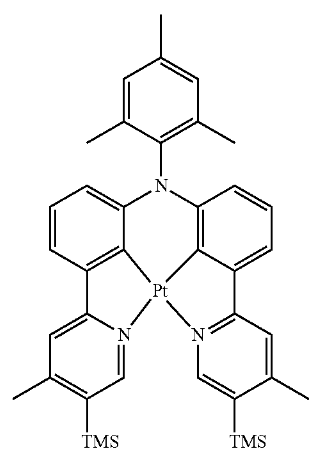

2

1) Synthesis of Intermediate I-2-3

10.6 g (42.2 mmol) of 2,5-dibromo-3-methylpyridine was dissolved in 200 ml of diethyl ether. Then, at a temperature of −78° C., 27.0 ml of n-BuLi (1.6 M solution in hexane) was slowly added thereto and the resultant was stirred for about 2 hours. Thereafter, 6.5 ml (50.6 mmol) of chlorotrimethylsilane was slowly added thereto, and stirred at a temperature of −78° C. for 1 hour, and at room temperature for 16 hours. Once the reaction was completed, an extraction process was performed thereon by using 200 ml of ethyl acetate and 300 ml of distilled water, and an organic layer was dried by using magnesium sulfate and distilled under reduced pressure. The resultant obtained therefrom was purified by column chromatography, thereby completing the preparation of about 8.7 g (35.9 mmol, yield of 85%) of Intermediate I-2-3. The obtained compound was confirmed by LC-MS.

LC-MS m/z=244 $(M+H)^+$

2) Synthesis of Intermediate I-2-2

Intermediate I-2-2 (yield of 80%) was synthesized in the same manner as Intermediate I-3-2 in Synthesis Example 1, except that Intermediate I-2-3 was used instead of 2-bromo-5-(trimethylsilyl)pyridine. The obtained compound was confirmed by LC-MS.

LC-MS m/z=320 $(M+H)^+$

3) Synthesis of Intermediate I-2-1

Intermediate I-2-1 (yield of 70%) was synthesized in the same manner as Intermediate I-3-1 in Synthesis Example 1, except that Intermediate I-2-2 was used instead of Intermediate I-3-2. The obtained compound was confirmed by LC-MS.

LC-MS m/z=320 $(M+H)^+$

4) Synthesis of Compound 2

Compound 2 (yield of 45%) was synthesized in the same manner as Compound 3 in Synthesis Example 1, except that Intermediate I-2-1 was used instead of Intermediate I-3-1. The obtained compound was confirmed by LCMS and $^1$H NMR.

LC-MS m/z=807 $(M+H)^+$ $^1$H NMR (300 MHz, $CDCl_3$) δ=8.88 (s, 2H), 7.86-7.82 (m, 4H), 7.47-7.41 (m, 2H), 7.16-7.11 (m, 2H), 6.78 (br s, 2H), 2.36 (s, 6H), 2.22 (s, 3H), 2.09 (s, 6H).

Synthesis Example 4: Synthesis of Compound 4

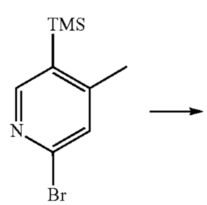

I-2-3

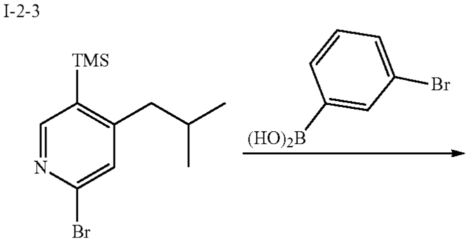

I-4-3

-continued

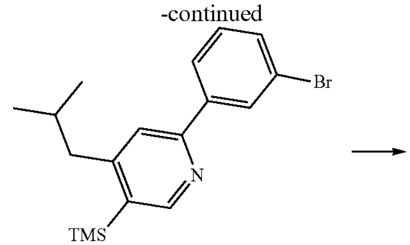

I-4-2

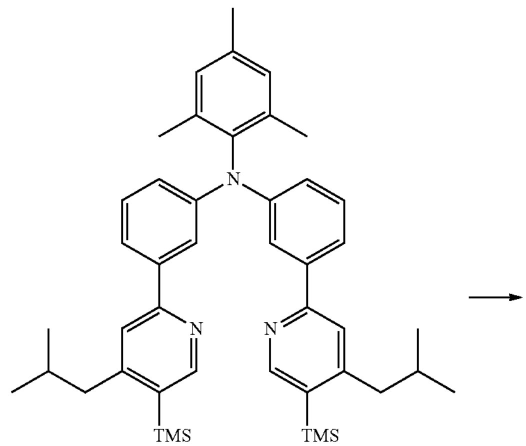

I-4-1

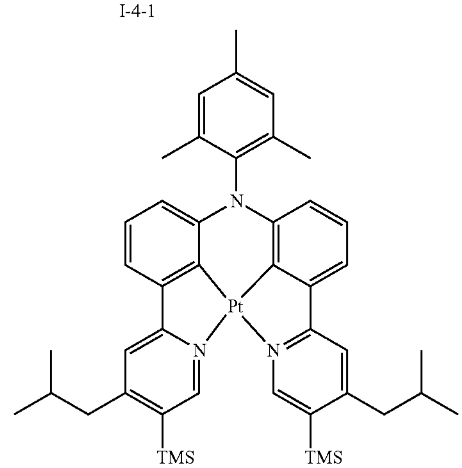

4

1) Synthesis of Intermediate I-4-3

5.0 g (20.5 mmol) of Intermediate I-2-3 was dissolved in 300 ml of tetrahydrofuran. Then, at a temperature of −78° C., 18.0 ml of lithium diisopropylamide (LDA) (2.0 M solution in THF) was slowly added thereto and stirred for about 1 hour. Thereafter, the resultant was stirred at room temperature for about 2 hours, and then, cooled to a temperature of −78° C. 2-bromopropane 3.8 ml (41.0 mmol) was slowly added thereto, and stirred at a temperature of −78° C. for 1 hour, and at room temperature for about 18 hours. Once the reaction was completed, an extraction process was performed thereon by using 200 ml of ethyl acetate and 300 ml of distilled water, and an organic layer was dried by using magnesium sulfate and distilled under reduced pressure. The resultant obtained therefrom was purified by column chromatography to obtain about 2.9 g (10.4 mmol, yield of 50%) of Intermediate I-4-3. The obtained compound was confirmed by LC-MS.

LC-MS m/z=286 $(M+H)^+$

2) Synthesis of Intermediate I-4-2

Intermediate I-4-2 (yield of 65%) was synthesized in the same manner as Intermediate I-3-2 in Synthesis Example 1, except that Intermediate I-4-3 was used instead of 2-bromo-5-(trimethylsilyl)pyridine. The obtained compound was confirmed by LC-MS.

LC-MS m/z=362 $(M+H)^+$

3) Synthesis of Intermediate I-4-1

Intermediate I-4-1 (yield of 67%) was synthesized in the same manner as Intermediate I-3-1 in Synthesis Example 1, except that Intermediate I-4-2 was used instead of Intermediate I-3-2. The obtained compound was confirmed by LC-MS.

LC-MS m/z=698 $(M+H)^+$

4) Synthesis of Compound 4

Compound 4 (yield of 28%) was synthesized in the same manner as Compound 3 in Synthesis Example 1, except that Intermediate I-4-1 was used instead of Intermediate I-3-1. The obtained compound was confirmed by LCMS and $^1H$ NMR.

LC-MS m/z=891 $(M+H)^+$ $^1H$ NMR (300 MHz, $CDCl_3$) δ=8.91 (s, 2H), 7.88-7.84 (m, 4H), 7.50-7.45 (m, 2H), 7.27-7.22 (m, 2H), 6.74 (br s, 2H), 3.15-3.11 (m, 4H), 2.28 (s, 3H), 2.11 (s, 6H), 1.88-1.85 (m, 2H), 0.91 (d, 12H).

Synthesis Example 5: Synthesis of Compound 5

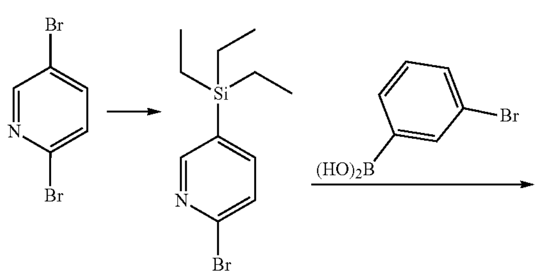

I-5-3

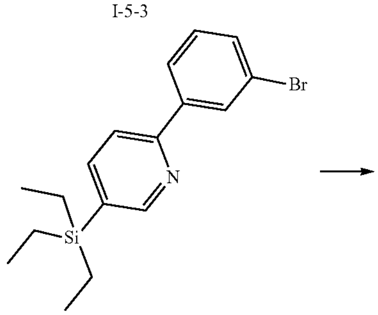

I-5-2

-continued

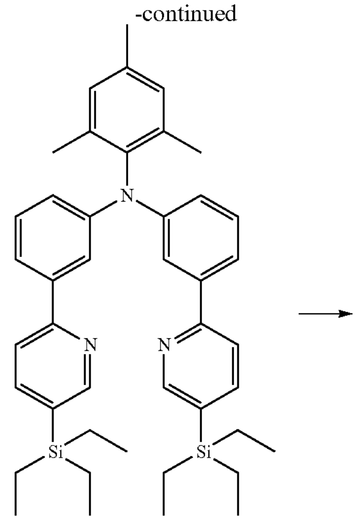

I-5-1

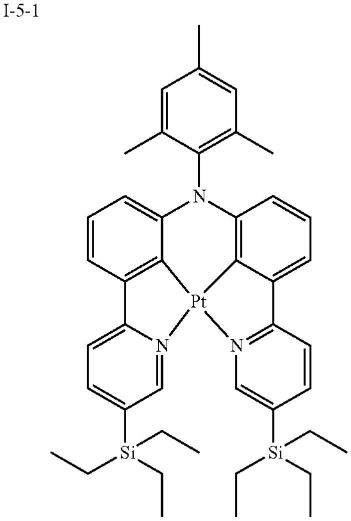

5

1) Synthesis of Intermediate I-5-3

Intermediate I-5-3 (yield of 60%) was synthesized in the same manner as Intermediate I-2-3 in Synthesis Example 3, except that chlorotriethylsilane was used instead of chlorotrimethylsilane and 2,5-dibromopyridine was used instead of 2,5-dibromo-3-methylpyridine. The obtained compound was confirmed by LC-MS.

LC-MS m/z=272 $(M+H)^+$

2) Synthesis of Intermediate I-5-2

Intermediate I-5-2 (yield of 80%) was synthesized in the same manner as Intermediate I-2-2 in Synthesis Example 3, except that Intermediate I-5-3 was used instead of Intermediate I-2-3. The obtained compound was confirmed by LC-MS.

LC-MS m/z=348 $(M+H)^+$

3) Synthesis of Intermediate I-5-1

Intermediate I-5-1 (yield of 57%) was synthesized in the same manner as Intermediate I-2-1 in Synthesis Example 3, except that Intermediate I-5-2 was used instead of Intermediate I-2-2. The obtained compound was confirmed by LC-MS.

LC-MS m/z=628 (M+H)+

4) Synthesis of Compound 5

Compound 5 (yield of 35%) was synthesized in the same manner as Compound 3 in Synthesis Example 1, except that Intermediate I-5-1 was used instead of Intermediate I-3-1. The obtained compound was confirmed by LCMS and $^{1}$H NMR.

LC-MS m/z=821 (M+H)+

$^{1}$H NMR (300 MHz, $CDCl_3$) 8.98 (s, 2H), 7.98-7.93 (m, 4H), 7.36 (d, 2H), 7.12 (s, 2H), 7.08-7.04 (m, 2H), 6.25-6.23 (m, 2H), 2.33 (s, 3H), 1.93 (s, 6H), 1.01-0.94 (m, 18H), 0.76 (br s, 12H).

Synthesis Example 6: Synthesis of Compound 6

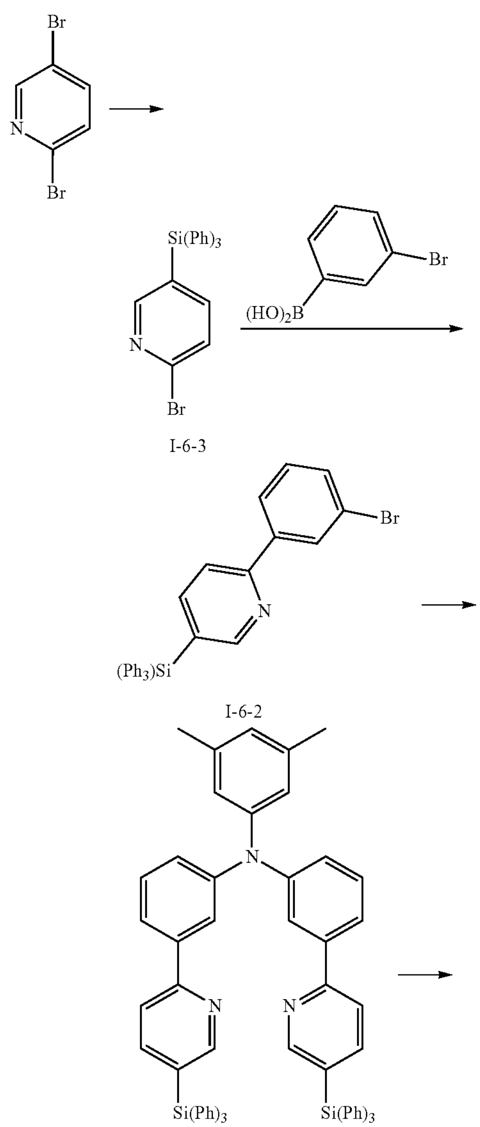

I-6-1

-continued

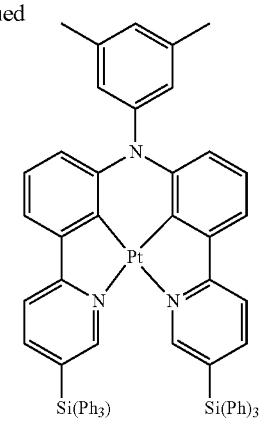

6

1) Synthesis of Intermediate I-6-3

Intermediate I-6-3 (yield of 75%) was synthesized in the same manner as Intermediate I-5-3 in Synthesis Example 5, except that chlorotriphenylsilane was used instead of chlorotriethylsilane. The obtained compound was confirmed by LC-MS.

LC-MS m/z=416 (M+H)+

2) Synthesis of Intermediate I-6-2

Intermediate I-6-2 (yield of 73%) was synthesized in the same manner as Intermediate I-5-2 in Synthesis Example 5, except that Intermediate I-6-3 was used instead of Intermediate I-5-3. The obtained compound was confirmed by LC-MS.

LC-MS m/z=492 (M+H)+

3) Synthesis of Intermediate I-6-1

Intermediate I-6-1 (yield of 60%) was synthesized in the same manner as Intermediate I-5-1 in Synthesis Example 5, except that Intermediate I-6-2 was used instead of Intermediate I-5-2, and 2,5-dimethylaniline was used instead of 2,4,6-trimethylaniline. The obtained compound was confirmed by LC-MS.

LC-MS m/z=944 (M+H)+

4) Synthesis of Compound 6

Compound 6 (yield of 30%) was synthesized in the same manner as Compound 3 in Synthesis Example 1, except that Intermediate I-6-1 was used instead of Intermediate I-3-1. The obtained compound was confirmed by LCMS and $^{1}$H NMR.

LC-MS m/z=1137 (M+H)+

$^{1}$H NMR (300 MHz, $CDCl_3$) 8.85 (s, 2H), 7.95-7.91 (m, 2H), 7.88-7.73 (m, 4H), 7.58-7.22 (m, 32H), 7.14 (s, 2H), 7.04 (s, 1H), 2.31 (s, 6H).

Synthesis Example 7: Synthesis of Compound 7

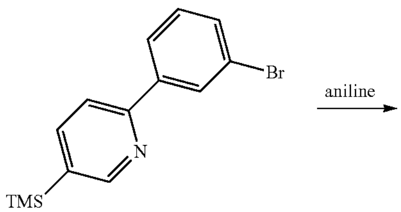

I-3-2

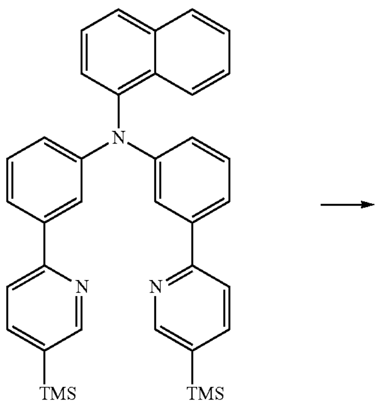

I-7-1

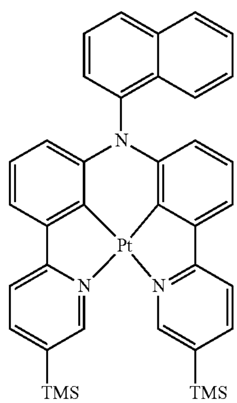

7

1) Synthesis of Intermediate I-7-1

Intermediate I-7-1 (yield of 85%) was synthesized in the same manner as Intermediate I-3-1 in Synthesis Example 1, except that 1-naphthylamine was used instead of 2,4,6-trimethylaniline. The obtained compound was confirmed by LC-MS.

LC-MS m/z=594 $(M+H)^+$

2) Synthesis of Compound 7

Compound 7 (yield of 40%) was synthesized in the same manner as Compound 3 in Synthesis Example 1, except that Intermediate I-7-1 was used instead of Intermediate I-3-1.

The obtained compound was confirmed by LCMS and $^1$H NMR.

LC-MS m/z=787 $(M+H)^+$ $^1$H NMR (300 MHz, $CDCl_3$) δ=8.82 (s, 2H), 8.27-8.19 (m, 2H), 7.85-7.79 (m, 4H), 7.72-7.45 (m, 8H), 6.98-6.94 (m, 2H), 0.38 (s, 18H).

Synthesis Example 8: Synthesis of Compound 8

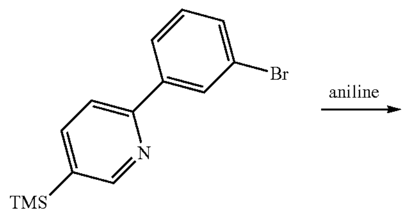

I-3-2

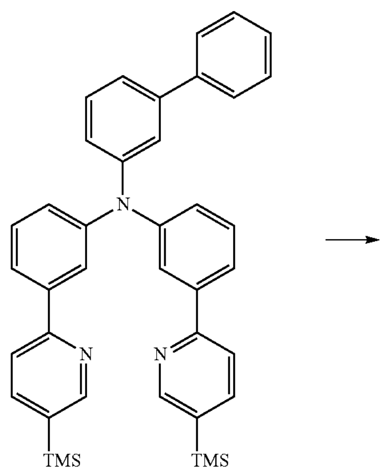

I-8-1

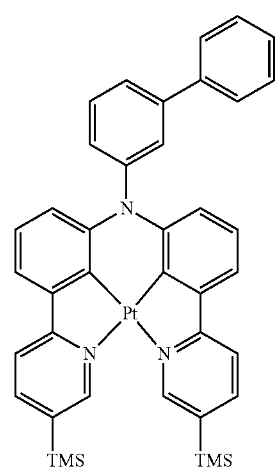

8

1) Synthesis of Intermediate I-8-1

Intermediate I-8-1 (yield of 70%) was synthesized in the same manner as Intermediate I-3-1 in Synthesis Example 1, except that 3-aminobiphenyl was used instead of 2,4,6-trimethylaniline. The obtained compound was confirmed by LC-MS.

LC-MS m/z=620 $(M+H)^+$

2) Synthesis of Compound 8

Compound 8 (yield of 25%) was synthesized in the same manner as Compound 3 in Synthesis Example 1, except that Intermediate I-8-1 was used instead of Intermediate I-3-1. The obtained compound was confirmed by LCMS and $^1$H NMR.

LC-MS m/z=813 $(M+H)^+$ $^1$H NMR (300 MHz, $CDCl_3$) δ=8.78 (s, 2H), 7.82-7.65 (m, 8H), 7.55-7.41 (m, 6H), 7.28-7.22 (m, 3H), 7.17-7.12 (m, 2H), 0.36 (s, 18H).

Synthesis Example 9: Synthesis of Compound 9

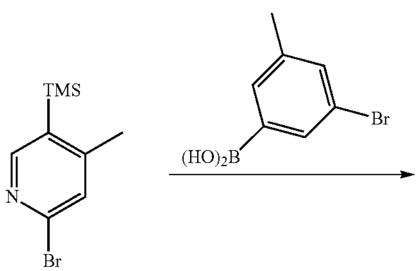

I-2-3

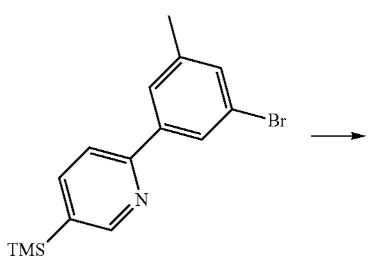

I-9-2

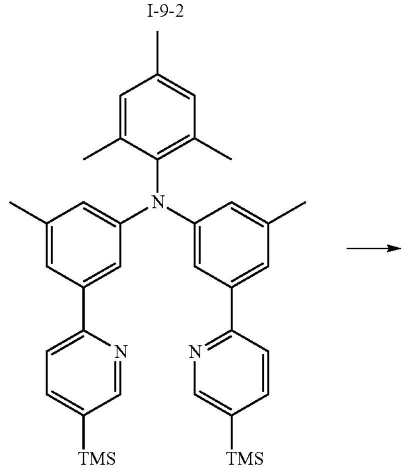

I-9-1

-continued

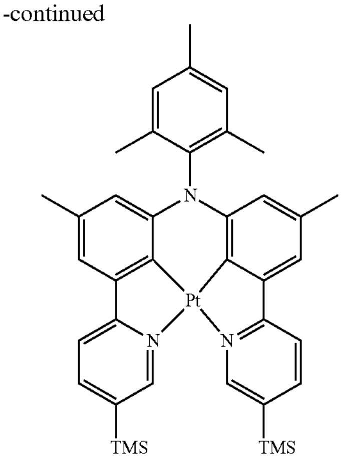

9

1) Synthesis of Intermediate I-9-2

Intermediate I-9-2 (yield of 75%) was synthesized in the same manner as Intermediate I-3-2 in Synthesis Example 1, except that 3-bromo-5-methylphenylboronic acid was used instead of 3-bromophenylboronic acid. The obtained compound was confirmed by LC-MS.

LC-MS m/z=320 $(M+H)^+$

2) Synthesis of Intermediate I-9-1

Intermediate I-9-1 (yield of 53%) was synthesized in the same manner as Intermediate I-3-1 in Synthesis Example 1, except that Intermediate I-9-2 was used instead of Intermediate I-3-2. The obtained compound was confirmed by LC-MS.

LC-MS m/z=614 $(M+H)^+$

3) Synthesis of Compound 9

Compound 9 (yield of 14%) was synthesized in the same manner as Compound 3 in Synthesis Example 1, except that Intermediate I-9-1 was used instead of Intermediate I-3-1. The obtained compound was confirmed by LCMS and $^1$H NMR.

LC-MS m/z=807 $(M+H)^+$ $^1$H NMR (300 MHz, $CDCl_3$) δ=8.85 (s, 2H), 7.86-7.60 (m, 4H), 7.51 (br s, 2), 7.38 (br s, 2H), 6.82 (s, 2H), 2.28 (s, 6H), 2.21 (s, 3H), 2.09 (s, 6H), 0.35 (s, 18H).

Synthesis Example 10: Synthesis of Compound 10

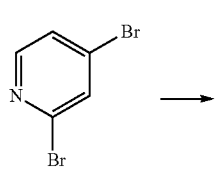

-continued

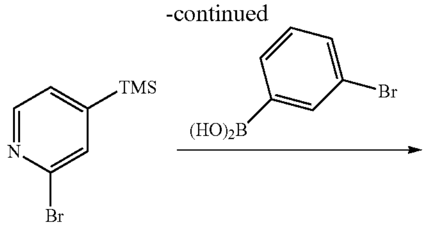

I-10-3

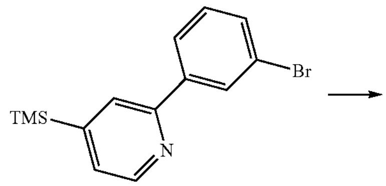

I-10-2

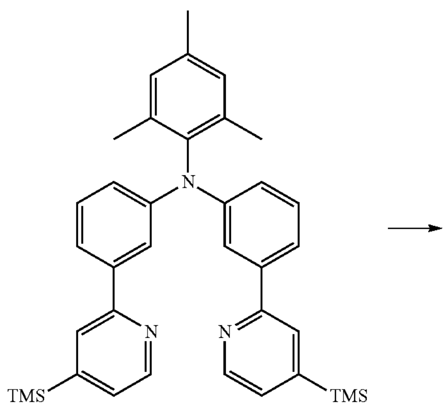

I-10-1

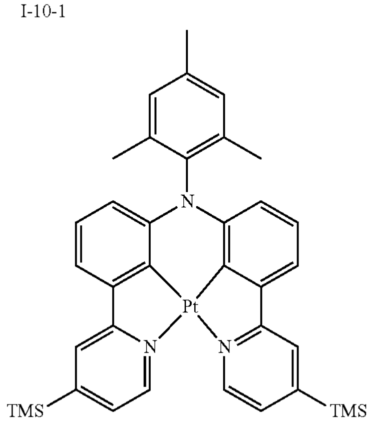

10

1) Synthesis of Intermediate I-10-3

Intermediate I-10-3 (yield of 60%) was synthesized in the same manner as Intermediate I-2-3 in Synthesis Example 3, except that 2,4-dibromopyridine was used instead of 2,5-dibromo-3-methylpyridine. The obtained compound was confirmed by LC-MS.

LC-MS m/z=230 $(M+H)^+$

2) Synthesis of Intermediate I-10-2

Intermediate I-10-2 (yield of 70%) was synthesized in the same manner as Intermediate I-9-2 in Synthesis Example 9, except that Intermediate I-10-3 was used instead of Intermediate I-2-3. The obtained compound was confirmed by LC-MS.

LC-MS m/z=306 $(M+H)^+$

3) Synthesis of Intermediate I-10-1

Intermediate I-10-1 (yield of 64%) was synthesized in the same manner as Intermediate I-9-1 in Synthesis Example 9, except that Intermediate I-10-2 was used instead of Intermediate I-9-2. The obtained compound was confirmed by LC-MS.

LC-MS m/z=586 $(M+H)^+$

4) Synthesis of Compound 10

Compound 10 (yield of 12%) was synthesized in the same manner as Compound 3 in Synthesis Example 1, except that Intermediate I-10-1 was used instead of Intermediate I-3-1. The obtained compound was confirmed by LCMS and $^1$H NMR.

LC-MS m/z=779 $(M+H)^+$ $^1$H NMR (300 MHz, $CDCl_3$) δ=8.52 (d, 2H), 7.84 (d, 2H), 7.75 (d, 2H), 7.53-7.50 (m, 2), 7.28-7.20 (m, 4H), 6.84 (br s, 2H), 2.23 (s, 3H), 2.11 (s, 6H), 0.33 (s, 18H).

Synthesis Example 11: Synthesis of Compound 11

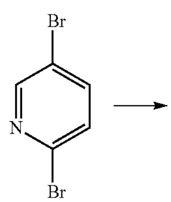

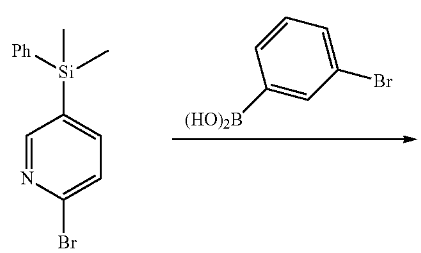

I-11-3

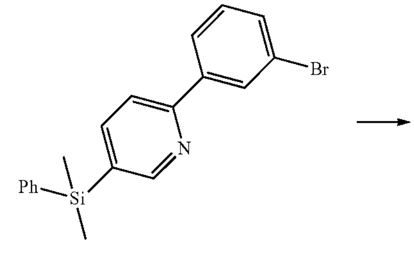

I-11-2

-continued

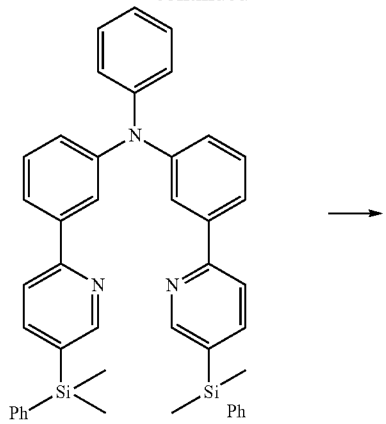

I-11-1

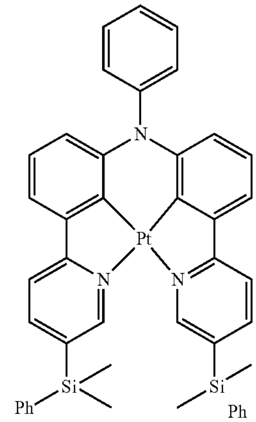

11

1) Synthesis of Intermediate I-11-3

Intermediate I-11-3 (yield of 85%) was synthesized in the same manner as Intermediate I-6-3 in Synthesis Example 6, except that chloro(dimethyl)phenylsilane was used instead of chlorotriphenylsilane. The obtained compound was confirmed by LC-MS.

LC-MS m/z=292 $(M+H)^+$

2) Synthesis of Intermediate I-11-2

Intermediate I-11-2 (yield of 75%) was synthesized in the same manner as Intermediate I-6-2 in Synthesis Example 6, except that Intermediate I-11-3 was used instead of Intermediate I-6-3. The obtained compound was confirmed by LC-MS.

LC-MS m/z=368 $(M+H)^+$

3) Synthesis of Intermediate I-11-1

Intermediate I-11-1 (yield of 55%) was synthesized in the same manner as Intermediate I-6-1 in Synthesis Example 6, except that Intermediate I-11-2 was used instead of Intermediate I-6-2. The obtained compound was confirmed by LC-MS.

LC-MS m/z=668 $(M+H)^+$

4) Synthesis of Compound 11

Compound 11 (yield of 33%) was synthesized in the same manner as Compound 6 in Synthesis Example 6, except that Intermediate I-11-1 was used instead of Intermediate I-6-1. The obtained compound was confirmed by LCMS and $^1H$ NMR.

LC-MS m/z=861 $(M+H)^+$ $^1H$ NMR (300 MHz, $CDCl_3$) δ=8.89 (d, 2H), 7.86-7.84 (m, 2H), 7.80-7.71 (m, 2H), 7.55-7.51 (m, 2), 7.36-7.20 (m, 14H), 7.12-7.05 (m, 3H), 0.71 (s, 12H).

Synthesis Example 12: Synthesis of Compound 12

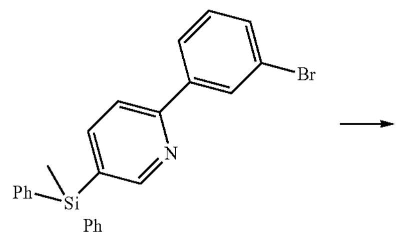

I-12-2

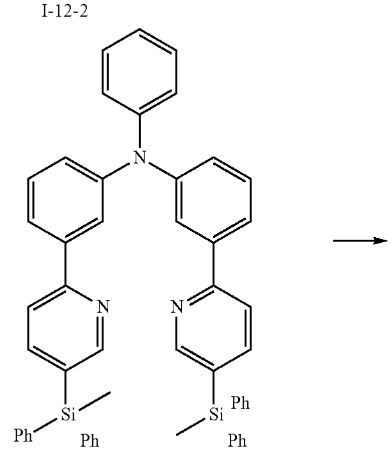

I-12-1

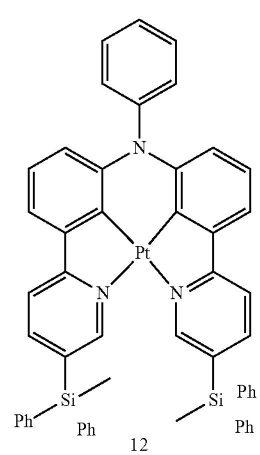

12

1) Synthesis of Intermediate I-12-2

Intermediate I-12-2 was synthesized in the same manner as Intermediate I-11-3 and Intermediate I-11-2 in Synthesis Example 11, except that chloro(methyl)diphenylsilane was used instead of chloro(dimethyl)phenylsilane. The obtained compound was confirmed by LC-MS.

LC-MS m/z=430 $(M+H)^+$

2) Synthesis of Intermediate I-12-1

Intermediate I-12-1 (yield of 62%) was synthesized in the same manner as Intermediate I-11-1 in Synthesis Example 11, except that Intermediate I-12-2 was used instead of Intermediate I-11-2. The obtained compound was confirmed by LC-MS.

LC-MS m/z=792 $(M+H)^+$

3) Synthesis of Compound 12

Compound 12 (yield of 20%) was synthesized in the same manner as Compound 11 in Synthesis Example 11, except that Intermediate I-12-1 was used instead of Intermediate I-11-1. The obtained compound was confirmed by LCMS and $^1$H NMR.

LC-MS m/z=985 $(M+H)^+$ $^1$H NMR (300 MHz, $CDCl_3$) δ=8.82 (br s, 2H), 8.01-7.98 (m, 2H), 7.82-7.76 (m, 4H), 7.61-7.37 (m, 22H), 7.28-7.24 (m, 4H), 7.11-7.06 (m, 3H), 0.68 (s, 6H).

Synthesis Example 13: Synthesis of Compound 13

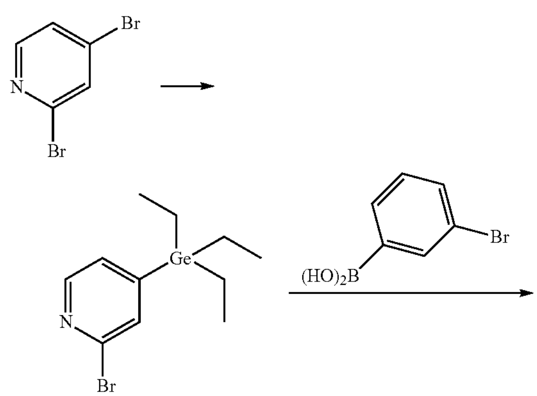

I-13-3

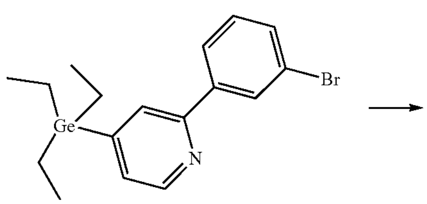

I-13-2

-continued

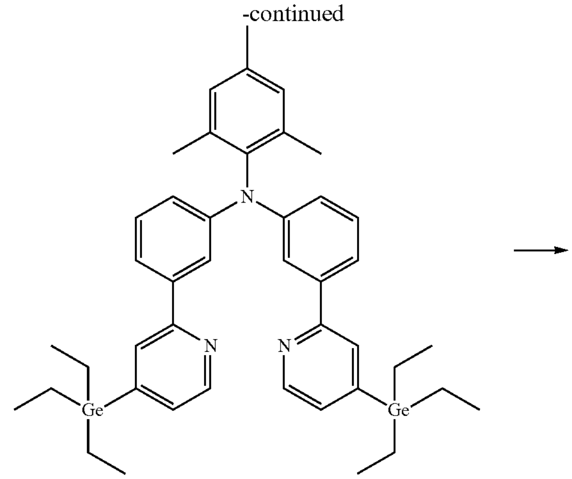

I-13-1

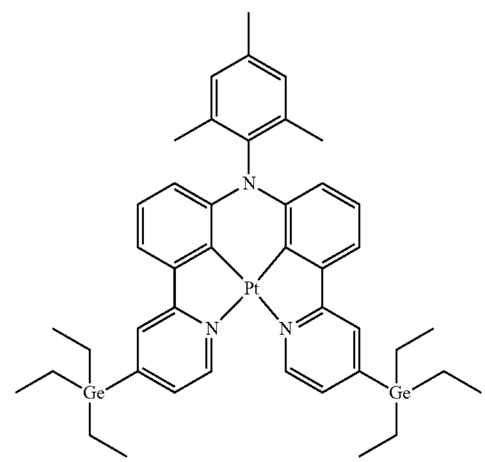

13

1) Synthesis of Intermediate I-13-3

Intermediate I-13-3 (yield of 85%) was synthesized in the same manner as Intermediate I-10-3 in Synthesis Example 10, except that chlorotriethylgermane was used instead of chlorotrimethylsilane. The obtained compound was confirmed by LC-MS.

LC-MS m/z=318 $(M+H)^+$

2) Synthesis of Intermediate I-13-2

Intermediate I-13-2 (yield of 70%) was synthesized in the same manner as Intermediate I-10-2 in Synthesis Example 10, except that Intermediate I-13-3 was used instead of Intermediate I-10-3. The obtained compound was confirmed by LC-MS.

LC-MS m/z=394 $(M+H)^+$

3) Synthesis of Intermediate I-13-1

Intermediate I-13-1 (yield of 55%) was synthesized in the same manner as Intermediate I-10-1 in Synthesis Example 10, except that Intermediate I-13-2 was used instead of Intermediate I-10-2. The obtained compound was confirmed by LC-MS.

LC-MS m/z=762 $(M+H)^+$

4) Synthesis of Compound 13

Compound 13 (yield of 10%) was synthesized in the same manner as Compound 3 in Synthesis Example 1, except that Intermediate I-13-1 was used instead of Intermediate I-3-1. The obtained compound was confirmed by LCMS and $^1$H NMR.

LC-MS m/z=955 $(M+H)^+$ $^1$H NMR (300 MHz, $CDCl_3$) δ=8.64 (d, 2H), 7.88 (d, 2H), 7.82-7.79 (m, 2H), 7.52 (s, 2H), 7.28-7.22 (m, 2H), 6.91 (d, 2H), 6.96 (br s, 2H), 2.26 (s, 3H), 2.08 (s, 6H), 1.04 (q, 12H), 0.90 (t, 18H).

Synthesis Example 14: Synthesis of Compound 14

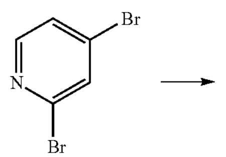

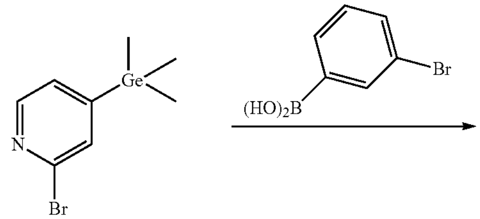

I-14-3

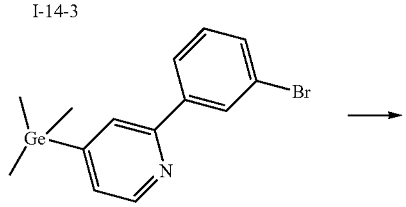

I-14-2

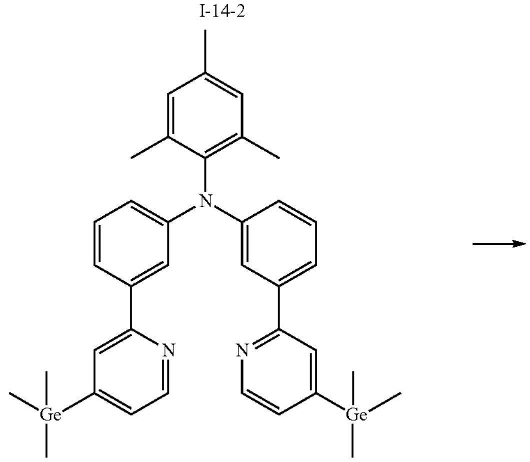

I-14-1

-continued

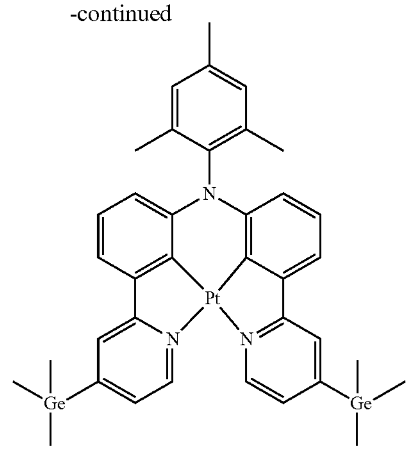

14

1) Synthesis of Intermediate I-14-1

Intermediate I-14-1 was synthesized in the same manner as Intermediates I-13-3, I-13-2, and I-13-1 in Synthesis Example 13, except that chlorotrimethylgermane was used instead of chlorotriethylgermane. The obtained compound was confirmed by LC-MS.

LC-MS m/z=678 $(M+H)^+$

2) Synthesis of Compound 14

Compound 14 (yield of 15%) was synthesized in the same manner as Compound 13 in Synthesis Example 13, except that Intermediate I-14-1 was used instead of Intermediate I-13-1. The obtained compound was confirmed by LCMS and $^1$H NMR.

LC-MS m/z=871 $(M+H)^+$ $^1$H NMR (300 MHz, $CDCl_3$) δ=8.57 (d, 2H), 7.86 (d, 2H), 7.80-7.76 (m, 2H), 7.51 (s, 2H), 7.25 (br s, 2H), 6.88 (br s, 2H), 6.80 (s, 2H), 2.23 (s, 3H), 2.11 (s, 6H), 0.83 (t, 18H).

Synthesis Example 15: Synthesis of Compound 15

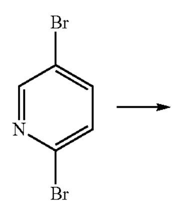

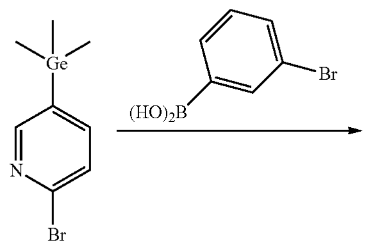

I-15-3

-continued

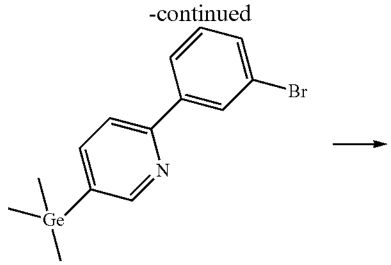

I-15-2

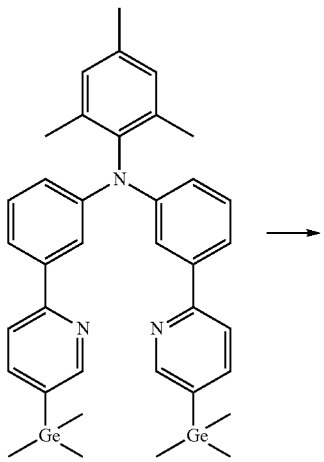

I-15-1

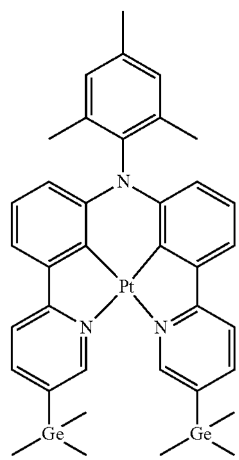

15

1) Synthesis of Intermediate I-15-1

Intermediate I-15-1 was synthesized in the same manner as Intermediates I-5-3, I-5-2, and I-5-1 in Synthesis Example 5, except that chlorotrimethylgermane was used instead of chlorotriethylsilane. The obtained compound was confirmed by LC-MS.

LC-MS m/z=678 $(M+H)^+$

2) Synthesis of Compound 15

Compound 15 (yield of 25%) was synthesized in the same manner as Compound 5 in Synthesis Example 5, except that Intermediate I-15-1 was used instead of Intermediate I-5-1. The obtained compound was confirmed by LCMS and $^1H$ NMR.

LC-MS m/z=871 $(M+H)^+$ $^1H$ NMR (300 MHz, $CDCl_3$) δ=8.47 (br s, 2H), 7.84-7.78 (m, 4H), 7.61 (br s, 2H), 7.36-7.21 (m, 4H), 6.76 (s, 2H), 2.21 (s, 3H), 2.09 (s, 6H), 0.79 (s, 18H).

Synthesis Example 16: Synthesis of Compound 16

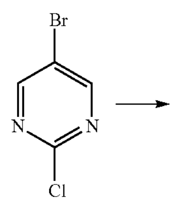

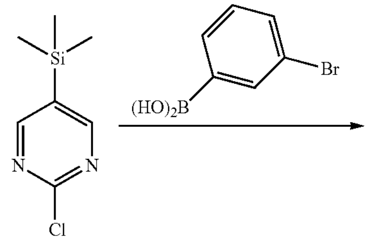

I-16-3

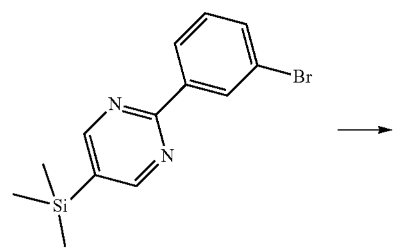

I-16-2

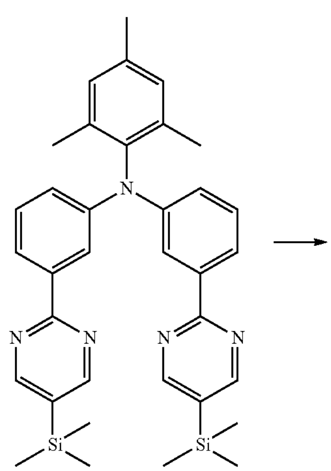

I-16-1

-continued

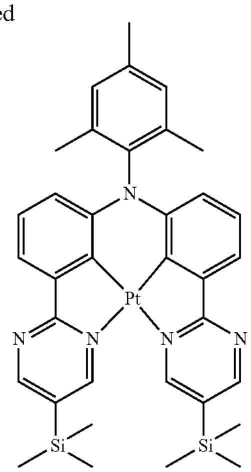

16

1) Synthesis of Intermediate I-16-3

Intermediate I-16-3 (yield of 55%) was synthesized in the same manner as Intermediate I-5-3 in Synthesis Example 5, except that 5-bromo-2-chloropyrimidine was used instead of 2,5-dibromopyridine. The obtained compound was confirmed by LC-MS.

LC-MS m/z=187 $(M+H)^+$

2) Synthesis of Intermediate I-16-2

Intermediate I-16-2 (yield of 75%) was synthesized in the same manner as Intermediate I-5-2 in Synthesis Example 5, except that Intermediate I-16-3 was used instead of Intermediate I-5-3. The obtained compound was confirmed by LC-MS.

LC-MS m/z=307 $(M+H)^+$

3) Synthesis of Intermediate I-16-1

Intermediate I-16-1 (yield of 80%) was synthesized in the same manner as Intermediate I-5-1 in Synthesis Example 5, except that Intermediate I-16-2 was used instead of Intermediate I-5-2. The obtained compound was confirmed by LC-MS.

LC-MS m/z=588 $(M+H)^+$

3) Synthesis of Compound 16

5.0 g (8.5 mmol) of Intermediate I-16-1 and 300 ml of an acetic acid were added to a reactor at a temperature of 25° C. Then, 3.5 g (8.5 mmol) of $K_2PtCl_4$ was added thereto, and the mixture was heated under reflux for 48 hours. Once the reaction was completed, the mixture was condensed under reduced pressure, and re-crystallized by using dichloromethane and methanol to complete the preparation of 0.5 g (0.8 mmol, yield of 8%) of Compound 16. The obtained compound was confirmed by LC-MS.

LC-MS m/z=781 $(M+H)^+$

Synthesis Example 17: Synthesis of Compound 17

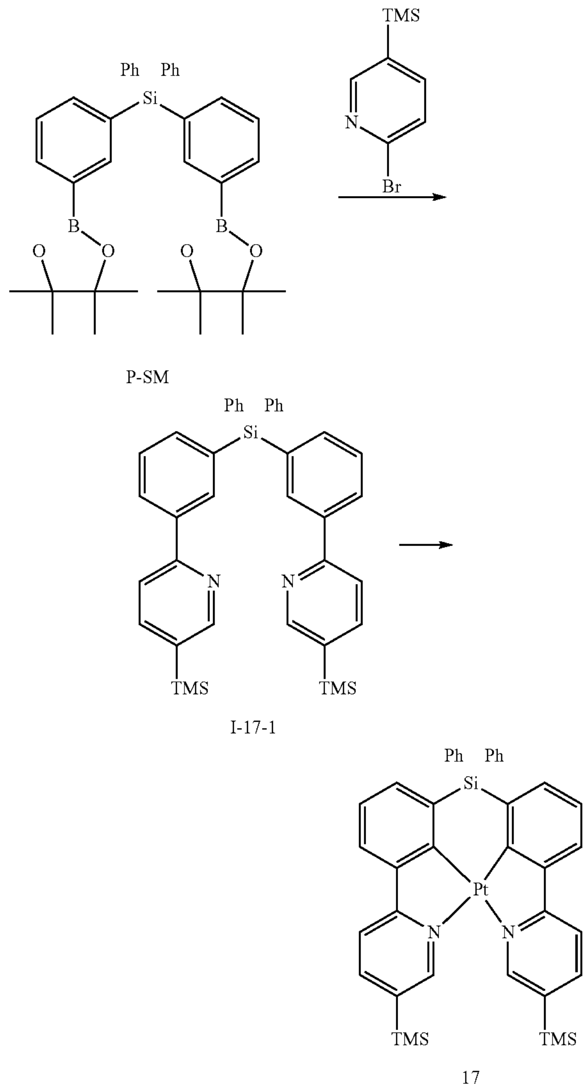

1) Synthesis of Intermediate I-17-1

30.0 g (51.0 mmol) of P-SM (a compound prepared in response to an order, Medigen, Inc., www.medi-gen.net), 600 ml of tetrahydrofuran, and 300 ml of distilled water were added to a reactor. 28.1 g (122.4 mmol) of 2-bromo-5-(trimethylsilyl)pyridine, 5.9 g (5.1 mmol) of $Pd(PPh_3)_4$, and 21.1 g (153.0 mmol) of $K_2CO_3$ were added thereto, and the mixture was heated under reflux at a temperature of 80° C. for 18 hours. Once the reaction was completed, an extraction process was performed thereon by using 400 ml of ethyl acetate and 100 ml of distilled water. An organic layer obtained therefrom was dried by using magnesium sulfate and distilled under reduced pressure. The resultant was purified by liquid chromatography to complete the preparation of 24.0 g (38 mmol, yield of 75%) of Intermediate I-17-1.

LC-MS m/z=635 $(M+H)^+$

2) Synthesis of Compound 17

Compound 17 (yield of 35%) was synthesized in the same manner as Compound 3 in Synthesis Example 1, except that Intermediate I-17-1 was used instead of Intermediate I-3-1. The obtained compound was confirmed by LCMS and $^1$H NMR.

LC-MS m/z=828 (M+H)$^+$ $^1$H NMR (300 MHz, $CDCl_3$) δ=8.81 (br s, 2H), 8.37 (br s, 2H), 7.85 (br s, 2H), 7.72-7.58 (m, 4H), 7.46-7.44 (m, 2H), 7.42-7.32 (m, 10H), 0.42 (s, 18H).

Synthesis Example 18: Synthesis of Compound 18

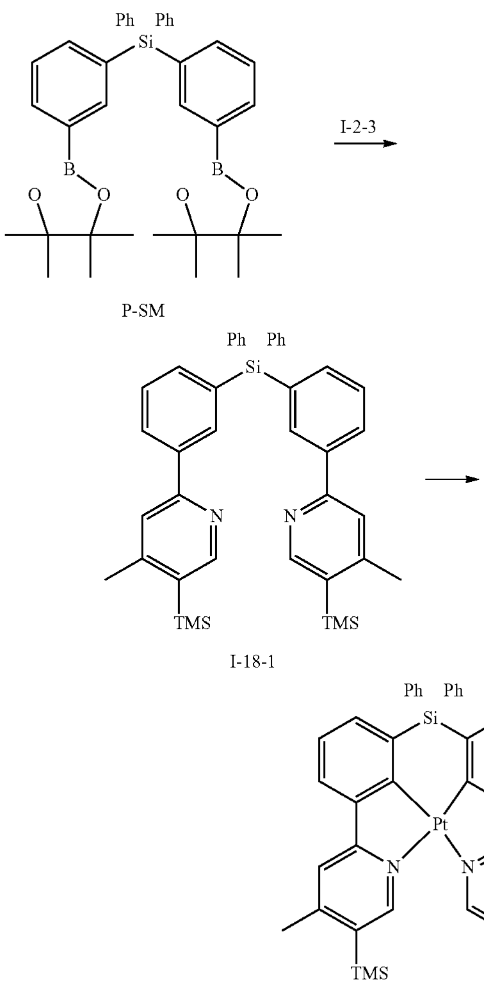

P-SM

I-18-1

18

1) Synthesis of Intermediate I-18-1

Intermediate I-18-1 (yield of 60%) was synthesized in the same manner as Intermediate I-17-1 in Synthesis Example 17, except that Intermediate I-2-3 was used instead of 2-bromo-5-(trimethylsilyl)pyridine. The obtained compound was confirmed by LC-MS.

LC-MS m/z=663 (M+H)$^+$

2) Synthesis of Compound 18

Compound 18 (yield of 20%) was synthesized in the same manner as Compound 17 in Synthesis Example 17, except that Intermediate I-18-1 was used instead of Intermediate I-17-1. The obtained compound was confirmed by LCMS and $^1$H NMR.

LC-MS m/z=856 (M+H)$^+$ $^1$H NMR (300 MHz, $CDCl_3$) δ=8.79 (br s, 2H), 8.26 (br s, 2H), 7.88 (s, 2H), 7.64-7.56 (m, 4H), 7.46-7.38 (m, 10H), 2.36 (s, 6H), 0.77 (s, 18H).

Synthesis Example 19: Synthesis of Compound 20

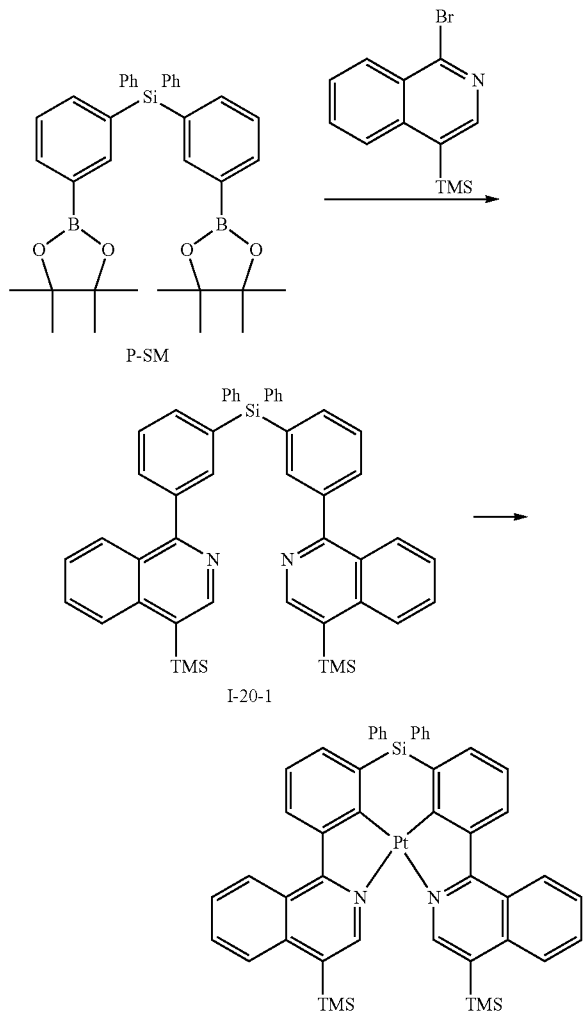

P-SM

I-20-1

20

1) Synthesis of Intermediate I-20-1

Intermediate I-20-1 (yield of 53%) was synthesized in the same manner as Intermediate I-18-1 in Example 18, except that 1-bromo-4-(trimethylsilyl)isoquinoline (a compound prepared in response to an order, HANCHEM CO., LTD., www.hanchem.co.kr) was used instead of Intermediate I-2-3. The obtained compound was confirmed by LC-MS.

LC-MS m/z=735 $(M+H)^+$

2) Synthesis of Compound 20

Compound 20 (yield of 10%) was synthesized in the same manner as Compound 17 in Synthesis Example 17, except that Intermediate I-20-1 was used instead of Intermediate I-17-1. The obtained compound was confirmed by LC-MS.

LC-MS m/z=927 $(M+H)^+$

Synthesis Example 20: Synthesis of Compound 21

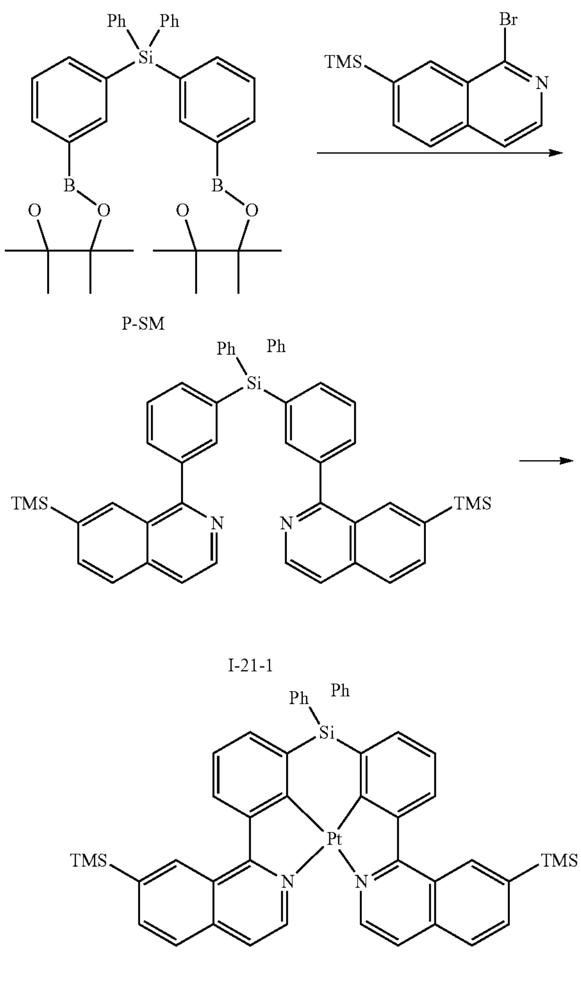

P-SM

I-21-1

21

1) Synthesis of Intermediate I-21-1

Intermediate I-21-1 (yield of 50%) was synthesized in the same manner as Intermediate I-18-1 in Example 18, except that 1-bromo-7-(trimethylsilyl)isoquinoline (a compound prepared in response to an order, HANCHEM CO., LTD., www.hanchem.co.kr) was used instead of Intermediate I-2-3. The obtained compound was confirmed by LC-MS.

LC-MS m/z=735 $(M+H)^+$

2) Synthesis of Compound 21

Compound 21 (yield of 7%) was synthesized in the same manner as Compound 17 in Synthesis Example 17, except that Intermediate I-20-1 was used instead of Intermediate I-17-1. The obtained compound was confirmed by LC-MS.

LC-MS m/z=927 $(M+H)^+$

Synthesis Example 21: Synthesis of Compound 22

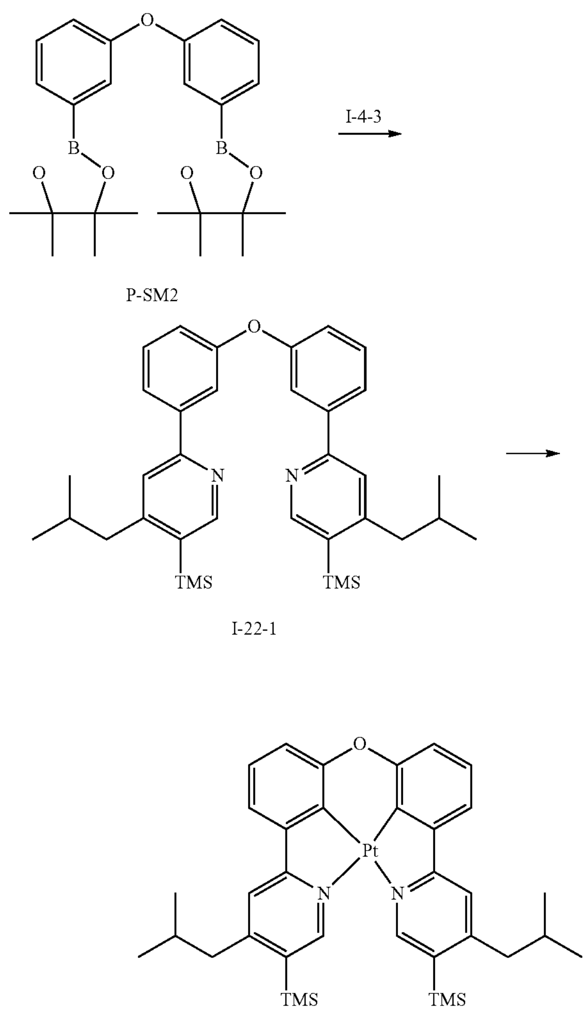

P-SM2

I-22-1

22

1) Synthesis of Intermediate I-22-1

Intermediate I-22-1 (yield of 62%) was synthesized in the same manner as Intermediate I-17-1 in Example 17, except that P-SM2 (a compound prepared in response to an order, Medigen, Inc., www.medi-gen.net) was used instead of P-SM, and Intermediate I-4-3 was used instead of Intermediate I-2-3. The obtained compound was confirmed by LC-MS.

LC-MS m/z=581 $(M+H)^+$

2) Synthesis of Compound 22

Compound 22 (yield of 22%) was synthesized in the same manner as Compound 17 in Synthesis Example 17, except that Intermediate I-22-1 was used instead of Intermediate I-17-1. The obtained compound was confirmed by and $^{1}$H NMR.

LC-MS m/z=774 $(M+H)^+$ $^{1}$H NMR (300 MHz, $CDCl_3$) δ=8.86 (br s, 2H), 7.95 (d, 2H), 7.83 (br s, 2H), 7.52-7.48 (m, 2H), 7.33-7.25 (m, 2H), 3.16 (d, 4H), 1.96-1.93 (m, 2H), 1.00 (d, 12H), 0.41 (s, 18H).

Synthesis Example 22: Synthesis of Compound 23

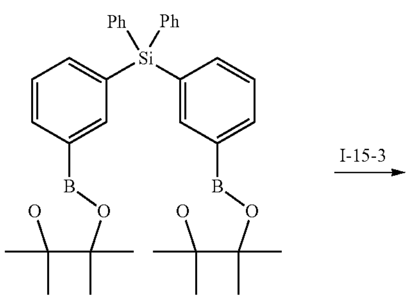

P-SM

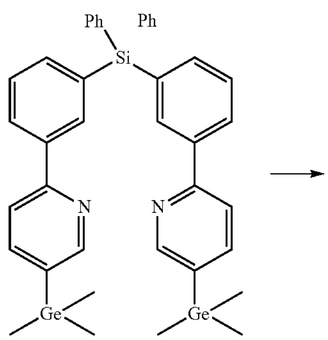

I-23-1

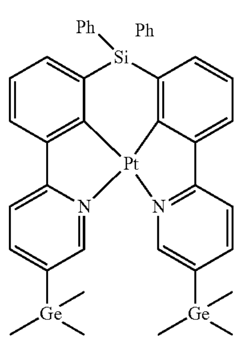

23

1) Synthesis of Intermediate I-23-1

Intermediate I-23-1 (yield of 76%) was synthesized in the same manner as Intermediate I-18-1 in Synthesis Example 18, except that Intermediate I-15-3 was used instead of Intermediate I-2-3. The obtained compound was confirmed by LC-MS.

LC-MS m/z=727 $(M+H)^+$

2) Synthesis of Compound 23

Compound 23 (yield of 21%) was synthesized in the same manner as Compound 17 in Synthesis Example 17, except that Intermediate I-23-1 was used instead of Intermediate I-17-1. The obtained compound was confirmed by LCMS and $^{1}$H NMR.

LC-MS m/z=920 $(M+H)^+$ $^{1}$H NMR (300 MHz, $CDCl_3$) δ=8.42 (s, 2H), 8.15 (br s, 2H), 7.78 (br s, 2H), 7.68-7.61 (m, 2H), 7.58-7.54 (m, 2H), 7.46-7.32 (m, 10H), 0.72 (s, 18H).

Synthesis Example 23: Synthesis of Compound 24

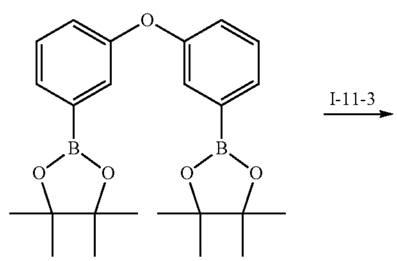

P-SM2

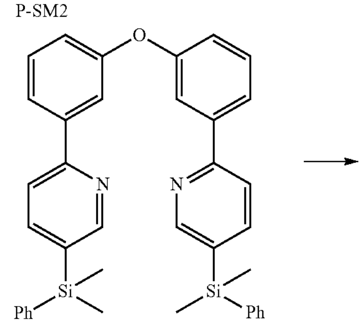

I-24-1

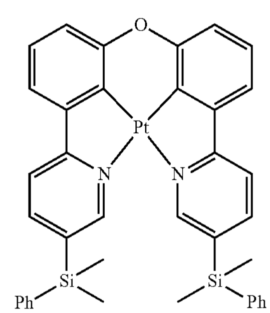

24

1) Synthesis of Intermediate I-24-1

Intermediate I-24-1 (yield of 70%) was synthesized in the same manner as Intermediate I-22-1 in Synthesis Example 21, except that Intermediate I-11-3 was used instead of Intermediate I-4-3. The obtained compound was confirmed by LC-MS.

LC-MS m/z=593 $(M+H)^+$

2) Synthesis of Compound 24

Compound 24 (yield of 25%) was synthesized in the same manner as Compound 22 in Synthesis Example 21, except that Intermediate I-24-1 was used instead of Intermediate I-22-1. The obtained compound was confirmed by LCMS and $^1$H NMR.

LC-MS m/z=786 $(M+H)^+$ $^1$H NMR (300 MHz, $CDCl_3$) δ=8.82 (s, 2H), 7.93-7.77 (m, 4H), 7.69-7.64 (m, 2H), 7.43-7.34 (m, 2H), 7.31-7.21 (m, 10H), 7.15-7.10 (m, 2H), 0.67 (s, 12H).

Synthesis Example 24: Synthesis of Compound 25

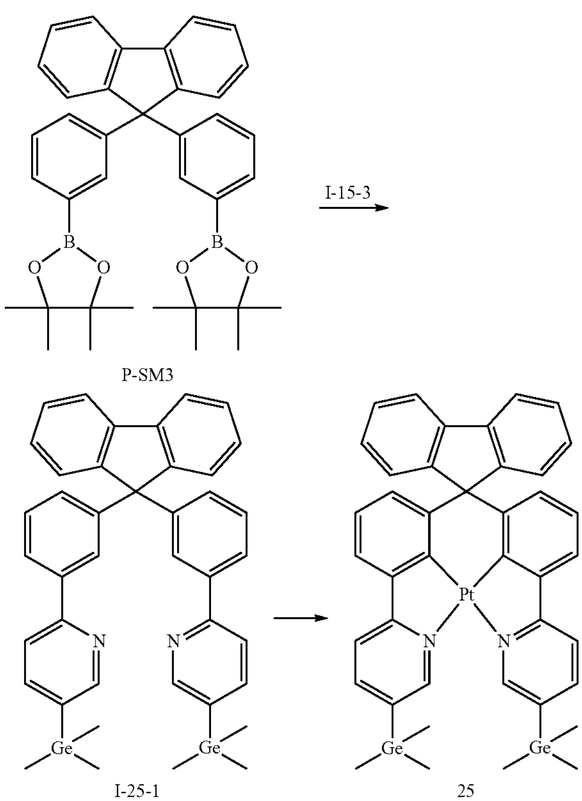

1) Synthesis of Intermediate I-25-1

Intermediate I-25-1 (yield of 83%) was synthesized in the same manner as Intermediate I-23-1 in Synthesis Example 22, except that P-SM3 (a compound prepared in response to an order, HANCHEM CO., LTD., www.hanchem.co.kr) was used instead of P-SM. The obtained compound was confirmed by LC-MS.

LC-MS m/z=709 $(M+H)^+$

2) Synthesis of Compound 25

Compound 25 (yield of 36%) was synthesized in the same manner as Compound 23 in Synthesis Example 22, except that Intermediate I-25-1 was used instead of Intermediate I-23-1. The obtained compound was confirmed by LCMS and $^1$H NMR.

LC-MS m/z=902 $(M+H)^+$ $^1$H NMR (300 MHz, $CDCl_3$) δ=8.41 (s, 2H), 8.11 (d, 2H), 8.00-7.97 (m, 2H), 7.85-7.82 (m, 2H), 7.53-7.38 (m, 4H), 7.37-7.32 (m, 4H), 7.28-7.22 (m, 2H), 0.72 (s, 18H).

Synthesis Example 25: Synthesis of Compound 26

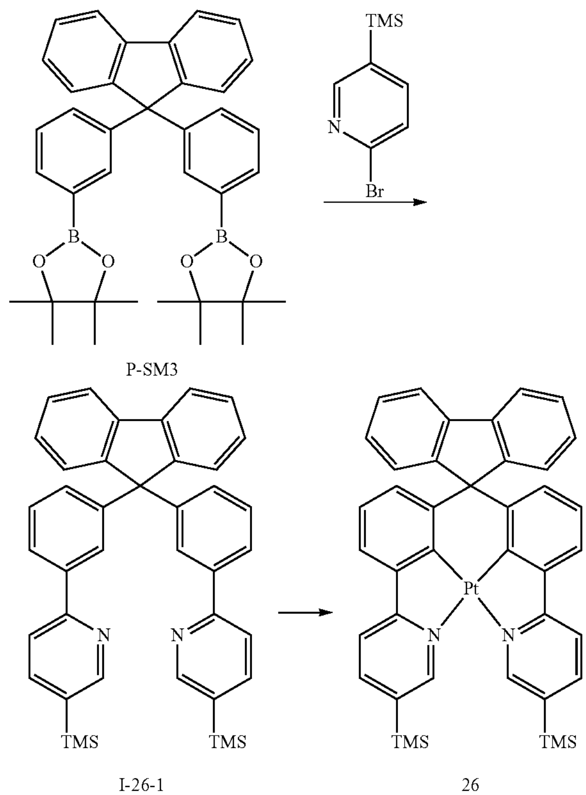

1) Synthesis of Intermediate I-26-1

Intermediate I-26-1 (yield of 75%) was synthesized in the same manner as Intermediate I-25-1 in Synthesis Example 24, except that 2-bromo-5-(trimethylsilyl)pyridine was used instead of Intermediate I-15-3. The obtained compound was confirmed by LC-MS.

LC-MS m/z=617 $(M+H)^+$

2) Synthesis of Compound 26

Compound 26 (yield of 30%) was synthesized in the same manner as Compound 25 in Synthesis Example 24, except that Intermediate I-26-1 was used instead of Intermediate I-25-1. The obtained compound was confirmed by LCMS and $^1$H NMR.

LC-MS m/z=810 $(M+H)^+$ $^1$H NMR (300 MHz, $CDCl_3$) δ=8.75 (br s, 2H), 8.08 (d, 2H), 7.94-7.90 (m, 2H), 7.84 (d, 2H), 7.70-7.64 (m, 2H), 7.55-7.51 (m, 4H), 7.38-7.35 (m, 2H), 7.28-7.24 (m, 4H), 0.42 (s, 18H).

Synthesis Example 26: Synthesis of Compound 27

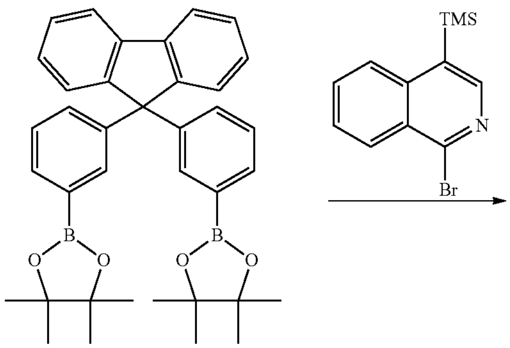

P-SM3

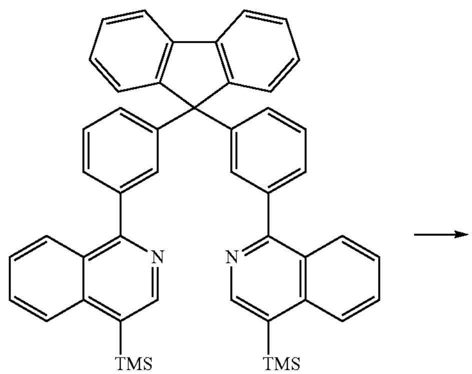

I-27-1

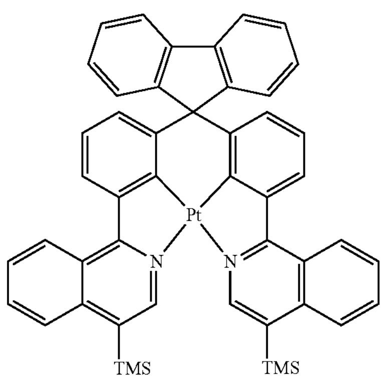

27

1) Synthesis of Intermediate I-27-1

Intermediate I-27-1 (yield of 52%) was synthesized in the same manner as Intermediate I-25-1 in Synthesis Example 24, except that 1-bromo-4-(trimethylsilyl)isoquinoline (a compound prepared in response to an order, HANCHEM CO., LTD., www.hanchem.co.kr) was used instead of Intermediate I-15-3. The obtained compound was confirmed by LC-MS.

LC-MS m/z=717 $(M+H)^+$

2) Synthesis of Compound 27

Compound 27 (yield of 8%) was synthesized in the same manner as Compound 25 in Synthesis Example 24, except that Intermediate I-27-1 was used instead of Intermediate I-25-1. The obtained compound was confirmed by LC-MS.

LC-MS m/z=909 $(M+H)^+$

Synthesis Example 27: Synthesis of Compound 28

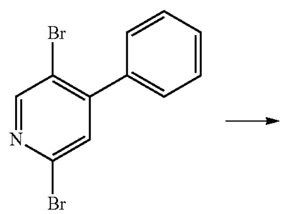

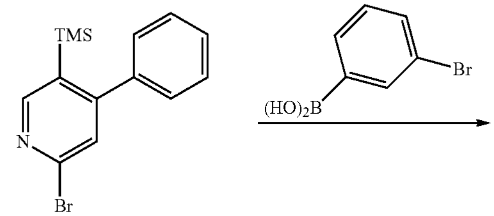

I-28-3

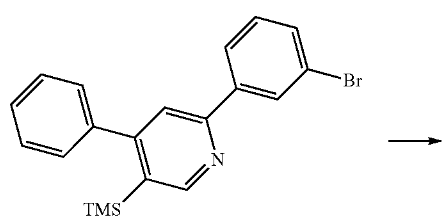

I-28-2

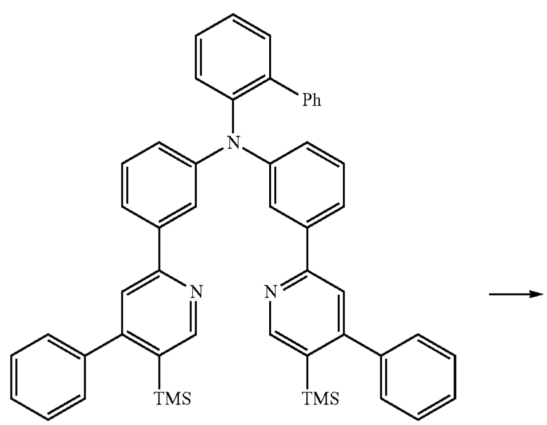

I-28-1

-continued

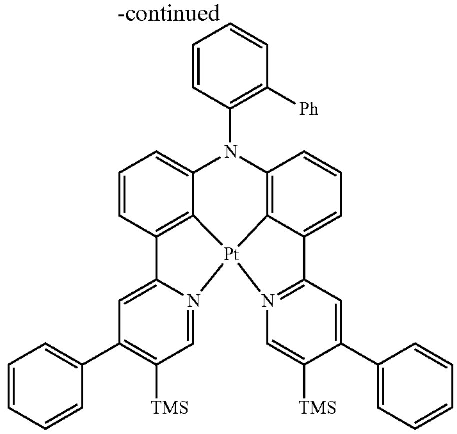

28

1) Synthesis of Intermediate I-28-3

Intermediate I-28-3 (yield of 75%) was synthesized in the same manner as Intermediate I-5-3 in Synthesis Example 5, except that 2,5-dibromo-4-phenylpyridine was used instead of 2,5-dibromopyridine. The obtained compound was confirmed by LC-MS.

LC-MS m/z=306 $(M+H)^+$

2) Synthesis of Intermediate I-28-2

Intermediate I-28-2 (yield of 70%) was synthesized in the same manner as Intermediate I-5-2 in Synthesis Example 5, except that Intermediate I-28-3 was used instead of Intermediate I-5-3. The obtained compound was confirmed by LC-MS.

LC-MS m/z=382 $(M+H)^+$

3) Synthesis of Intermediate I-28-1

Intermediate I-28-1 (yield of 60%) was synthesized in the same manner as Intermediate I-5-1 in Synthesis Example 5, except that Intermediate I-28-2 was used instead of Intermediate I-5-2, and 2-aminobiphenyl was used instead of 2,4,6-trimethylaniline. The obtained compound was confirmed by LC-MS.

LC-MS m/z=772 $(M+H)^+$

3) Synthesis of Compound 28

2.8 g (3.6 mmol) of Intermediate I-28-1 and 100 ml of benzonitrile were added to a reactor at a temperature of 25° C. Then, 1.7 g (3.6 mmol) of $PtCl_2(NCPh)_2$ was added thereto, and the resultant was mixed for 16 hours for 130° C. Once the reaction was completed, the mixture was concentrated under reduced pressure, and purified by column chromatography, thereby completing the preparation of 0.9 g (0.9 mmol, yield of 26%) of Compound 28. The obtained compound was confirmed by LC-MS.

LC-MS m/z=965 $(M+H)^+$

Synthesis Example 28: Synthesis of Compound 29

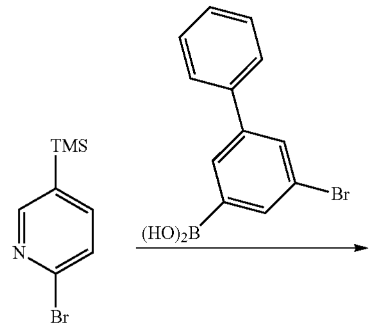

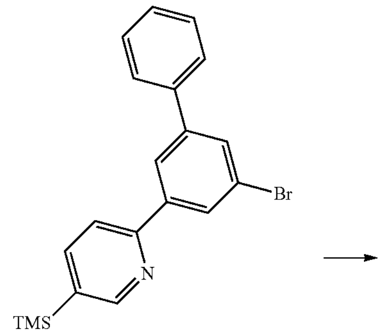

I-29-2

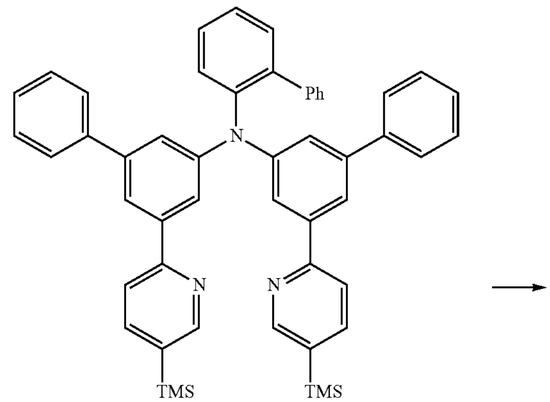

I-29-1

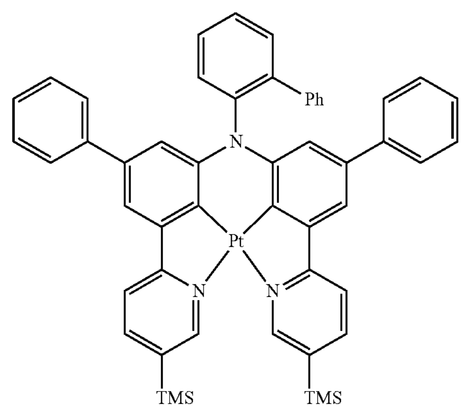

29

1) Synthesis of Intermediate I-29-2

Intermediate I-29-2 (yield of 70%) was synthesized in the same manner as Intermediate I-3-2 in Synthesis Example 1, except that (5-bromo-[1,1'-biphenyl]-3-yl)boronic acid was used instead of 3-bromophenylboronic acid. The obtained compound was confirmed by LC-MS.

LC-MS m/z=382 $(M+H)^+$

2) Synthesis of Intermediate I-29-1

Intermediate I-29-1 (yield of 75%) was synthesized in the same manner as Intermediate I-3-1 in Synthesis Example 1, except that Intermediate I-29-2 was used instead of Intermediate I-3-2, and 2-aminobiphenyl was used instead of 2,4,6-trimethylaniline. The obtained compound was confirmed by LC-MS.

LC-MS m/z=772 $(M+H)^+$

3) Synthesis of Compound 29

Compound 29 (yield of 25%) was synthesized in the same manner as Compound 28 in Synthesis Example 27, except that Intermediate I-29-1 was used instead of Intermediate I-28-1. The obtained compound was confirmed by LCMS and $^1$H NMR.

LC-MS m/z=965 $(M+H)^+$ $^1$H NMR (300 MHz, $CD_2C_2$) δ=9.05 (s, 2H), 8.07 (s, 4H), 7.68-7.65 (m, 1H), 7.64-7.62 (m, 4H), 7.51-7.48 (m, 4H), 7.42-7.31 (m, 9H), 7.13-7.11 (m, 3H), 6.65 (s, 2H), 0.48 (s, 18H).

Synthesis Example 29: Synthesis of Compound 30

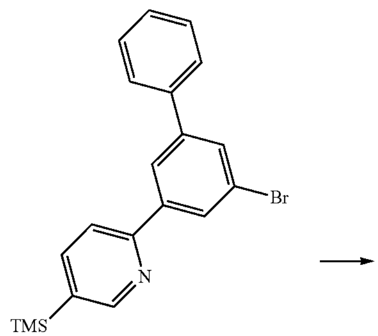

I-29-2

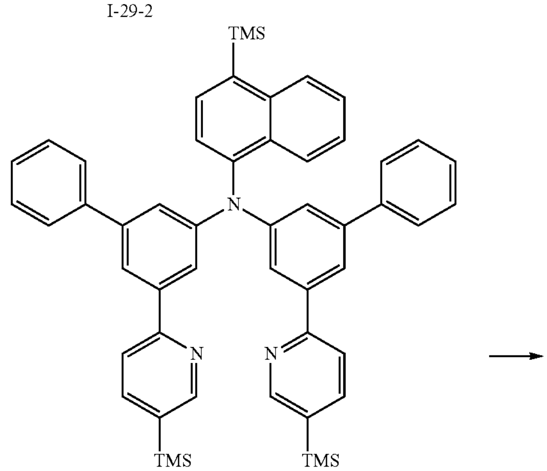

I-30-1

-continued

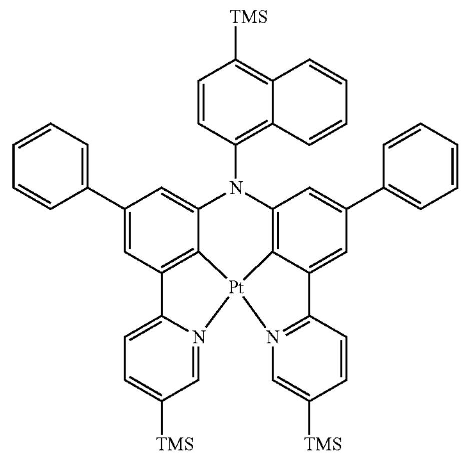

30

1) Synthesis of Intermediate I-30-1

Intermediate I-30-1 (yield of 70%) was synthesized in the same manner as Intermediate I-29-1 in Synthesis Example 28, except that 4-(trimethylsilyl)naphthalene-1-amine was used instead of 2-aminobiphenyl. The obtained compound was confirmed by LC-MS.

LC-MS m/z=818 $(M+H)^+$

2) Synthesis of Compound 30

Compound 30 (yield of 17%) was synthesized in the same manner as Compound 28 in Synthesis Example 27, except that Intermediate I-30-1 was used instead of Intermediate I-28-1. The obtained compound was confirmed by LC-MS.

LC-MS m/z=1011 $(M+H)^+$

Synthesis Example 30: Synthesis of Compound 31

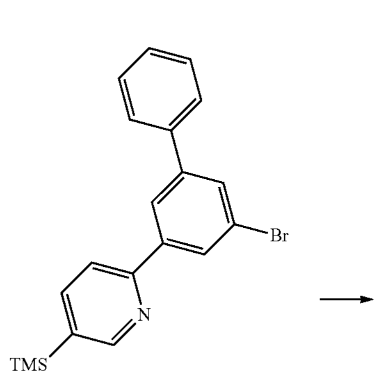

I-29-2

-continued

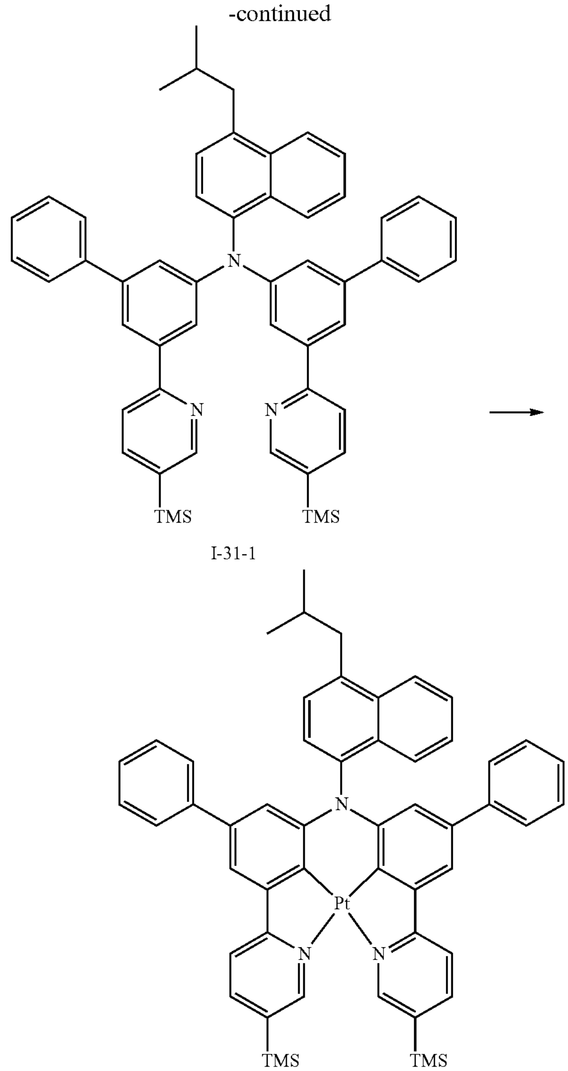

I-31-1

31

1) Synthesis of Intermediate I-31-1

Intermediate I-31-1 (yield of 75%) was synthesized in the same manner as Intermediate I-29-1 in Synthesis Example 28, except that 4-isobutylnaphthalene-1-amine was used instead of 2-aminobiphenyl. The obtained compound was confirmed by LC-MS.

LC-MS m/z=802 $(M+H)^+$

2) Synthesis of Compound 31

Compound 31 (yield of 15%) was synthesized in the same manner as Compound 28 in Synthesis Example 27, except that Intermediate I-31-1 was used instead of Intermediate I-28-1. The obtained compound was confirmed by LCMS and $^1$H NMR.

LC-MS m/z=995 $(M+H)^+$ $^1$H NMR (300 MHz, $CD_2Cl_2$) δ=9.04 (s, 2H), 8.52 (br s, 1H), 8.36-8.34 (m, 3H), 7.75-7.69 (m, 8H), 7.49-7.41 (m, 8H), 7.38-7.36 (m, 2H), 7.29 (br s, 1H), 6.84 (s, 1H), 2.86 (d, 2H), 1.86 (q, 1H), 0.91 (d, 6H).

Synthesis Example 31: Synthesis of Compound 32

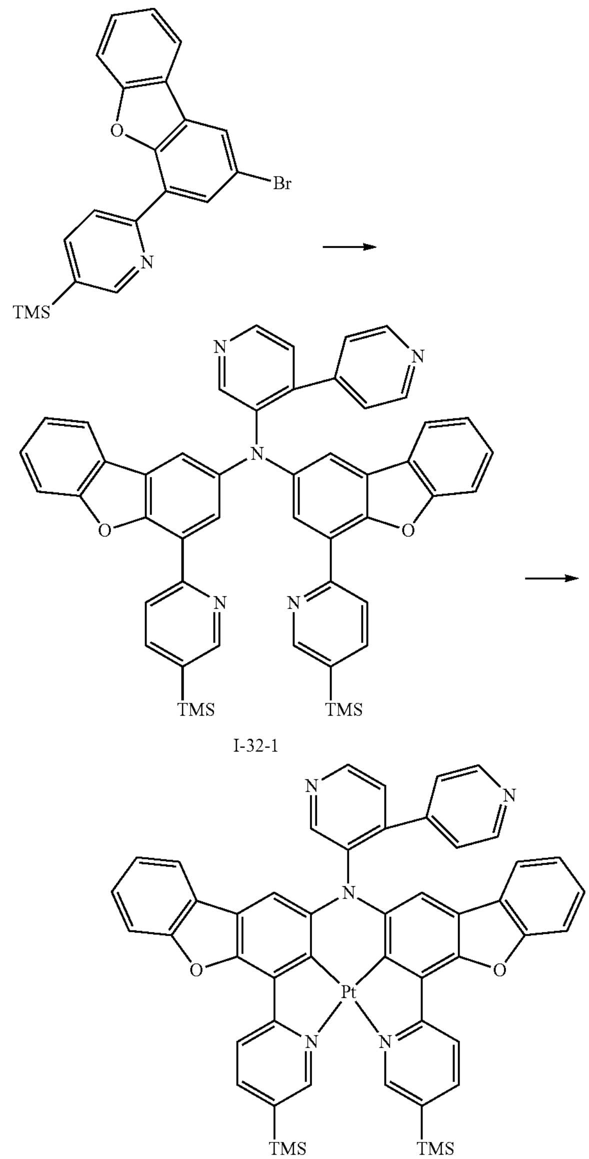

I-32-1

32

1) Synthesis of Intermediate I-32-1

Intermediate I-32-1 (yield of 50%) was synthesized in the same manner as Intermediate I-29-1 in Synthesis Example 28, except that 2-(2-bromodibenzo[b,d]furan-4-yl)-5-(trimethylsilyl)pyridine was used instead of Intermediate I-29-2, and [4,4'-bi pyridine]-3-amine was used instead of 2-aminobiphenyl. The obtained compound was confirmed by LC-MS.

LC-MS m/z=802 $(M+H)^+$

2) Synthesis of Compound 32

Compound 32 (yield of 13%) was synthesized in the same manner as Compound 28 in Synthesis Example 27, except that Intermediate I-32-1 was used instead of Intermediate I-28-1. The obtained compound was confirmed by LCMS and $^1$H NMR.

LC-MS m/z=995 $(M+H)^+$

$^1$H NMR (300 MHz, $CD_2Cl_2$) δ=9.18 (s, 2H), 8.92 (d, 2H), 8.65 (d, 1H), 8.42 (s, 2H), 8.23 (s, 1H), 8.01-7.97 (m, 3H), 7.80-7.77 (m, 3H), 7.61 (d, 2H), 7.54 (d, 2H), 7.39-7.31 (m, 4H).

Synthesis Example 32: Synthesis of Compound 33

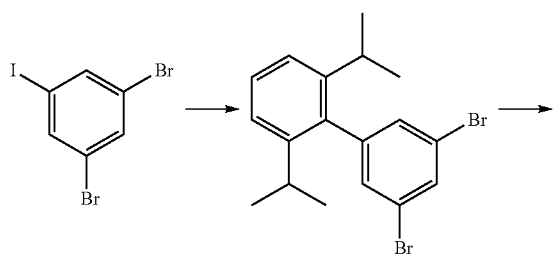

I-33-4

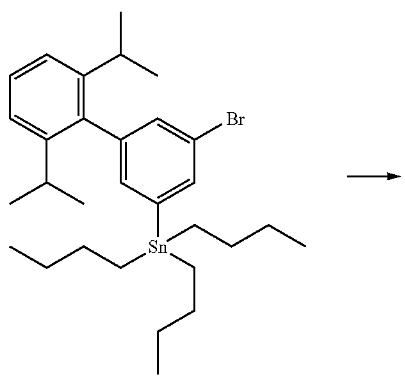

I-33-3

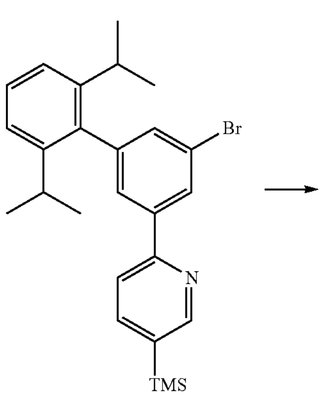

I-33-2

-continued

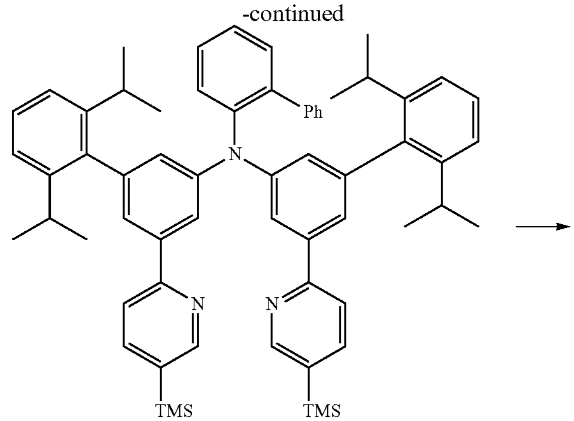

I-33-1

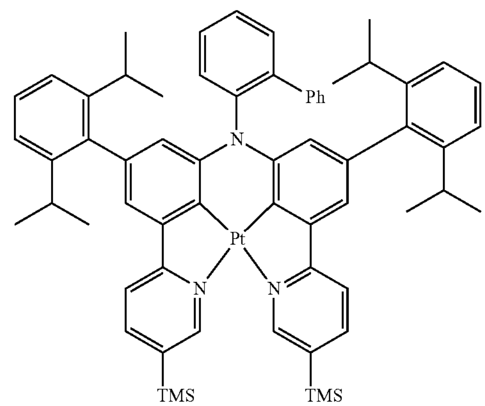

33

1) Synthesis of Intermediate I-33-4

9.1 g (25.3 mmol) of 1,3-dibromo-5-iodobenzene, 200 ml of 1,4-dioxane, and 100 ml of distilled water were added to a reactor. 5.2 g (25.3 mmol) of 2,6-diisopropylphenyl boronic acid, 1.5 g (1.3 mmol) of $Pd(PPh_3)_4$, and 7.8 g (45.5 mmol) of $Ba(OH)_2$ were added thereto, and the mixture was heated at a temperature of 80° C. for 18 hours. Once the reaction was completed, the mixture was condensed under reduced pressure, and dissolved in 200 ml of dichloromethane, and filtered through diatomite. An organic layer obtained therefrom was dried by using magnesium sulfate, distilled under reduced pressure, and purified by liquid chromatography, thereby completing the preparation of 8.1 g (20.5 mmol, yield of 81%) of Intermediate I-33-4.

LC-MS m/z=394 $(M+H)^+$

2) Synthesis of Intermediate I-33-3

6.0 g (15.1 mmol) of Intermediate I-33-4 was dissolved in 150 ml of diethyl ether. Then, at a temperature of −78° C., 6.6 ml of n-BuLi (2.5 M solution in hexane) was slowly added thereto, and stirred for about 1 hour. Then, tri-n-butyltin chloride was slowly added dropwise thereto and stirred for about 2 hours. Then, the resultant was slowly heated at room temperature and stirred for about 18 hours. Once the reaction was completed, an extraction process was performed thereon by using 80 ml of distilled water and 100 ml of ethyl acetate. An organic layer obtained therefrom was dried by using magnesium sulfate and distilled under reduced pressure, thereby completing the preparation of Intermediate I-33-3. The obtained Intermediate I-33-3 was used for the following reaction without any subjection to a separate purification process.

3) Synthesis of Intermediate I-33-2

11.8 g (19.5 mmol) of Intermediate I-33-3, 4.5 g (19.5 mmol) of 2-bromo-5-(trimethylsilyl)pyridine were added to a reactor. Then, 150 ml of toluene was added thereto. Then, 1.0 g (1.0 mmol) of $Pd(PPh_3)_4$ and 2.3 g (40.0 mmol) of KF were added thereto, and the mixture was heated at a temperature of 120° C. for 12 hours. Once the reaction was completed, the mixture was extracted by using 100 ml of ethyl acetate, and a saturated $NH_4Cl$ aqueous solution. An organic layer obtained therefrom was dried by using magnesium sulfate, and distilled under reduced pressure, and purified by liquid chromatography, thereby completing the preparation of 6.2 g (13.3 mmol, yield of 68%) of Intermediate I-33-2.

LC-MS m/z=466 $(M+H)^+$

4) Synthesis of Intermediate I-33-1

Intermediate I-33-1 (yield of 65%) was synthesized in the same manner as Intermediate I-29-1 in Synthesis Example 28, except that Intermediate I-33-2 was used instead of Intermediate I-29-2. The obtained compound was confirmed by LC-MS.

LC-MS m/z=940 $(M+H)^+$

5) Synthesis of Compound 33

Compound 33 (yield of 30%) was synthesized in the same manner as Compound 28 in Synthesis Example 27, except that Intermediate I-33-1 was used instead of Intermediate I-28-1. The obtained compound was confirmed by LCMS and $^1H$ NMR.

LC-MS m/z=1133 $(M+H)^+$ $^1H$ NMR (300 MHz, $CD_2Cl_2$) δ=8.66 (s, 2H), 7.75 (d, 2H), 7.61 (br s, 2H), 7.45-7.39 (m, 3H), 7.32-7.24 (m, 12H), 7.14-7.09 (m, 7H), 6.84-6.83 (m, 2H), 2.68 (br s, 4H), 1.06 (d, 12H), 0.94 (d, 12H), 0.30 (s, 18H).

Synthesis Example 33: Synthesis of Compound 34

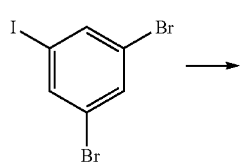

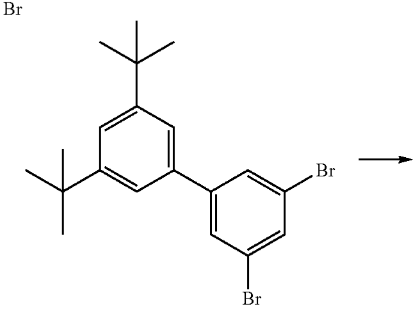

I-34-4

-continued

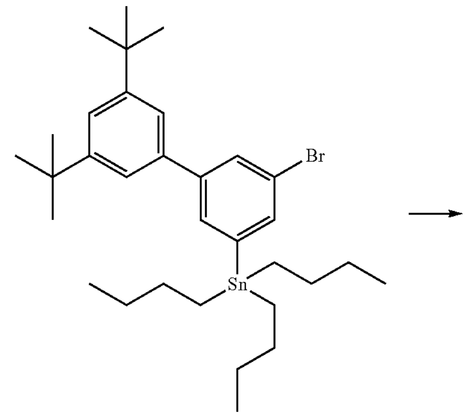

I-34-3

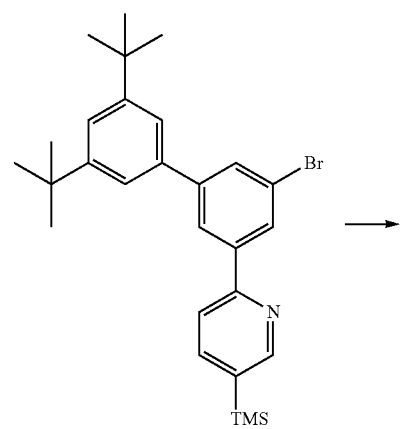

I-34-2

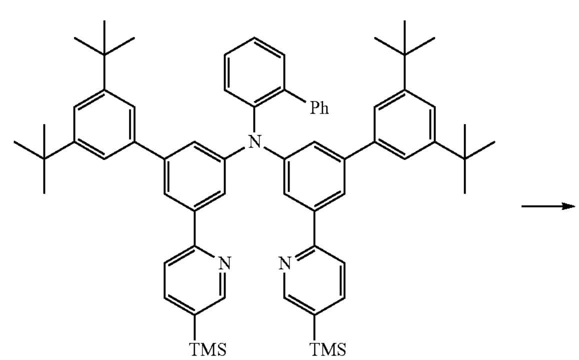

I-34-1

-continued

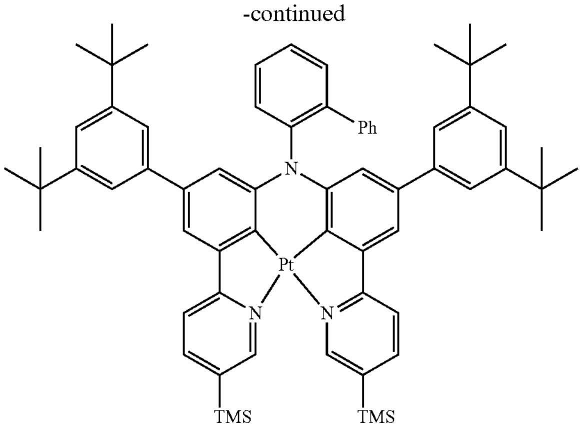

34

1) Synthesis of Intermediate I-34-4

Intermediate I-34-4 was synthesized in the same manner as Intermediate I-33-4 in Synthesis Example 32, except that 3,5-di-tert-butylphenyl boronic acid was used instead of 2,6-diisopropylphenyl boronic acid.

2) Synthesis of Intermediate I-34-3

Intermediate I-34-3 was synthesized in the same manner as Intermediate I-33-3 in Synthesis Example 32, except that Intermediate I-34-4 was used instead of Intermediate I-33-4.

3) Synthesis of Intermediate I-34-2

Intermediate I-34-2 was synthesized in the same manner as Intermediate I-33-2 in Synthesis Example 32, except that Intermediate I-34-3 was used instead of Intermediate I-33-3.

4) Synthesis of Intermediate I-34-1

Intermediate I-34-1 was synthesized in the same manner as Intermediate I-29-1 in Synthesis Example 28, except that Intermediate I-34-2 was used instead of Intermediate I-29-2, and 2-aminobiphenyl was used instead of 2,4,6-trimethyl-aniline.

5) Synthesis of Compound 34

Compound 34 (yield of 25%) was synthesized in the same manner as Compound 28 in Synthesis Example 27, except that Intermediate I-34-1 was used instead of Intermediate I-28-1. The obtained compound was confirmed by LC-MS.

LC-MS m/z=1189 $(M+H)^+$

Synthesis Example 34: Synthesis of Compound 35

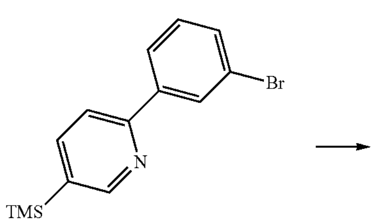

I-3-2

-continued

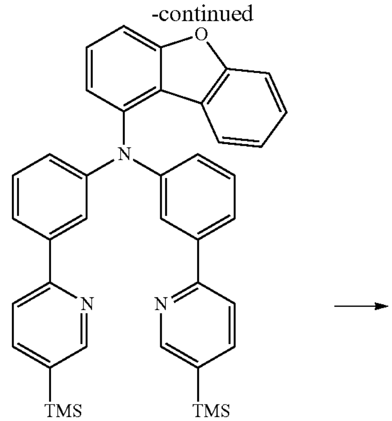

I-35-1

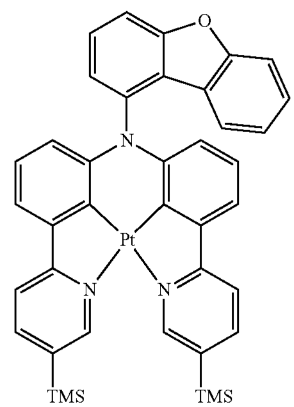

35

1) Synthesis of Intermediate I-35-1

Intermediate I-35-1 (yield of 70%) was synthesized in the same manner as Intermediate I-8-1 in Synthesis Example 8, except that dibenzo[b,d]furan-1-amine was used instead of 3-aminobiphenyl. The obtained compound was confirmed by LC-MS.

LC-MS m/z=634 $(M+H)^+$

2) Synthesis of Compound 35

Compound 35 (yield of 30%) was synthesized in the same manner as Compound 8 in Synthesis Example 8, except that Intermediate I-35-1 was used instead of Intermediate I-8-1. The obtained compound was confirmed by LCMS and $^1H$ NMR.

LC-MS m/z=827 $(M+H)^+$ $^1H$ NMR (300 MHz, $CDCl_3$) δ=8.76 (br s, 2H), 7.98 (d, 1H), 7.83-7.79 (m, 4H), 7.70-7.68 (m, 2H), 7.56-7.50 (m, 3H), 7.34-7.22 (m, 6H), 6.98 (br s, 1H), 0.28 (s, 18H).

Synthesis Example 35: Synthesis of Compound 36

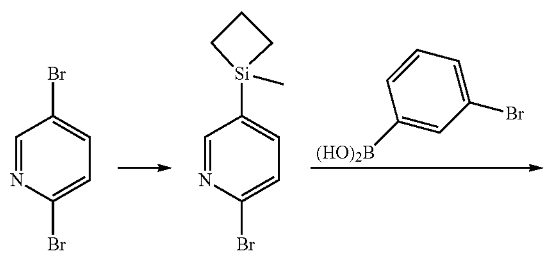

I-36-3

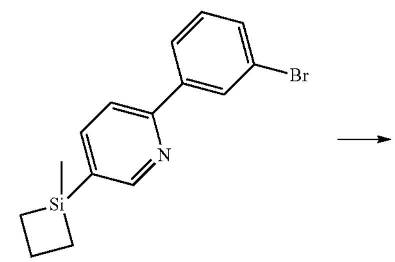

I-36-2

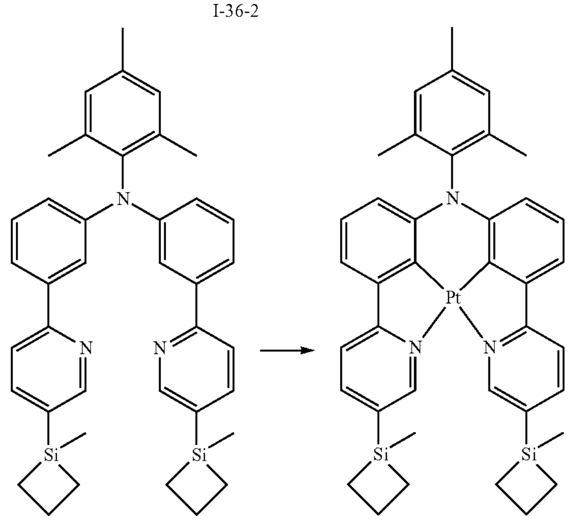

I-36-1 36

1) Synthesis of Intermediate I-36-3

Intermediate I-36-3 (yield of 70%) was synthesized in the same manner as Intermediate I-2-3 in Synthesis Example 3, except that 1-chloro-1-methylsiletane was used instead of chlorotrimethylsilane. The obtained compound was confirmed by LC-MS.

LC-MS m/z=242 (M+H)$^+$

2) Synthesis of Intermediate I-36-2

Intermediate I-36-2 (yield of 80%) was synthesized in the same manner as Intermediate I-2-2 in Synthesis Example 3, except that Intermediate I-36-3 was used instead of Intermediate I-2-3. The obtained compound was confirmed by LC-MS.

LC-MS m/z=318 (M+H)$^+$

3) Synthesis of Intermediate I-36-1

Intermediate I-36-1 (yield of 62%) was synthesized in the same manner as Intermediate I-2-1 in Synthesis Example 3, except that Intermediate I-36-2 was used instead of Intermediate I-2-2. The obtained compound was confirmed by LC-MS.

LC-MS m/z=610 (M+H)$^+$

4) Synthesis of Compound 36

Compound 36 (yield of 25%) was synthesized in the same manner as Compound 3 in Synthesis Example 1, except that Intermediate I-36-1 was used instead of Intermediate I-3-1. The obtained compound was confirmed by LCMS and $^1$H NMR.

LC-MS m/z=803 (M+H)$^+$

Synthesis Example 36: Synthesis of Compound 37

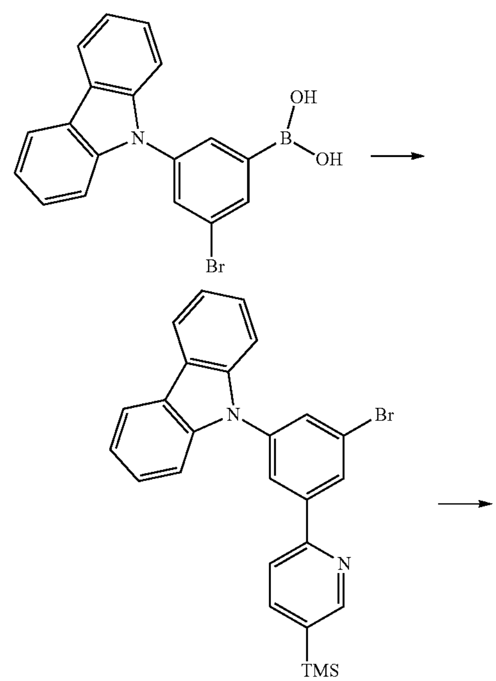

I-37-2

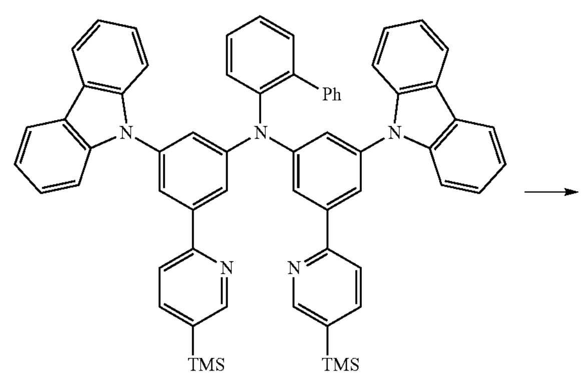

I-37-1

-continued

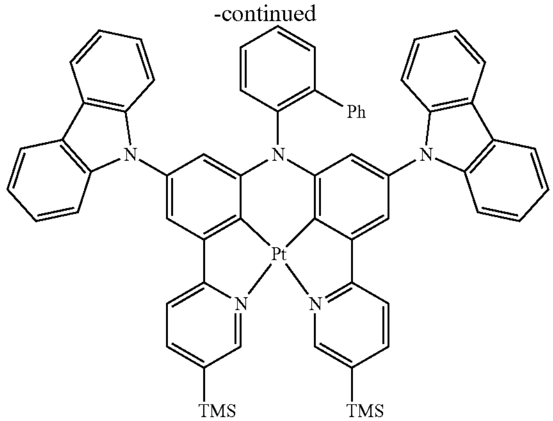

37

1) Synthesis of Intermediate I-37-2

Intermediate I-37-2 (yield of 75%) was synthesized in the same manner as Intermediate I-2-2 in Synthesis Example 3, except that (3-bromo-5-(9H-carbazole-9-yl)phenyl)boronic acid was used instead of Intermediate I-2-3. The obtained compound was confirmed by LC-MS.

LC-MS m/z=471 $(M+H)^+$

2) Synthesis of Intermediate I-37-1

Intermediate I-37-1 (yield of 55%) was synthesized in the same manner as Intermediate I-2-1 in Synthesis Example 3, except that Intermediate I-37-2 was used instead of Intermediate I-2-2. The obtained compound was confirmed by LC-MS.

LC-MS m/z=950 $(M+H)^+$

3) Synthesis of Compound 37

Compound 37 (yield of 20%) was synthesized in the same manner as Compound 3 in Synthesis Example 1, except that Intermediate I-37-1 was used instead of Intermediate I-2-1. The obtained compound was confirmed by LCMS and $^1$H NMR.

LC-MS m/z=1143 $(M+H)^+$

Example 1

An ITO/Ag/ITO (70 Å/1,000 Å/70 Å) substrate (anode) was cut to a size of 50 mm×50 mm×0.5 mm (mm=millimeter), sonicated by using iso-propyl alcohol and distilled water, each for 5 minutes, washed by exposure to ultraviolet rays for 30 minutes, and then—to ozone. The resultant substrate was mounted on a deposition apparatus.

2-TNATA was vacuum-deposited on the substrate to form a hole injection layer having a thickness of 600 Å, and then, 4,4'-bis[N-(1-naphthyl)-N-phenylamino]biphenyl (NPB) was vacuum-deposited on the hole injection layer to form a hole transport layer having a thickness of 1,000 Å.

CBP(host) and Compound 17 (dopant) were co-deposited at a weight ratio of 91:9 on the hole transport layer to form an emission layer having a thickness of 250 Å.

BCP was vacuum-deposited on the emission layer to form a hole blocking layer having a thickness of 50 Å. $Alq_3$ was deposited on the hole blocking layer to form an electron transport layer having a thickness of 350 Å, and LiF was deposited on the electron transport layer to form an electron injection layer having a thickness of 10 Å.

Mg and Ag were co-deposited at a weight ratio of 90:10 on the electron injection layer to form a cathode having a thickness of 120 Å, thereby completing manufacture of an organic light-emitting device.

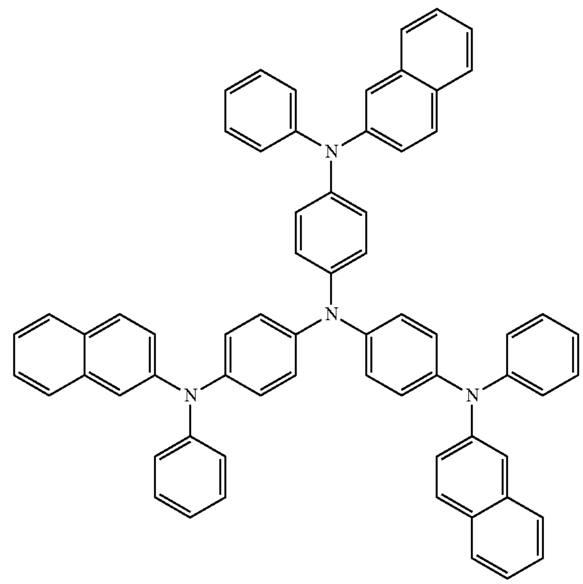

2-TNATA

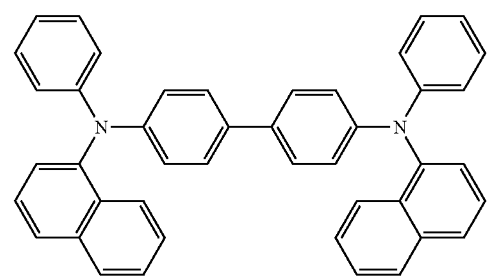

NPB

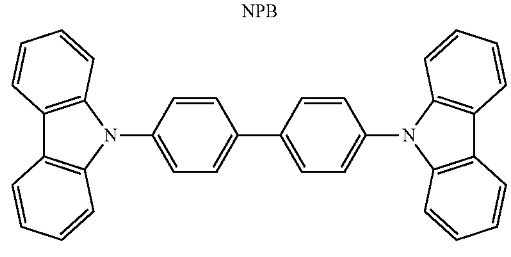

CBP

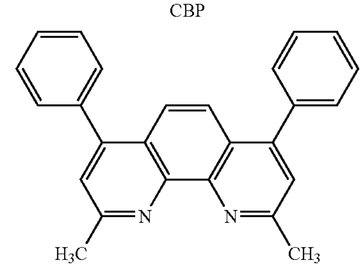

BCP

Example 2

An organic light-emitting device was manufactured in the same manner as in Example 1, except that, in forming the emission layer, Compound 24 was used instead of Compound 17.

Example 3

An organic light-emitting device was manufactured in the same manner as in Example 1, except that, in forming the emission layer, Compound 25 was used instead of Compound 17.

Example 4

An ITO/Ag/ITO (70 Å/1,000 Å/70 Å) substrate (anode) was cut to a size of 50 mm×50 mm×0.5 mm, sonicated by using iso-propyl alcohol and distilled water, each for 5 minutes, washed by exposure to ultraviolet rays for 30 minutes, and then—to ozone. The resultant substrate was mounted on a deposition apparatus.

2-TNATA was vacuum-deposited on the substrate to form a hole injection layer having a thickness of 600 Å, 4,4'-bis [N-(1-naphthyl)-N-phenylamino]biphenyl (NPB) was vacuum-deposited on the hole injection layer to form a hole transport layer having a thickness of 1,350 Å.

CBP(host) and Compound 3 (dopant) were co-deposited at a weight ratio of 94:6 on the hole transport layer to form an emission layer having a thickness of 400 Å.

BCP was vacuum-deposited on the emission layer to form a hole blocking layer having a thickness of 50 Å. $Alq_3$ was deposited on the hole blocking layer to form an electron transport layer having a thickness of 350 Å, and LiF was deposited on the electron transport layer to form an electron injection layer having a thickness of 10 Å.

Mg and Ag were co-deposited at a weight ratio of 90:10 on the electron injection layer to form a cathode having a thickness of 120 Å, thereby completing manufacture of an organic light-emitting device.

Example 5

An organic light-emitting device was manufactured in the same manner as in Example 4, except that, in forming the emission layer, Compound 7 was used instead of Compound 3.

Example 6

An organic light-emitting device was manufactured in the same manner as in Example 4, except that, in forming the emission layer, Compound 11 was used instead of Compound 3.

Example 7

An organic light-emitting device was manufactured in the same manner as in Example 4, except that, in forming the emission layer, Compound 13 was used instead of Compound 3.

Example 8

An organic light-emitting device was manufactured in the same manner as in Example 4, except that, in forming the emission layer, Compound 28 was used instead of Compound 3.

Example 9

An organic light-emitting device was manufactured in the same manner as in Example 4, except that, in forming the emission layer, Compound 29 was used instead of Compound 3.

Comparative Example 1

An organic light-emitting device was manufactured in the same manner as in Example 1, except that, in forming the emission layer, Compound A was used instead of Compound 17:

Compound A

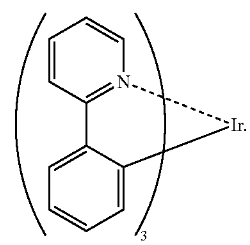

Comparative Example 2

An organic light-emitting device was manufactured in the same manner as in Example 1, except that, in forming the emission layer, Compound B was used instead of Compound 17:

Compound B

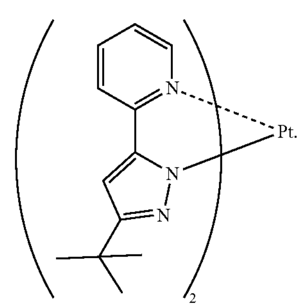

Comparative Example 3

An organic light-emitting device was manufactured in the same manner as in Example 4, except that, in forming the emission layer, Compound C was used instead of Compound 3:

Compound C

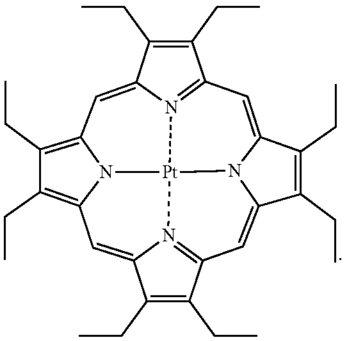

Comparative Example 4

An organic light-emitting device was manufactured in the same manner as in Example 4, except that, in forming the emission layer, Compound D was used instead of Compound 3:

Compound D

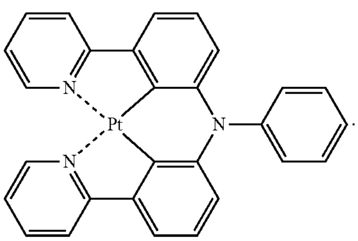

Comparative Example 4

An organic light-emitting device was manufactured in the same manner as in Example 4, except that, in forming the emission layer, Compound E was used instead of Compound 3:

Compound E

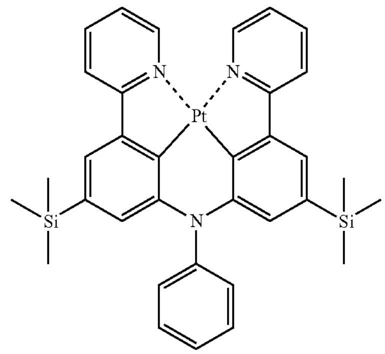

Evaluation Example 1: Evaluation on characteristics of organic light-emitting devices.

The driving voltage, current density, luminance, efficiency, emission color, CIE color coordinate, and lifespan ($LT_{97}$) of each of the organic light-emitting devices manufactured according to Examples 1 to 9 and Comparative Examples 1 to 5 were evaluated. Evaluation results are shown in Table 1. $LT_{97}$ refers to a lifetime, and $LT_{97}$ indicates a period of time that elapses until the luminance is reduced to 97% of the initial luminance:

TABLE 1

| | Dopant | Driving voltage (V) | Current density (mA/cm$^2$) | Luminance (cd/m$^2$) | Efficiency (cd/A) | Emission color | CIE color coordinate (x, y) | $LT_{97}$ (hr) |
|---|---|---|---|---|---|---|---|---|
| Example 1 | Compound 17 | 5.6 | 10 | 5,540 | 55.4 | Green | 0.27, 0.72 | 90 |
| Example 2 | Compound 24 | 5.6 | 10 | 5,864 | 58.6 | Green | 0.24, 0.70 | 95 |
| Example 3 | Compound 25 | 5.5 | 10 | 6,296 | 62.9 | Green | 0.26, 0.71 | 98 |
| Example 4 | Compound 3 | 5.5 | 10 | 3,010 | 30.1 | Red | 0.66, 0.34 | 1600 |
| Example 5 | Compound 7 | 5.3 | 10 | 3,227 | 32.3 | Red | 0.65, 0.35 | 1800 |
| Example 6 | Compound 11 | 5.5 | 10 | 3,570 | 35.7 | Red | 0.64, 0.32 | 1200 |
| Example 7 | Compound 13 | 5.6 | 10 | 3,387 | 33.8 | Red | 0.63, 0.34 | 1000 |
| Example 8 | Compound 28 | 5.3 | 10 | 3,608 | 36.1 | Red | 0.64, 0.34 | 1000 |
| Example 9 | Compound 29 | 5.3 | 10 | 3,485 | 34.9 | Red | 0.65, 0.33 | 1300 |
| Comparative Example 1 | Compound A | 6.8 | 10 | 4,766 | 47.7 | Green | 0.27, 0.70 | 61 |
| Comparative Example 2 | Compound B | 6.0 | 10 | 5,237 | 52.3 | Green | 0.25, 0.73 | 82 |
| Comparative Example 3 | Compound C | 7.3 | 10 | 2,212 | 22.1 | Red | 0.67, 0.32 | 80 |
| Comparative Example 4 | Compound D | 5.7 | 10 | 2,530 | 25.3 | Red | 0.63, 0.33 | 210 |
| Comparative Example 5 | Compound E | 5.9 | 10 | 1,213 | 12.1 | Red | 0.62, 0.32 | 375 |

Referring to Table 1, the driving voltage of each of the organic light-emitting devices of Examples 1 to 3 is about 0.5 to 1.2 volts (V) lower than that of each of the organic light-emitting devices of Comparative Examples 1 and 2. In addition, the organic light-emitting devices of Examples 1 to 3 have higher efficiency and a longer lifespan and better I-V-L characteristics than those of Comparative Examples 1 and 2. In addition, the organic light-emitting devices of Examples 1 to 3 have a higher level of luminance than the organic light-emitting devices of Comparative Examples 1 to 2.

The organic light-emitting devices of Examples 4 to 9 have higher efficiency and longer lifespan and better I-V-L characteristics than those of Comparative Examples 3 to 5. In addition, the organic light-emitting devices of Examples 4 to 9 have a higher level of luminance and a longer lifespan than those of Comparative Examples 3 to 5.

In detail, as in Example 1, when the organometallic compound represented by Formula 1 was used as a green phosphorescent dopant, compared to Comparative Example 1, the driving voltage was increased by 1.2 V or more, the efficiency was increased to 110%, and the lifespan was increased to 150%. In the case of Example 3, compared to Comparative Example 2, the driving voltage was improved by 0.5 V or more, the efficiency was increased to 120%, and the lifespan was increased to 120%.

As in Examples 4 to 9, when the organometallic compound represented by Formula 1 was used as a red phosphorescent dopant, compared to Comparative Example 3, the driving voltage was increased by about 2.0 V, the efficiency was increased to 140%, and the lifespan was increased to 1,000% or more.

The organometallic compounds according to embodiments have excellent electric characteristics and thermal stability. Accordingly, an organic light-emitting device including the organometallic compound may have excellent driving voltage, current density, efficiency, power, color purity, and lifespan characteristics.

While the inventive concept has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. An organometallic compound represented by Formula 1:

Formula 1

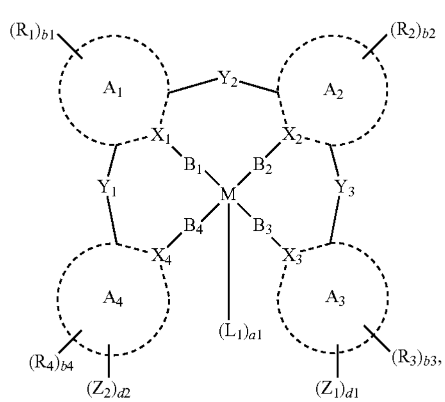

wherein, in Formula 1,

M is selected from iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), and thulium (Tm);

$A_1$ to $A_4$ are each independently selected from a $C_5$-$C_{20}$ carbocyclic group and a $C_1$-$C_{20}$ heterocyclic group;

$X_1$ to $X_4$ are each independently selected from a carbon atom (C) and a nitrogen atom (N), provided that at least one selected from $X_3$ and $X_4$ is N;

$B_1$ to $B_4$ are each independently selected from a single bond, O, and S;

$Y_1$ to $Y_3$ are each independently selected from a single bond and a divalent linking group, wherein at least one selected from $Y_1$ to $Y_3$ is a divalent linking group each independently represented by one selected from *—O—* ', *—S—* ', and one of Formulae 8-1:

8-1

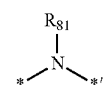

wherein, in Formulae 8-1, $R_{81}$ is selected from hydrogen, deuterium, —F, —$C_1$, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —$C_1$, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, $—CD_3$, $—CD_2H$, $—CDH_2$, $—CF_3$, $—CF_2H$, $—CFH_2$, $—Si(CH_3)_3$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and

* and *' each independently indicate a binding site to a neighboring atom, $Z_1$ and $Z_2$ are each independently represented by one of Formulae 2-1 and 2-2, wherein at least one of $Z_1$ and $Z_2$ is represented by Formula 2-2:

2-1

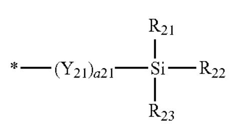

2-2

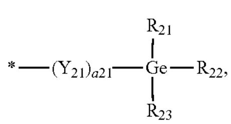

wherein, in Formulae 2-1 and 2-2, $Y_{21}$ is a substituted or unsubstituted $C_1$-$C_{10}$ alkylene group and a substituted or unsubstituted $C_2$-$C_{10}$ alkenylene group;

a21 is selected from 0, 1, 2, 3, 4, and 5;

$R_{21}$ to $R_{23}$ are each independently selected from hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group;

provided that when a21 is 0, then $Y_1$ and $Y_3$ are each a single bond, $Y_2$ is represented by Formulae 8-1, $X_4$ is N, and $A_1$ to $A_4$ are each independently selected from a benzene group, a naphthalene group, a pyridine group, a pyrimidine group, a pyrazine group, a quinoline group, an isoquinoline group, a dibenzofuran group, and a dibenzothiophene group; and at least one selected from $A_3$ and $A_4$ is selected from a pyridine group, a pyrimidine group, a pyrazine group, a quinoline group, and an isoquinoline group d1 and d2 are each independently selected from 0, 1, 2, 3, and 4, wherein the sum of d1 and d2 is at least 1;

when d1 is 2 or more, groups $Z_1$ are identical to or different from each other; when d2 is 2 or more, groups $Z_2$ are identical to or different from each other;

when $X_3$ is N, d1 is selected from 1, 2, 3, and 4; when $X_4$ is N, d2 is selected from 1, 2, 3, and 4;

$R_1$ to $R_4$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, $—C(=O)(Q_7)$, and —$N(Q_7)(Q_8)$; $R_1$ and $R_4$ or $R_2$ and $R_3$ are optionally linked to form a saturated or unsaturated ring;

$Q_7$ and $Q_8$ are each independently selected from a $C_1$-$C_{60}$ alkyl group and a $C_6$-$C_{60}$ aryl group;

b1 to b4 are each independently selected from 1, 2, 3, and 4;

Li is a monodentate ligand;

a1 is selected from 0, 1, and 2; and

* indicates a binding site to a neighboring atom.

2. The organometallic compound of claim 1, wherein M is selected from Ir, Pt, and Os.

3. The organometallic compound of claim 1, wherein $A_1$ to $A_4$ are each independently selected from a benzene group, a naphthalene group, a pyrrole group, an imidazole group, a pyrazole group, a thiazole group, an isothiazole group, an oxazole group, an isoxazole group, a triazole group, an indazole group, a tetrahydroindazole group, a pyridine group, a thiazine group, an oxazine group, a pyrimidine group, a pyrazine group, a pyridazine group, a triazine group, a quinoline group, an isoquinoline group, a quinoxaline group, a quinazoline group, naphthyridine group, an indole group, a benzimidazole group, a benzothiazole group, a benzoisothiazole group, a benzoxazole group, a benzoiso-oxazole group, a benzothiazine group, a benzoxazine group, a dibenzofuran group, and a dibenzothiophene group;

at least one selected from $A_3$ and $A_4$ is selected from a pyrrole group, an imidazole group, a pyrazole group, a thiazole group, an isothiazole group, an oxazole group, an isoxazole group, a triazole group, an indazole group, a tetrahydroindazole group, a pyridine group, a thiazine group, an oxazine group, a pyrimidine group, a pyrazine group, a pyridazine group, a triazine group, a quinoline group, an isoquinoline group, a quinoxaline group, a quinazoline group, naphthyridine group, an indole group, a benzimidazole group, a benzothiazole group, a benzoisothiazole group, a benzoxazole group, a benzoiso-oxazole group, a benzothiazine group, and a benzoxazine group.

4. The organometallic compound of claim 1, wherein $A_1$ to $A_4$ are each independently selected from a benzene group, a naphthalene group, a pyridine group, a pyrimidine group, a pyrazine group, a quinoline group, an isoquinoline group, a dibenzofuran group, and a dibenzothiophene group; and at least one selected from $A_3$ and $A_4$ is selected from a pyridine group, a pyrimidine group, a pyrazine group, a quinoline group, and an isoquinoline group.

5. The organometallic compound of claim 1, wherein $Y_1$ and $Y_3$ are each independently selected from a single bond and a divalent linking group, $Y_2$ is represented by Formula 8-1.

6. The organometallic compound of claim 1, wherein $Y_1$ and $Y_3$ are each independently selected from a single bond and a divalent linking group, $Y_2$ is represented by one of Formulae 9-1 to 9-58; and the divalent linking group is represented by one selected from *—O—*', *—S—*' and one of Formulae 9-1 to 9-70:

9-1

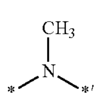

-continued 9-2

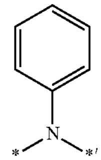

9-3

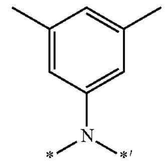

9-4

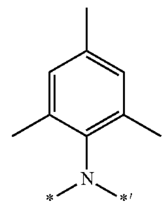

9-5

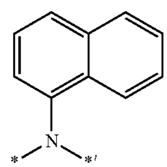

9-6

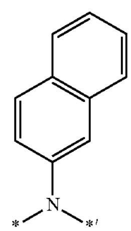

9-7

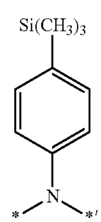

9-8

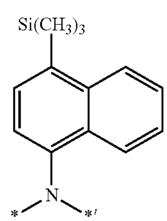

9-9

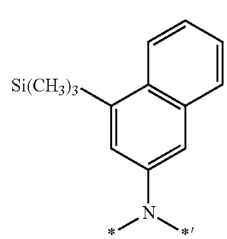

-continued
9-10
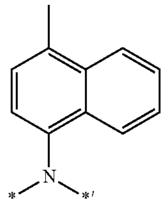
9-11
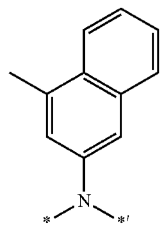
9-12
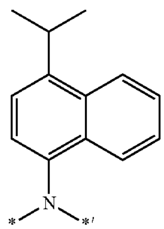
9-13
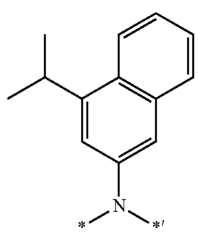
9-14
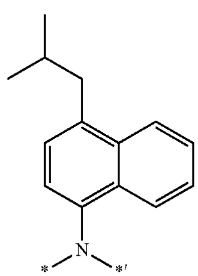
9-15
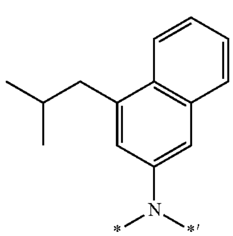
9-16
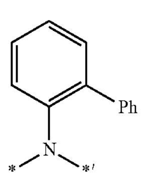
-continued
9-17
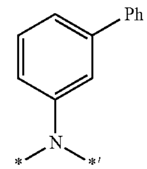
9-18
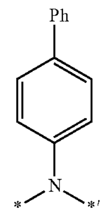
9-19
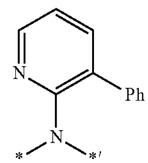
9-20
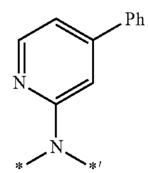
9-21
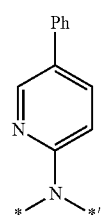
9-22
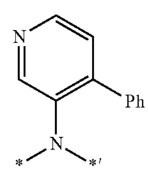
9-23
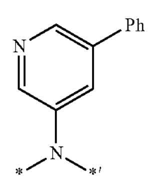
9-24
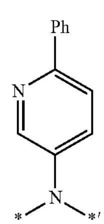

-continued
9-25
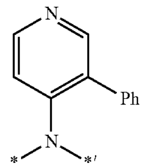
9-26
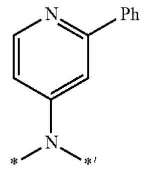
9-27
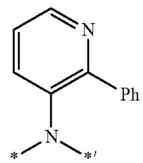
9-28
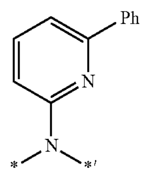
9-29
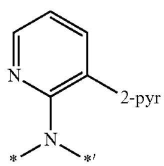
9-30
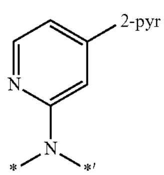
9-31
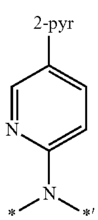
9-32
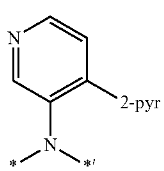
9-33
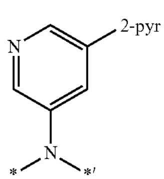
-continued
9-34
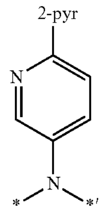
9-35
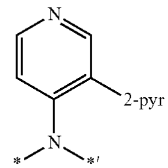
9-36
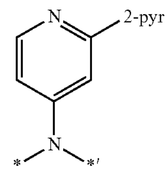
9-37
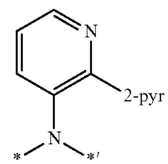
9-38
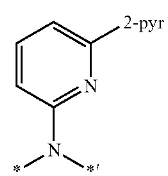
9-39
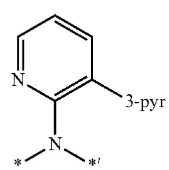
9-40
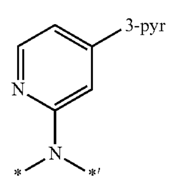
9-41
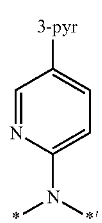

-continued
9-42
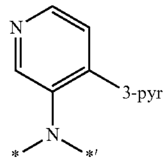
9-43
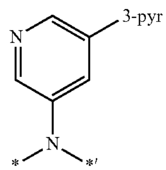
9-44
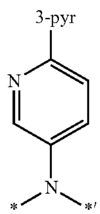
9-45
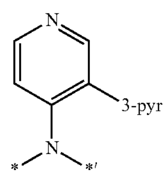
9-46
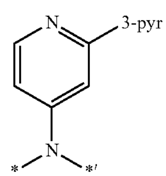
9-47
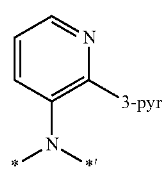
9-48
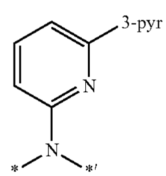
9-49
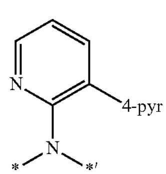
9-50
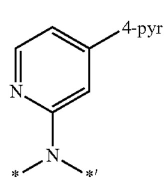
-continued
9-51
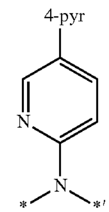
9-52
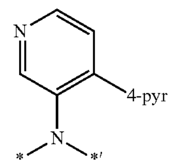
9-53
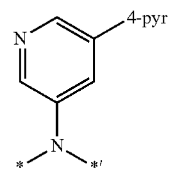
9-54
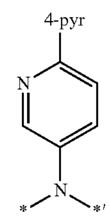
9-55
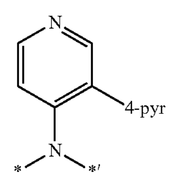
9-56
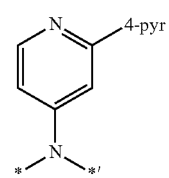
9-57
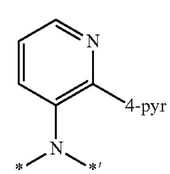
9-58
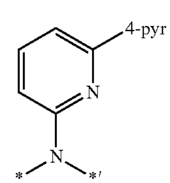
9-59
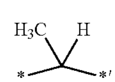

-continued 9-60

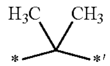

9-61

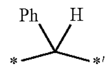

9-62

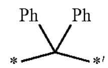

9-63

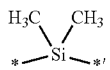

9-64

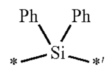

9-65

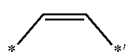

9-66

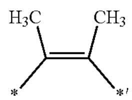

9-67

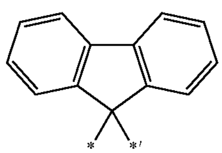

9-68

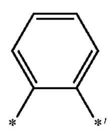

9-69

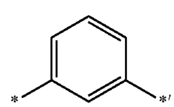

9-70

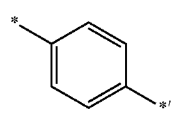

wherein, in Formulae 9-1 to 9-70,

Ph refers to a phenyl group;

2-pyr refers to a 2-pyridinyl group, 3-pyr refers to a 3-pyridinyl group, and 4-pyr refers to a 4-pyridinyl group; and

* and *' each independently indicate a binding site to a neighboring atom.

7. The organometallic compound of claim 1, wherein $R_{21}=R_{22}=R_{23}$;

$R_{21}=R_{22}$, and $R_{22}\neq R_{23}$; or $R_{21}\neq R_{22}$, $R_{22}\neq R_{23}$, and $R_{23}\neq R_{21}$.

8. The organometallic compound of claim 1, wherein $R_{21}$ to $R_{23}$ are each independently selected from:

hydrogen, deuterium, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group.

9. The organometallic compound of claim 1, wherein $R_{21}$ to $R_{23}$ are each independently selected from:

hydrogen, deuterium, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group, each substituted with at least one selected from deuterium and a phenyl group;

a phenyl group and a naphthyl group; and a phenyl group and a naphthyl group, each substituted with at least one selected from deuterium, $—CD_3$, $—CD_2H$, $—CDH_2$, $—CF_3$, $—CF_2H$, $—CFH_2$, a $C_1$-$C_{20}$ alkyl group, and a phenyl group.

10. The organometallic compound of claim 1, wherein $Z_1$ and $Z_2$ are each independently represented by one of Formulae 2-11 and 2-12:

2-11

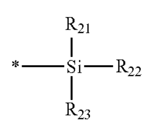

2-12

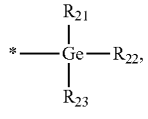

wherein, in Formulae 2-11 and 2-12, $R_{21}$ to $R_{23}$ are each independently selected from a methyl group, an ethyl group, an n-propyl group, an iso-propyl group, an n-butyl group, an iso-butyl group, a sec-butyl group, a tert-butyl group, a phenyl group, and a naphthyl group; and

* indicates a binding site to a neighboring atom.

11. The organometallic compound of claim 1, wherein $Z_1$ and $Z_2$ are each independently represented by one of Formulae 2-21 to 2-30:

2-21

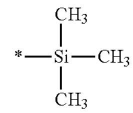

2-22

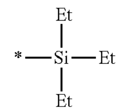

2-23

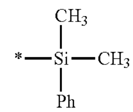

2-24

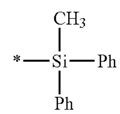

2-25

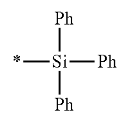

2-26

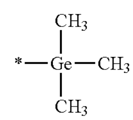

2-27

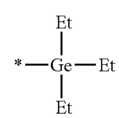

2-28

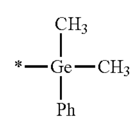

2-29

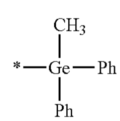

2-30

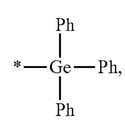

wherein, in Formulae 2-21 to 2-30,

Et refers to an ethyl group;

Ph refers to a phenyl group; and

* indicates a binding site to a neighboring atom.

12. The organometallic compound of claim 1, wherein d1 and d2 are each independently selected from 0, 1, and 2; and at least one selected from d1 and d2 is selected from 1 and 2.

13. The organometallic compound of claim 1, wherein $R_1$ to $R_4$ are each independently selected from hydrogen, deuterium, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group.

14. The organometallic compound of claim 1, wherein $R_1$ to $R_4$ are each independently selected from hydrogen, deuterium, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, and a tert-pentyl group;

a phenyl group and a carbazolyl group; and a phenyl group, a naphthyl group, and a carbazolyl group, each substituted with at least one selected from a $C_1$-$C_{20}$ alkyl group and a phenyl group.

15. The organometallic compound of claim 1, wherein the organometallic compound represented by Formula 1 is represented by one of Formulae 1-1 to 1-3:

1-1

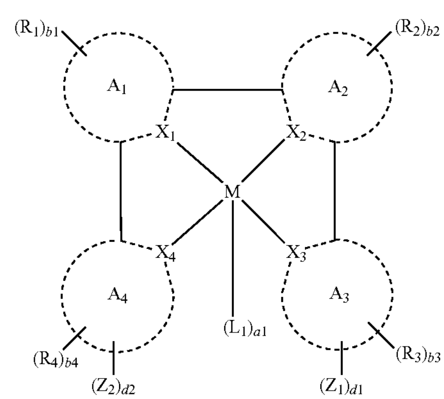

-continued 1-2

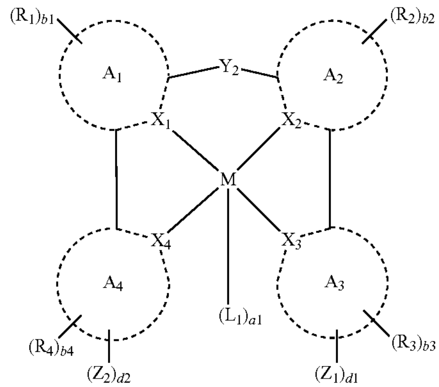

1-3

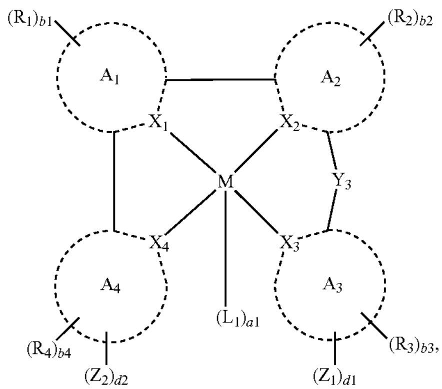

wherein, in Formulae 1-1 to 1-3,

M, $A_1$ to $A_4$, $X_1$ to $X_4$, $Y_1$ to $Y_3$, $Z_1$, $Z_2$, d1, d2, $R_1$ to $R_4$, b1 to b4, $L_1$, and a1 are the same as defined in connection with Formula 1.

16. The organometallic compound of claim 1, wherein the organometallic compound represented by Formula 1 is selected from Compounds 13 to 15:

13

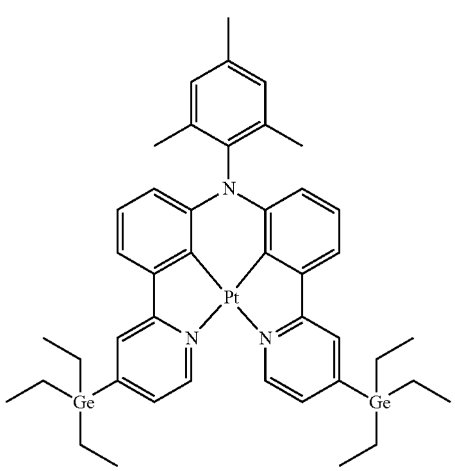

-continued

14

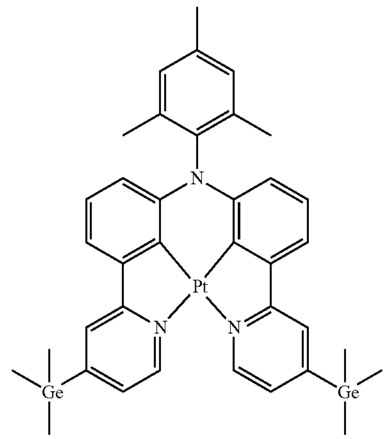

15

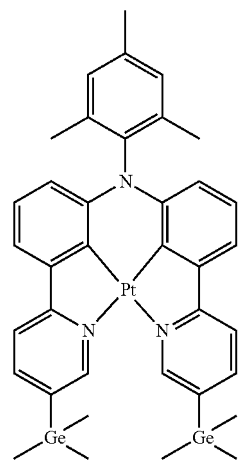

17. An organic light-emitting device comprising a first electrode;

a second electrode; and an organic layer disposed between the first electrode and the second electrode, wherein the organic layer comprises an emission layer and at least one organometallic compound of claim 1.

18. The organic light-emitting device of claim 17, wherein the emission layer comprises the organometallic compound.

* * * * *